(12) United States Patent
Moyal et al.

(10) Patent No.: US 7,893,724 B2
(45) Date of Patent: Feb. 22, 2011

(54) METHOD AND CIRCUIT FOR RAPID ALIGNMENT OF SIGNALS

(75) Inventors: Nathan Moyal, West Linn, OR (US); Jonathon Stiff, Beaverton, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 89 days.

(21) Appl. No.: 11/985,340

(22) Filed: Nov. 13, 2007

(65) Prior Publication Data

US 2008/0136470 A1 Jun. 12, 2008

Related U.S. Application Data

(63) Continuation of application No. 11/088,028, filed on Mar. 22, 2005, now Pat. No. 7,295,049.

(51) Int. Cl.
*G01R 25/00* (2006.01)

(52) U.S. Cl. .................. 327/12; 327/3; 327/7; 327/141; 327/152

(58) Field of Classification Search ............... 327/1–12, 327/141, 144, 152–154, 161–163, 298, 299
See application file for complete search history.

(56) References Cited

U.S. PATENT DOCUMENTS

| | | | |
|---|---|---|---|
| 3,600,690 A * | 8/1971 | White | 327/12 |
| 3,725,804 A | 4/1973 | Langan | |
| 3,740,588 A | 6/1973 | Stratton et al. | |
| 3,805,245 A | 4/1974 | Brooks et al. | |
| 3,810,036 A | 5/1974 | Bloedorn | |
| 3,831,113 A | 8/1974 | Ahmed | |
| 3,845,328 A | 10/1974 | Hollingsworth | |
| 3,940,760 A | 2/1976 | Brokaw | |
| 4,061,987 A | 12/1977 | Nagahama | |
| 4,134,073 A | 1/1979 | MacGregor | |
| 4,138,671 A | 2/1979 | Comer et al. | |
| 4,176,258 A | 11/1979 | Jackson | |
| 4,250,464 A | 2/1981 | Schade, Jr. | |

(Continued)

FOREIGN PATENT DOCUMENTS

DE 19710829 A1 9/1998

(Continued)

OTHER PUBLICATIONS

USPTO Notice of Allowance for U.S. Appl. No. 10/238,966 dated Jan. 27, 2009; 4 pages.

(Continued)

*Primary Examiner*—Lincoln Donovan
*Assistant Examiner*—Patrick O'Neill

(57) ABSTRACT

Circuits and methods for aligning two or more signals including a first and second signal. In one embodiment, a shift register generates two or more shifted copies of the second signal, and each of a plurality of phase detectors receives the first signal and one of the shifted copies of the second signal, each phase detector providing an output indicating whether the first signal is substantially aligned with the shifted copy of the second signal. A multiplexer may also be provided for receiving each of the shifted copies of the second signal, the multiplexer having a plurality of select lines coupled with the output signals of the phase detectors. Some embodiments may include a power saving mode.

10 Claims, 7 Drawing Sheets

U.S. PATENT DOCUMENTS

| | | |
|---|---|---|
| 4,272,760 A | 6/1981 | Prazak et al. |
| 4,283,713 A | 8/1981 | Phillipp |
| 4,326,135 A | 4/1982 | Jarrett et al. |
| 4,344,067 A | 8/1982 | Lee |
| 4,380,083 A * | 4/1983 | Andersson et al. .......... 375/376 |
| 4,438,404 A | 3/1984 | Phillipp |
| 4,475,151 A | 10/1984 | Phillipp |
| 4,497,575 A | 2/1985 | Phillipp |
| 4,604,363 A | 8/1986 | Newhouse et al. |
| 4,608,502 A | 8/1986 | Dijkmans et al. |
| 4,656,603 A | 4/1987 | Dunn |
| 4,670,838 A | 6/1987 | Kawata |
| 4,689,740 A | 8/1987 | Moelands et al. |
| 4,692,718 A | 9/1987 | Roza et al. |
| 4,701,907 A | 10/1987 | Collins |
| 4,727,541 A | 2/1988 | Mori et al. |
| 4,736,097 A | 4/1988 | Phillipp |
| 4,740,966 A | 4/1988 | Goad |
| 4,755,766 A | 7/1988 | Metz |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,807,183 A | 2/1989 | Kung et al. |
| 4,809,345 A | 2/1989 | Tabata et al. |
| 4,812,684 A | 3/1989 | Yamagiwa et al. |
| 4,813,013 A | 3/1989 | Dunn |
| 4,827,401 A | 5/1989 | Hrustich et al. |
| 4,831,546 A | 5/1989 | Mitsuta et al. |
| 4,833,418 A | 5/1989 | Quintus et al. |
| 4,868,525 A | 9/1989 | Dias |
| 4,876,466 A | 10/1989 | Kondou et al. |
| 4,876,534 A | 10/1989 | Mead et al. |
| 4,878,200 A | 10/1989 | Asghar et al. |
| 4,879,461 A | 11/1989 | Phillipp |
| 4,879,688 A | 11/1989 | Turner et al. |
| 4,885,484 A | 12/1989 | Gray |
| 4,907,121 A | 3/1990 | Hrassky |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Phillipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,088,822 A | 2/1992 | Warren |
| 5,095,284 A | 3/1992 | Mead |
| 5,097,305 A | 3/1992 | Mead et al. |
| 5,099,191 A | 3/1992 | Galler et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Phillipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada et al. |
| 5,144,582 A | 9/1992 | Steele |
| 5,146,106 A | 9/1992 | Anderson et al. |
| 5,150,079 A | 9/1992 | Williams et al. |
| 5,155,836 A | 10/1992 | Jordan et al. |
| 5,159,292 A | 10/1992 | Canfield et al. |
| 5,159,335 A | 10/1992 | Veneruso |
| 5,160,899 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,184,061 A | 2/1993 | Lee et al. |
| 5,198,817 A | 3/1993 | Walden et al. |
| 5,200,751 A | 4/1993 | Smith |
| 5,202,687 A | 4/1993 | Distinti |
| 5,204,549 A | 4/1993 | Platt et al. |
| 5,206,582 A | 4/1993 | Ekstedt et al. |
| 5,220,512 A | 6/1993 | Watkins et al. |
| 5,225,991 A | 7/1993 | Dougherty |
| 5,230,000 A | 7/1993 | Mozingo et al. |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,843 A | 9/1993 | Billings |
| 5,248,873 A | 9/1993 | Allen et al. |
| 5,258,760 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerphide |
| 5,305,312 A | 4/1994 | Fornek et al. |
| 5,307,381 A | 4/1994 | Ahuja |
| 5,313,618 A | 5/1994 | Pawloski |
| 5,317,202 A | 5/1994 | Waizman |
| 5,319,370 A | 6/1994 | Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,329,471 A | 7/1994 | Swoboda et al. |
| 5,331,215 A | 7/1994 | Allen et al. |
| 5,331,315 A | 7/1994 | Crosette |
| 5,331,571 A | 7/1994 | Aronoff et al. |
| 5,334,952 A | 8/1994 | Maddy et al. |
| 5,335,342 A | 8/1994 | Pope et al. |
| 5,336,936 A | 8/1994 | Allen et al. |
| 5,339,213 A | 8/1994 | O'Callaghan |
| 5,339,262 A | 8/1994 | Rostoker et al. |
| 5,341,044 A | 8/1994 | Ahanin et al. |
| 5,341,267 A | 8/1994 | Whitten |
| 5,345,195 A | 9/1994 | Cordoba et al. |
| 5,349,303 A | 9/1994 | Gerpheide |
| 5,355,097 A | 10/1994 | Scott et al. |
| 5,357,626 A | 10/1994 | Johnson et al. |
| 5,361,290 A | 11/1994 | Akiyama |
| 5,371,524 A | 12/1994 | Herczeg et al. |
| 5,371,860 A | 12/1994 | Mura et al. |
| 5,371,878 A | 12/1994 | Coker |
| 5,371,883 A | 12/1994 | Gross et al. |

| | | |
|---|---|---|
| 5,374,787 A | 12/1994 | Miller et al. |
| 5,377,333 A | 12/1994 | Nakagoshi et al. |
| 5,378,935 A | 1/1995 | Korhonen et al. |
| 5,381,515 A | 1/1995 | Platt et al. |
| 5,384,467 A | 1/1995 | Plimon et al. |
| 5,384,745 A | 1/1995 | Konishi et al. |
| 5,384,910 A | 1/1995 | Torres |
| 5,390,173 A | 2/1995 | Spinney et al. |
| 5,392,784 A | 2/1995 | Gudaitis |
| 5,394,522 A | 2/1995 | Sanchez-Frank et al. |
| 5,396,245 A | 3/1995 | Rempfer |
| 5,398,261 A | 3/1995 | Marbot |
| 5,399,922 A | 3/1995 | Kiani et al. |
| 5,408,194 A | 4/1995 | Steinbach et al. |
| 5,414,308 A | 5/1995 | Lee et al. |
| 5,414,380 A | 5/1995 | Floyd et al. |
| 5,416,895 A | 5/1995 | Anderson et al. |
| 5,422,823 A | 6/1995 | Agrawal et al. |
| 5,424,689 A | 6/1995 | Gillig et al. |
| 5,426,378 A | 6/1995 | Ong |
| 5,426,384 A | 6/1995 | May |
| 5,428,319 A | 6/1995 | Marvin et al. |
| 5,430,395 A | 7/1995 | Ichimaru |
| 5,430,687 A | 7/1995 | Hung et al. |
| 5,430,734 A | 7/1995 | Gilson |
| 5,432,476 A | 7/1995 | Tran |
| 5,438,672 A | 8/1995 | Dey |
| 5,440,305 A | 8/1995 | Signore et al. |
| 5,451,887 A | 9/1995 | El-Avat et al. |
| 5,453,904 A | 9/1995 | Higashiyama et al. |
| 5,455,525 A | 10/1995 | Ho et al. |
| 5,455,731 A | 10/1995 | Parkinson |
| 5,455,927 A | 10/1995 | Huang |
| 5,457,410 A | 10/1995 | Ting |
| 5,457,479 A | 10/1995 | Cheng |
| 5,463,591 A | 10/1995 | Aimoto et al. |
| 5,479,603 A | 12/1995 | Stone et al. |
| 5,479,643 A | 12/1995 | Bhaskar et al. |
| 5,479,652 A | 12/1995 | Dreyer et al. |
| 5,481,471 A | 1/1996 | Naglestad |
| 5,488,204 A | 1/1996 | Mead et al. |
| 5,491,458 A | 2/1996 | McCune |
| 5,493,246 A | 2/1996 | Anderson |
| 5,493,723 A | 2/1996 | Beck et al. |
| 5,495,077 A | 2/1996 | Miller et al. |
| 5,495,593 A | 2/1996 | Elmer et al. |
| 5,495,594 A | 2/1996 | MacKenna et al. |
| 5,497,119 A | 3/1996 | Tedrow et al. |
| 5,499,192 A | 3/1996 | Knapp et al. |
| 5,500,823 A | 3/1996 | Martin et al. |
| 5,517,198 A | 5/1996 | McEwan |
| 5,519,854 A | 5/1996 | Watt |
| 5,521,529 A | 5/1996 | Agrawal et al. |
| 5,530,444 A | 6/1996 | Tice et al. |
| 5,530,673 A | 6/1996 | Tobita et al. |
| 5,530,813 A | 6/1996 | Paulsen et al. |
| 5,537,057 A | 7/1996 | Leong et al. |
| 5,541,878 A | 7/1996 | LeMoncheck et al. |
| 5,542,055 A | 7/1996 | Amini et al. |
| 5,543,588 A | 8/1996 | Bisset et al. |
| 5,543,590 A | 8/1996 | Gillespie et al. |
| 5,543,591 A | 8/1996 | Gillespie et al. |
| 5,544,067 A | 8/1996 | Rostoker et al. |
| 5,544,311 A | 8/1996 | Harenberg et al. |
| 5,546,433 A | 8/1996 | Tran et al. |
| 5,546,562 A | 8/1996 | Patel |
| 5,552,725 A | 9/1996 | Ray et al. |
| 5,552,748 A | 9/1996 | O'Shaughnessy |
| 5,554,951 A | 9/1996 | Gough |
| 5,555,452 A | 9/1996 | Callaway et al. |
| 5,555,907 A | 9/1996 | Phillipp |
| 5,557,762 A | 9/1996 | Okuaki et al. |
| 5,559,502 A | 9/1996 | Schutte |
| 5,559,996 A | 9/1996 | Fujioka et al. |
| 5,563,526 A | 10/1996 | Hastings et al. |
| 5,563,529 A | 10/1996 | Seltzer et al. |
| 5,564,010 A | 10/1996 | Henry et al. |
| 5,564,108 A | 10/1996 | Hunsaker et al. |
| 5,565,658 A | 10/1996 | Gerpheide et al. |
| 5,566,702 A | 10/1996 | Phillipp |
| 5,572,665 A | 11/1996 | Nakabayashi et al. |
| 5,572,719 A | 11/1996 | Biesterfeldt |
| 5,574,678 A | 11/1996 | Gorecki |
| 5,574,852 A | 11/1996 | Bakker et al. |
| 5,574,892 A | 11/1996 | Christensen |
| 5,579,353 A | 11/1996 | Parmenter et al. |
| 5,587,945 A | 12/1996 | Lin et al. |
| 5,587,957 A | 12/1996 | Kowalczyk et al. |
| 5,590,354 A | 12/1996 | Klapproth et al. |
| 5,594,388 A | 1/1997 | O'Shaughnessy et al. |
| 5,594,734 A | 1/1997 | Worsley et al. |
| 5,594,876 A | 1/1997 | Getzlaff et al. |
| 5,594,890 A | 1/1997 | Yamaura et al. |
| 5,600,262 A | 2/1997 | Kolze |
| 5,604,466 A | 2/1997 | Dreps et al. |
| 5,608,892 A | 3/1997 | Wakerly |
| 5,614,861 A | 3/1997 | Harada |
| 5,625,316 A | 4/1997 | Chambers et al. |
| 5,629,857 A | 5/1997 | Brennan |
| 5,629,891 A | 5/1997 | LeMoncheck et al. |
| 5,630,052 A | 5/1997 | Shah |
| 5,630,057 A | 5/1997 | Hait |
| 5,630,102 A | 5/1997 | Johnson et al. |
| 5,631,577 A | 5/1997 | Freidin et al. |
| 5,633,766 A | 5/1997 | Hase et al. |
| 5,642,295 A | 6/1997 | Smayling |
| 5,646,544 A | 7/1997 | Iadanza |
| 5,646,901 A | 7/1997 | Sharpe-Geisler et al. |
| 5,648,642 A | 7/1997 | Miller et al. |
| 5,651,035 A | 7/1997 | Tozun |
| 5,663,900 A | 9/1997 | Bhandari et al. |
| 5,663,965 A | 9/1997 | Seymour |
| 5,664,199 A | 9/1997 | Kuwahara |
| 5,666,480 A | 9/1997 | Leung et al. |
| 5,670,915 A | 9/1997 | Cooper et al. |
| 5,673,198 A | 9/1997 | Lawman et al. |
| 5,675,825 A | 10/1997 | Dreyer et al. |
| 5,677,691 A | 10/1997 | Hosticka et al. |
| 5,680,070 A | 10/1997 | Anderson et al. |
| 5,682,032 A | 10/1997 | Phillipp |
| 5,684,434 A | 11/1997 | Mann et al. |
| 5,684,952 A | 11/1997 | Stein |
| 5,686,844 A | 11/1997 | Hull et al. |
| 5,687,325 A | 11/1997 | Chang |
| 5,689,195 A | 11/1997 | Cliff et al. |
| 5,689,196 A | 11/1997 | Schutte |
| 5,691,664 A | 11/1997 | Anderson et al. |
| 5,691,898 A | 11/1997 | Rosenberg et al. |
| 5,694,063 A | 12/1997 | Burlison et al. |
| 5,696,952 A | 12/1997 | Pontarelli |
| 5,699,024 A | 12/1997 | Manlove et al. |
| 5,703,871 A | 12/1997 | Pope et al. |
| 5,706,453 A | 1/1998 | Cheng et al. |
| 5,708,589 A | 1/1998 | Beauvais |
| 5,708,798 A | 1/1998 | Lynch et al. |
| 5,710,906 A | 1/1998 | Ghosh et al. |
| 5,712,969 A | 1/1998 | Zimmermann et al. |
| 5,721,931 A | 2/1998 | Gephardt et al. |
| 5,724,009 A | 3/1998 | Collins et al. |
| 5,727,170 A | 3/1998 | Mitchell et al. |
| 5,729,704 A | 3/1998 | Stone et al. |
| 5,730,165 A | 3/1998 | Phillipp |
| 5,732,277 A | 3/1998 | Kodosky et al. |
| 5,734,272 A | 3/1998 | Belot et al. |
| 5,734,334 A | 3/1998 | Hsieh et al. |
| 5,737,557 A | 4/1998 | Sullivan |

| | | | | | | |
|---|---|---|---|---|---|---|
| 5,737,760 A | 4/1998 | Grimmer et al. | | 5,896,330 A | 4/1999 | Gibson |
| 5,745,011 A | 4/1998 | Scott | | 5,898,345 A | 4/1999 | Namura et al. |
| 5,748,048 A | 5/1998 | Moyal | | 5,900,780 A | 5/1999 | Hirose et al. |
| 5,748,875 A | 5/1998 | Tzori | | 5,901,062 A | 5/1999 | Burch et al. |
| 5,752,013 A | 5/1998 | Christensen et al. | | 5,903,718 A | 5/1999 | Marik |
| 5,754,552 A | 5/1998 | Allmond et al. | | 5,905,398 A | 5/1999 | Todsen et al. |
| 5,754,826 A | 5/1998 | Gamal et al. | | 5,909,544 A | 6/1999 | Anderson, II et al. |
| 5,757,368 A | 5/1998 | Gerpheide et al. | | 5,911,059 A | 6/1999 | Profit, Jr. |
| 5,758,058 A | 5/1998 | Milburn | | 5,914,465 A | 6/1999 | Allen et al. |
| 5,761,128 A | 6/1998 | Watanabe | | 5,914,633 A | 6/1999 | Comino et al. |
| 5,763,909 A | 6/1998 | Mead et al. | | 5,914,708 A | 6/1999 | LaGrange et al. |
| 5,764,714 A | 6/1998 | Stansell et al. | | 5,917,356 A * | 6/1999 | Casal et al. ............. 327/236 |
| 5,767,457 A | 6/1998 | Gerpheide et al. | | 5,920,310 A | 7/1999 | Faggin et al. |
| 5,774,704 A | 6/1998 | Williams | | 5,923,264 A | 7/1999 | Lavelle et al. |
| 5,777,399 A | 7/1998 | Shibuya | | 5,926,566 A | 7/1999 | Wang et al. |
| 5,781,030 A | 7/1998 | Agrawal et al. | | 5,929,710 A | 7/1999 | Bien |
| 5,781,747 A | 7/1998 | Kametani | | 5,930,148 A | 7/1999 | Bjorksten et al. |
| 5,784,545 A | 7/1998 | Anderson et al. | | 5,930,150 A | 7/1999 | Cohen et al. |
| 5,790,957 A | 8/1998 | Heidari | | 5,931,959 A | 8/1999 | Kwiat |
| 5,796,183 A | 8/1998 | Hourmand | | 5,933,023 A | 8/1999 | Young |
| 5,799,176 A | 8/1998 | Kapusta et al. | | 5,933,356 A | 8/1999 | Rostoker et al. |
| 5,802,073 A | 9/1998 | Platt | | 5,933,816 A | 8/1999 | Zeanah et al. |
| 5,802,290 A | 9/1998 | Casselman | | 5,935,233 A | 8/1999 | Jeddeloh |
| 5,805,792 A | 9/1998 | Swoboda et al. | | 5,935,266 A | 8/1999 | Thurnhofer et al. |
| 5,805,897 A | 9/1998 | Glowny | | 5,939,904 A | 8/1999 | Fetterman et al. |
| 5,808,883 A | 9/1998 | Hawkes | | 5,939,949 A | 8/1999 | Olgaard et al. |
| 5,811,987 A | 9/1998 | Ashmore, Jr. et al. | | 5,941,991 A | 8/1999 | Kageshima |
| 5,812,698 A | 9/1998 | Platt et al. | | 5,942,733 A | 8/1999 | Allen et al. |
| 5,818,254 A | 10/1998 | Agrawal et al. | | 5,943,052 A | 8/1999 | Allen et al. |
| 5,818,444 A | 10/1998 | Alimpich et al. | | 5,945,878 A | 8/1999 | Westwick et al. |
| 5,819,028 A | 10/1998 | Manghirmalani et al. | | 5,949,632 A | 9/1999 | Barreras, Sr. et al. |
| 5,822,387 A | 10/1998 | Mar | | 5,952,888 A | 9/1999 | Scott |
| 5,822,531 A | 10/1998 | Gorczyca et al. | | 5,956,279 A | 9/1999 | Mo et al. |
| 5,828,693 A | 10/1998 | Mays et al. | | 5,959,871 A | 9/1999 | Pierzchala et al. |
| 5,838,583 A | 11/1998 | Varadarajan et al. | | 5,963,075 A | 10/1999 | Hiiragizawa |
| 5,841,078 A | 11/1998 | Miller et al. | | 5,963,105 A | 10/1999 | Nguyen |
| 5,841,996 A | 11/1998 | Nolan et al. | | 5,963,503 A | 10/1999 | Lee |
| 5,844,256 A | 12/1998 | Mead et al. | | 5,964,893 A | 10/1999 | Circello et al. |
| 5,844,404 A | 12/1998 | Caser et al. | | 5,966,027 A | 10/1999 | Kapusta et al. |
| 5,848,285 A | 12/1998 | Kapusta et al. | | 5,966,532 A | 10/1999 | McDonald et al. |
| 5,850,156 A | 12/1998 | Wittman | | 5,968,135 A | 10/1999 | Teramoto et al. |
| 5,852,733 A | 12/1998 | Chien et al. | | 5,969,513 A | 10/1999 | Clark |
| 5,854,625 A | 12/1998 | Frisch et al. | | 5,969,632 A | 10/1999 | Diamant et al. |
| 5,857,109 A | 1/1999 | Taylor | | 5,973,368 A | 10/1999 | Pearce et al. |
| 5,861,583 A | 1/1999 | Schediwy et al. | | 5,974,235 A | 10/1999 | Nunally et al. |
| 5,861,875 A | 1/1999 | Gerpheide | | 5,977,791 A | 11/1999 | Veenstra |
| 5,864,242 A | 1/1999 | Allen et al. | | 5,978,584 A | 11/1999 | Nishibata et al. |
| 5,864,392 A | 1/1999 | Winklhofer et al. | | 5,978,937 A | 11/1999 | Miyamori et al. |
| 5,867,046 A | 2/1999 | Sugasawa | | 5,982,105 A | 11/1999 | Masters |
| 5,867,399 A | 2/1999 | Rostoker et al. | | 5,982,229 A | 11/1999 | Wong et al. |
| 5,869,979 A | 2/1999 | Bocchino | | 5,982,241 A | 11/1999 | Nguyen et al. |
| 5,870,004 A | 2/1999 | Lu | | 5,983,277 A | 11/1999 | Heile et al. |
| 5,870,309 A | 2/1999 | Lawman | | 5,986,479 A | 11/1999 | Mohan |
| 5,870,345 A | 2/1999 | Stecker | | 5,987,246 A | 11/1999 | Thomsen et al. |
| 5,872,464 A | 2/1999 | Gradinariu | | 5,988,902 A | 11/1999 | Holehan |
| 5,874,958 A | 2/1999 | Ludolph | | 5,994,939 A | 11/1999 | Johnson et al. |
| 5,875,293 A | 2/1999 | Bell et al. | | 5,996,032 A | 11/1999 | Baker |
| 5,877,656 A | 3/1999 | Mann et al. | | 5,999,725 A | 12/1999 | Barbier et al. |
| 5,878,425 A | 3/1999 | Redpath | | 6,002,268 A | 12/1999 | Sasaki et al. |
| 5,880,411 A | 3/1999 | Gillespie et al. | | 6,002,398 A | 12/1999 | Wilson |
| 5,880,598 A | 3/1999 | Duong | | 6,003,054 A | 12/1999 | Oshima et al. |
| 5,883,623 A | 3/1999 | Cseri | | 6,003,107 A | 12/1999 | Ranson et al. |
| 5,886,582 A | 3/1999 | Stansell | | 6,003,133 A | 12/1999 | Moughanni et al. |
| 5,887,189 A | 3/1999 | Birns et al. | | 6,005,814 A | 12/1999 | Mulholland et al. |
| 5,889,236 A | 3/1999 | Gillespie et al. | | 6,005,904 A | 12/1999 | Knapp et al. |
| 5,889,723 A | 3/1999 | Pascucci | | 6,008,685 A | 12/1999 | Kunst |
| 5,889,936 A | 3/1999 | Chan | | 6,008,703 A | 12/1999 | Perrott et al. |
| 5,889,988 A | 3/1999 | Held | | 6,009,270 A | 12/1999 | Mann |
| 5,894,226 A | 4/1999 | Koyama | | 6,009,496 A | 12/1999 | Tsai |
| 5,894,243 A | 4/1999 | Hwang | | 6,011,407 A | 1/2000 | New |
| 5,894,565 A | 4/1999 | Furtek et al. | | 6,012,835 A | 1/2000 | Thompson et al. |
| 5,895,494 A | 4/1999 | Scalzi et al. | | 6,014,135 A | 1/2000 | Fernandes |
| 5,896,068 A | 4/1999 | Moyal | | 6,014,509 A | 1/2000 | Furtek et al. |

| | | | | | | |
|---|---|---|---|---|---|---|
| 6,014,723 A | 1/2000 | Tremblay et al. | | 6,167,559 A | 12/2000 | Furtek et al. |
| 6,016,554 A | 1/2000 | Skrovan et al. | | 6,169,383 B1 | 1/2001 | Sabin et al. |
| 6,016,563 A | 1/2000 | Fleisher | | 6,172,571 B1 | 1/2001 | Moyal et al. |
| 6,018,559 A | 1/2000 | Azegami et al. | | 6,173,419 B1 | 1/2001 | Barnett |
| 6,023,422 A | 2/2000 | Allen et al. | | 6,175,914 B1 | 1/2001 | Mann |
| 6,023,565 A | 2/2000 | Lawman et al. | | 6,175,949 B1 | 1/2001 | Gristede et al. |
| 6,026,134 A | 2/2000 | Duffy et al. | | 6,181,163 B1 | 1/2001 | Agrawal et al. |
| 6,026,501 A | 2/2000 | Hohl et al. | | 6,183,131 B1 | 2/2001 | Holloway et al. |
| 6,028,271 A | 2/2000 | Gillespie et al. | | 6,185,127 B1 | 2/2001 | Myers et al. |
| 6,028,959 A | 2/2000 | Wang et al. | | 6,185,450 B1 | 2/2001 | Seguine et al. |
| 6,031,365 A | 2/2000 | Sharpe-Geisler | | 6,185,522 B1 | 2/2001 | Bakker |
| 6,032,268 A | 2/2000 | Swoboda et al. | | 6,185,703 B1 | 2/2001 | Guddat et al. |
| 6,034,538 A | 3/2000 | Abramovici | | 6,185,732 B1 | 2/2001 | Mann et al. |
| 6,037,807 A | 3/2000 | Wu et al. | | 6,188,228 B1 | 2/2001 | Philipp |
| 6,038,551 A | 3/2000 | Barlow et al. | | 6,188,241 B1 | 2/2001 | Gauthier et al. |
| 6,041,406 A | 3/2000 | Mann | | 6,188,381 B1 | 2/2001 | van der Wal et al. |
| 6,043,695 A | 3/2000 | O'Sullivan | | 6,188,391 B1 | 2/2001 | Seely et al. |
| 6,043,719 A | 3/2000 | Lin et al. | | 6,188,975 B1 | 2/2001 | Gay |
| 6,049,223 A | 4/2000 | Lytle et al. | | 6,191,603 B1 | 2/2001 | Muradali et al. |
| 6,049,225 A | 4/2000 | Huang et al. | | 6,191,660 B1 | 2/2001 | Mar et al. |
| 6,051,772 A | 4/2000 | Cameron et al. | | 6,191,998 B1 | 2/2001 | Reddy et al. |
| 6,052,035 A | 4/2000 | Nolan et al. | | 6,192,431 B1 | 2/2001 | Dabral et al. |
| 6,052,524 A | 4/2000 | Pauna | | 6,198,303 B1 | 3/2001 | Rangasayee |
| 6,055,584 A | 4/2000 | Bridges et al. | | 6,201,407 B1 | 3/2001 | Kapusta et al. |
| 6,057,705 A | 5/2000 | Wojewoda et al. | | 6,201,829 B1 | 3/2001 | Schneider |
| 6,058,263 A | 5/2000 | Voth | | 6,202,044 B1 | 3/2001 | Tzori |
| 6,058,452 A | 5/2000 | Rangasayee et al. | | 6,204,687 B1 | 3/2001 | Schultz et al. |
| 6,061,511 A | 5/2000 | Marantz et al. | | 6,205,574 B1 | 3/2001 | Dellinger et al. |
| 6,066,961 A | 5/2000 | Lee et al. | | 6,208,572 B1 | 3/2001 | Adams et al. |
| 6,070,003 A | 5/2000 | Gove et al. | | 6,211,708 B1 | 4/2001 | Kemmer |
| 6,072,803 A | 6/2000 | Allmond et al. | | 6,211,715 B1 | 4/2001 | Terauchi |
| 6,075,941 A | 6/2000 | Itoh et al. | | 6,211,741 B1 | 4/2001 | Dalmia |
| 6,079,985 A | 6/2000 | Wohl et al. | | 6,215,352 B1 | 4/2001 | Sudo |
| 6,081,140 A | 6/2000 | King | | 6,219,729 B1 | 4/2001 | Keats et al. |
| 6,094,730 A | 7/2000 | Lopez et al. | | 6,222,528 B1 | 4/2001 | Gerpheide et al. |
| 6,097,211 A | 8/2000 | Couts-Martin et al. | | 6,223,144 B1 | 4/2001 | Barnett et al. |
| 6,097,432 A | 8/2000 | Mead et al. | | 6,223,147 B1 | 4/2001 | Bowers |
| 6,101,457 A | 8/2000 | Barch et al. | | 6,223,272 B1 | 4/2001 | Coehlo et al. |
| 6,101,617 A | 8/2000 | Burckhartt et al. | | RE37,195 E | 5/2001 | Kean |
| 6,104,217 A | 8/2000 | Magana | | 6,225,866 B1 | 5/2001 | Kubota et al. |
| 6,104,325 A | 8/2000 | Liaw et al. | | 6,236,242 B1 | 5/2001 | Hedberg |
| 6,107,769 A | 8/2000 | Saylor et al. | | 6,236,275 B1 | 5/2001 | Dent |
| 6,107,826 A | 8/2000 | Young et al. | | 6,236,278 B1 | 5/2001 | Olgaard |
| 6,107,882 A | 8/2000 | Gabara et al. | | 6,236,593 B1 | 5/2001 | Hong et al. |
| 6,110,223 A | 8/2000 | Southgate et al. | | 6,239,389 B1 | 5/2001 | Allen et al. |
| 6,111,431 A | 8/2000 | Estrada | | 6,239,798 B1 | 5/2001 | Ludolph et al. |
| 6,112,264 A | 8/2000 | Beasley et al. | | 6,240,375 B1 | 5/2001 | Sonoda |
| 6,121,791 A | 9/2000 | Abbott | | 6,246,258 B1 | 6/2001 | Lesea |
| 6,121,805 A | 9/2000 | Thamsirianunt et al. | | 6,246,410 B1 | 6/2001 | Bergeron et al. |
| 6,121,965 A | 9/2000 | Kenney et al. | | 6,249,167 B1 | 6/2001 | Oguchi et al. |
| 6,125,416 A | 9/2000 | Warren | | 6,249,447 B1 | 6/2001 | Boylan et al. |
| 6,130,548 A | 10/2000 | Koifman | | 6,253,250 B1 | 6/2001 | Evans et al. |
| 6,130,551 A | 10/2000 | Agrawal et al. | | 6,253,754 B1 | 7/2001 | Roohparvar |
| 6,130,552 A | 10/2000 | Jefferson et al. | | 6,262,717 B1 | 7/2001 | Donohue et al. |
| 6,133,773 A | 10/2000 | Garlepp et al. | | 6,263,302 B1 | 7/2001 | Hellestrand et al. |
| 6,134,181 A | 10/2000 | Landry | | 6,263,339 B1 | 7/2001 | Hirsch |
| 6,134,516 A | 10/2000 | Wang et al. | | 6,263,484 B1 | 7/2001 | Yang |
| 6,137,308 A | 10/2000 | Nayak | | 7,171,455 B1 | 7/2001 | Gupta et al. |
| 6,140,853 A | 10/2000 | Lo | | 6,271,679 B1 | 8/2001 | McClintock et al. |
| 6,141,376 A | 10/2000 | Shaw | | 6,272,646 B1 | 8/2001 | Rangasayee |
| 6,141,764 A | 10/2000 | Ezell | | 6,275,117 B1 | 8/2001 | Abugharbieh et al. |
| 6,144,327 A | 11/2000 | Distinti et al. | | 6,278,568 B1 | 8/2001 | Cloke et al. |
| 6,148,104 A | 11/2000 | Wang et al. | | 6,280,391 B1 | 8/2001 | Olson et al. |
| 6,148,441 A | 11/2000 | Woodward | | 6,281,753 B1 | 8/2001 | Corsi et al. |
| 6,149,299 A | 11/2000 | Aslan et al. | | 6,282,547 B1 | 8/2001 | Hirsch |
| 6,150,866 A | 11/2000 | Eto et al. | | 6,282,551 B1 | 8/2001 | Anderson et al. |
| 6,154,064 A | 11/2000 | Proebsting | | 6,286,127 B1 | 9/2001 | King et al. |
| 6,157,024 A | 12/2000 | Chapdelaine et al. | | 6,288,707 B1 | 9/2001 | Philipp |
| 6,157,270 A | 12/2000 | Tso | | 6,289,300 B1 | 9/2001 | Brannick et al. |
| 6,161,199 A | 12/2000 | Szeto et al. | | 6,289,478 B1 | 9/2001 | Kitagaki |
| 6,166,367 A | 12/2000 | Cho | | 6,289,489 B1 | 9/2001 | Bold et al. |
| 6,166,960 A | 12/2000 | Marneweck et al. | | 6,292,028 B1 | 9/2001 | Tomita |
| 6,167,077 A | 12/2000 | Ducaroir | | 6,294,932 B1 | 9/2001 | Watarai |

| | | | |
|---|---|---|---|
| 6,294,962 B1 | 9/2001 | Mar | |
| 6,298,320 B1 | 10/2001 | Buckmaster et al. | |
| 6,304,014 B1 | 10/2001 | England et al. | |
| 6,304,101 B1 | 10/2001 | Nishihara | |
| 6,304,790 B1 | 10/2001 | Nakamura et al. | |
| 6,307,413 B1 | 10/2001 | Dalmia et al. | |
| 6,310,521 B1 | 10/2001 | Dalmia | |
| 6,310,611 B1 | 10/2001 | Caldwell | |
| 6,311,149 B1 | 10/2001 | Ryan et al. | |
| 7,406,674 B1 | 10/2001 | Ogami et al. | |
| 6,314,530 B1 | 11/2001 | Mann | |
| 6,320,184 B1 | 11/2001 | Winklhofer et al. | |
| 6,320,282 B1 | 11/2001 | Caldwell | |
| 6,321,369 B1 | 11/2001 | Heile et al. | |
| 6,323,846 B1 | 11/2001 | Westerman et al. | |
| 6,324,628 B1 | 11/2001 | Chan | |
| 6,326,859 B1 | 12/2001 | Goldman et al. | |
| 6,332,137 B1 | 12/2001 | Hori et al. | |
| 6,332,201 B1 | 12/2001 | Chin et al. | |
| 6,337,579 B1 | 1/2002 | Mochida | |
| 6,338,109 B1 | 1/2002 | Snyder et al. | |
| 6,339,815 B1 | 1/2002 | Feng et al. | |
| 6,342,907 B1 | 1/2002 | Petty et al. | |
| 6,345,383 B1 | 2/2002 | Ueki | |
| 6,347,395 B1 | 2/2002 | Payne et al. | |
| 6,351,789 B1 | 2/2002 | Green | |
| 6,353,452 B1 | 3/2002 | Hamada et al. | |
| 6,355,980 B1 | 3/2002 | Callahan | |
| 6,356,862 B2 | 3/2002 | Bailey | |
| 6,356,958 B1 | 3/2002 | Lin | |
| 6,356,960 B1 | 3/2002 | Jones et al. | |
| 6,359,950 B2 | 3/2002 | Gossmann et al. | |
| 6,362,697 B1 | 3/2002 | Pulvirenti | |
| 6,366,174 B1 | 4/2002 | Berry et al. | |
| 6,366,300 B1 | 4/2002 | Ohara et al. | |
| 6,366,874 B1 | 4/2002 | Lee et al. | |
| 6,366,878 B1 | 4/2002 | Grunert | |
| 6,369,660 B1 | 4/2002 | Wei | |
| 6,373,954 B1 | 4/2002 | Malcolm et al. | |
| 6,374,370 B1 | 4/2002 | Bockhaus et al. | |
| 6,377,009 B1 | 4/2002 | Philipp | |
| 6,377,575 B1 | 4/2002 | Mullaney et al. | |
| 6,377,646 B1 | 4/2002 | Sha | |
| 6,380,811 B1 | 4/2002 | Zarubinsky et al. | |
| 6,380,929 B1 | 4/2002 | Platt | |
| 6,380,931 B1 | 4/2002 | Gillespie et al. | |
| 6,384,947 B1 | 5/2002 | Ackerman et al. | |
| 6,385,742 B1 | 5/2002 | Kirsh et al. | |
| 6,388,109 B1 | 5/2002 | Schwarz et al. | |
| 6,388,464 B1 | 5/2002 | Lacey et al. | |
| 6,396,302 B2 | 5/2002 | New et al. | |
| 6,396,657 B1 | 5/2002 | Sun et al. | |
| 6,397,232 B1 | 5/2002 | Cheng-Hung et al. | |
| 6,404,204 B1 | 6/2002 | Farruggia et al. | |
| 6,404,445 B1 | 6/2002 | Galea et al. | |
| 6,407,953 B1 | 6/2002 | Cleeves | |
| 6,408,432 B1 | 6/2002 | Herrmann et al. | |
| 6,411,665 B1 | 6/2002 | Chan et al. | |
| 6,411,974 B1 | 6/2002 | Graham et al. | |
| 6,414,671 B1 | 7/2002 | Gillespie et al. | |
| 6,421,698 B1 | 7/2002 | Hong | |
| 6,425,109 B1 | 7/2002 | Choukalos et al. | |
| 6,429,882 B1 | 8/2002 | Abdelnur et al. | |
| 6,430,305 B1 | 8/2002 | Decker | |
| 6,433,645 B1 | 8/2002 | Mann et al. | |
| 6,434,187 B1 | 8/2002 | Beard | |
| 6,437,805 B1 | 8/2002 | Sojoodi et al. | |
| 6,438,565 B1 | 8/2002 | Ammirato et al. | |
| 6,438,735 B1 | 8/2002 | McElvain et al. | |
| 6,438,738 B1 | 8/2002 | Elayda | |
| 6,441,073 B1 | 8/2002 | Tanaka et al. | |
| 6,445,211 B1 | 9/2002 | Saripella | |
| 6,449,628 B1 | 9/2002 | Wasson | |
| 6,449,755 B1 | 9/2002 | Beausang et al. |
| 6,449,761 B1 | 9/2002 | Greidinger et al. |
| 6,452,437 B1 | 9/2002 | Takeuchi et al. |
| 6,452,514 B1 | 9/2002 | Philipp |
| 6,453,175 B2 | 9/2002 | Mizell et al. |
| 6,453,461 B1 | 9/2002 | Chaiken |
| 6,456,304 B1 | 9/2002 | Angiulo et al. |
| 6,457,355 B1 | 10/2002 | Philipp |
| 6,457,479 B1 | 10/2002 | Zhuang et al. |
| 6,460,172 B1 | 10/2002 | Insenser Farre et al. |
| 6,463,488 B1 | 10/2002 | San Juan |
| 6,466,036 B1 | 10/2002 | Philipp |
| 6,466,078 B1 | 10/2002 | Stiff |
| 6,466,898 B1 | 10/2002 | Chan |
| 6,473,069 B1 | 10/2002 | Gerpheide |
| 6,473,825 B1 | 10/2002 | Worley et al. |
| 6,477,691 B1 | 11/2002 | Bergamashi/Rab et al. |
| 6,480,921 B1 | 11/2002 | Mansoorian et al. |
| 6,483,343 B1 | 11/2002 | Faith et al. |
| 6,487,700 B1 | 11/2002 | Fukushima |
| 6,489,899 B1 | 12/2002 | Ely et al. |
| 6,490,213 B1 | 12/2002 | Mu et al. |
| 6,492,834 B1 | 12/2002 | Lytle et al. |
| 6,496,971 B1 | 12/2002 | Lesea et al. |
| 6,498,720 B2 | 12/2002 | Glad |
| 6,499,134 B1 | 12/2002 | Buffet et al. |
| 6,499,359 B1 | 12/2002 | Washeleski et al. |
| 6,504,403 B2 | 1/2003 | Bangs et al. |
| 6,507,214 B1 | 1/2003 | Snyder |
| 6,507,215 B1 | 1/2003 | Piasecki et al. |
| 6,507,857 B1 | 1/2003 | Yalcinalp |
| 6,509,758 B2 | 1/2003 | Piasecki et al. |
| 6,512,395 B1 | 1/2003 | Lacey et al. |
| 6,677,932 B1 | 1/2003 | Westerman |
| 6,516,428 B2 | 2/2003 | Wenzel et al. |
| 6,522,128 B1 | 2/2003 | Ely et al. |
| 6,523,416 B2 | 2/2003 | Takagi et al. |
| 6,525,593 B1 | 2/2003 | Mar |
| 6,526,556 B1 | 2/2003 | Stoica et al. |
| 6,529,791 B1 | 3/2003 | Takagi |
| 6,530,065 B1 | 3/2003 | McDonald et al. |
| 6,534,970 B1 | 3/2003 | Ely et al. |
| 6,535,061 B2 | 3/2003 | Darmawaskita et al. |
| 6,535,200 B2 | 3/2003 | Philipp |
| 6,535,946 B1 | 3/2003 | Bryant et al. |
| 6,536,028 B1 | 3/2003 | Katsioulas et al. |
| 6,539,534 B1 | 3/2003 | Bennett |
| 6,542,025 B1 | 4/2003 | Kutz et al. |
| 6,542,844 B1 | 4/2003 | Hanna |
| 6,542,845 B1 | 4/2003 | Grucci et al. |
| 6,552,933 B2 | 4/2003 | Roohparvar |
| 6,553,057 B1 | 4/2003 | Sha |
| 6,554,469 B1 | 4/2003 | Thomson et al. |
| 6,557,164 B1 | 4/2003 | Faustini |
| 6,559,685 B2 | 5/2003 | Green |
| 6,560,306 B1 | 5/2003 | Duffy |
| 6,560,699 B1 | 5/2003 | Konkle |
| 6,563,391 B1 | 5/2003 | Mar |
| 6,564,179 B1 | 5/2003 | Belhaj |
| 6,566,961 B2 | 5/2003 | Dasgupta et al. |
| 6,567,426 B1 | 5/2003 | van Hook et al. |
| 6,567,932 B2 | 5/2003 | Edwards et al. |
| 6,570,557 B1 | 5/2003 | Westerman et al. |
| 6,571,331 B2 | 5/2003 | Henry et al. |
| 6,571,373 B1 | 5/2003 | Devins et al. |
| 6,574,590 B1 | 6/2003 | Kershaw et al. |
| 6,574,739 B1 | 6/2003 | Kung et al. |
| 6,575,373 B1 | 6/2003 | Nakano |
| 6,577,258 B2 | 6/2003 | Ruha et al. |
| 6,578,174 B2 | 6/2003 | Zizzo |
| 6,580,329 B2 | 6/2003 | Sander |
| 6,581,191 B1 | 6/2003 | Schubert et al. |
| 6,587,093 B1 | 7/2003 | Shaw et al. |

| Patent | Kind | Date | Inventor |
|---|---|---|---|
| 6,587,995 | B1 | 7/2003 | Duboc et al. |
| 6,588,004 | B1 | 7/2003 | Southgate et al. |
| 6,590,422 | B1 | 7/2003 | Dillon |
| 6,590,517 | B1 | 7/2003 | Swanson |
| 6,591,369 | B1 | 7/2003 | Edwards et al. |
| 6,592,626 | B1 | 7/2003 | Bauchot et al. |
| 6,594,799 | B1 | 7/2003 | Robertson et al. |
| 6,597,212 | B1 | 7/2003 | Wang et al. |
| 6,597,824 | B2 | 7/2003 | Newberg et al. |
| 6,598,178 | B1 | 7/2003 | Yee et al. |
| 6,600,346 | B1 | 7/2003 | Macaluso |
| 6,600,351 | B2 | 7/2003 | Bisanti et al. |
| 6,600,575 | B1 | 7/2003 | Kohara |
| 6,601,189 | B1 | 7/2003 | Edwards et al. |
| 6,601,236 | B1 | 7/2003 | Curtis |
| 6,603,330 | B1 | 8/2003 | Snyder |
| 6,603,348 | B1 | 8/2003 | Preuss et al. |
| 6,604,179 | B2 | 8/2003 | Volk et al. |
| 6,606,731 | B1 | 8/2003 | Baum et al. |
| 6,608,472 | B1 | 8/2003 | Kutz et al. |
| 6,611,220 | B1 | 8/2003 | Snyder |
| 6,611,276 | B1 | 8/2003 | Muratori et al. |
| 6,611,856 | B1 | 8/2003 | Liao et al. |
| 6,611,952 | B1 | 8/2003 | Prakash et al. |
| 6,610,936 | B2 | 9/2003 | Gillespie et al. |
| 6,613,098 | B1 | 9/2003 | Sorge et al. |
| 6,614,260 | B1 | 9/2003 | Welch et al. |
| 6,614,320 | B1 | 9/2003 | Sullam et al. |
| 6,614,374 | B1 | 9/2003 | Gustavsson et al. |
| 6,614,458 | B1 | 9/2003 | Lambert et al. |
| 6,615,167 | B1 | 9/2003 | Devins et al. |
| 6,617,888 | B2 | 9/2003 | Volk |
| 6,618,854 | B1 | 9/2003 | Mann |
| 6,621,356 | B2 | 9/2003 | Gotz et al. |
| 6,624,640 | B2 | 9/2003 | Lund et al. |
| 6,625,765 | B1 | 9/2003 | Krishnan |
| 6,628,163 | B2 | 9/2003 | Dathe et al. |
| 6,628,311 | B1 | 9/2003 | Fang |
| 6,631,508 | B1 | 10/2003 | Williams |
| 6,634,008 | B1 | 10/2003 | Dole |
| 6,636,096 | B2 | 10/2003 | Schaffer et al. |
| 6,637,015 | B1 | 10/2003 | Ogami et al. |
| 6,639,586 | B2 | 10/2003 | Gerpheide |
| 6,642,857 | B1 | 11/2003 | Schediwy et al. |
| 6,643,151 | B1 | 11/2003 | Nebrigic et al. |
| 6,643,810 | B2 | 11/2003 | Whetsel |
| 6,649,924 | B1 | 11/2003 | Philipp et al. |
| 6,650,581 | B2 | 11/2003 | Hong et al. |
| 6,658,498 | B1 | 12/2003 | Carney et al. |
| 6,658,633 | B2 | 12/2003 | Devins et al. |
| 6,661,288 | B2 | 12/2003 | Morgan et al. |
| 6,661,410 | B2 | 12/2003 | Casebolt et al. |
| 6,661,724 | B1 | 12/2003 | Snyder et al. |
| 6,664,978 | B1 | 12/2003 | Kekic et al. |
| 6,664,991 | B1 | 12/2003 | Chew et al. |
| 6,667,642 | B1 | 12/2003 | Moyal |
| 6,667,740 | B2 | 12/2003 | Ely et al. |
| 6,670,852 | B1 | 12/2003 | Hauck |
| 6,673,308 | B2 | 1/2004 | Hino et al. |
| 6,677,814 | B2 | 1/2004 | Low et al. |
| 6,678,645 | B1 | 1/2004 | Rajsuman et al. |
| 6,678,877 | B1 | 1/2004 | Perry et al. |
| 6,680,632 | B1 | 1/2004 | Meyers et al. |
| 6,680,731 | B2 | 1/2004 | Gerpheide et al. |
| 6,681,280 | B1 | 1/2004 | Miyake et al. |
| 6,681,359 | B1 | 1/2004 | Au et al. |
| 6,683,462 | B2 | 1/2004 | Shimizu |
| 6,683,930 | B1 | 1/2004 | Dalmia |
| 6,686,787 | B2 | 2/2004 | Ling |
| 6,686,860 | B2 | 2/2004 | Gulati et al. |
| 6,690,224 | B1 | 2/2004 | Moore |
| 6,691,193 | B1 | 2/2004 | Wang et al. |
| 6,691,301 | B2 | 2/2004 | Bowen |
| 6,697,754 | B1 | 2/2004 | Alexander |
| 6,856,433 | B2 | 2/2004 | Hatano et al. |
| 6,701,340 | B1 | 3/2004 | Gorecki |
| 6,701,487 | B1 | 3/2004 | Ogami et al. |
| 6,701,508 | B1 | 3/2004 | Bartz et al. |
| 6,704,381 | B1 | 3/2004 | Moyal et al. |
| 6,704,879 | B1 | 3/2004 | Parrish |
| 6,704,889 | B2 | 3/2004 | Veenstra et al. |
| 6,704,893 | B1 | 3/2004 | Bauwens et al. |
| 6,705,511 | B1 | 3/2004 | Dames et al. |
| 6,711,226 | B1 | 3/2004 | Williams et al. |
| 6,711,731 | B2 | 3/2004 | Weiss |
| 6,713,897 | B2 | 3/2004 | Caldwell |
| 6,714,066 | B2 | 3/2004 | Gorecki et al. |
| 6,714,817 | B2 | 3/2004 | Daynes et al. |
| 6,715,132 | B1 | 3/2004 | Bartz et al. |
| 6,371,878 | B1 | 4/2004 | Bowen |
| 6,717,474 | B2 | 4/2004 | Chen et al. |
| 6,718,294 | B1 | 4/2004 | Bortfeld |
| 6,718,520 | B1 | 4/2004 | Merryman et al. |
| 6,718,533 | B1 | 4/2004 | Schneider et al. |
| 6,724,220 | B1 | 4/2004 | Snyder et al. |
| 6,728,900 | B1 | 4/2004 | Meli |
| 6,728,902 | B2 | 4/2004 | Kaiser et al. |
| 6,730,863 | B1 | 5/2004 | Gerpheide |
| 6,731,552 | B2 | 5/2004 | Perner |
| 6,732,068 | B2 | 5/2004 | Sample et al. |
| 6,732,347 | B1 | 5/2004 | Camilleri et al. |
| 6,738,858 | B1 | 5/2004 | Fernald et al. |
| 6,744,323 | B1 | 6/2004 | Moyal et al. |
| 6,748,569 | B1 | 6/2004 | Brooke et al. |
| 6,750,852 | B2 | 6/2004 | Gillespie |
| 6,750,889 | B1 | 6/2004 | Livingston et al. |
| 6,754,101 | B2 | 6/2004 | Terzioglu et al. |
| 6,754,723 | B2 | 6/2004 | Kato |
| 6,754,765 | B1 | 6/2004 | Chang et al. |
| 6,754,849 | B1 | 6/2004 | Tamura |
| 6,757,882 | B2 | 6/2004 | Chen et al. |
| 6,765,407 | B1 | 7/2004 | Snyder |
| 6,768,337 | B2 | 7/2004 | Kohno et al. |
| 6,768,352 | B1 | 7/2004 | Maher et al. |
| 6,769,622 | B1 | 8/2004 | Tournemille et al. |
| 6,771,552 | B2 | 8/2004 | Fujisawa |
| 6,774,644 | B2 | 8/2004 | Eberlein |
| 6,781,456 | B2 | 8/2004 | Pradhan |
| 6,782,068 | B1 | 8/2004 | Wilson et al. |
| 6,784,821 | B1 | 8/2004 | Lee |
| 6,785,881 | B1 | 8/2004 | Bartz et al. |
| 6,788,116 | B1 | 9/2004 | Cook et al. |
| 6,788,221 | B1 | 9/2004 | Ely et al. |
| 6,788,521 | B1 | 9/2004 | Nishi |
| 6,791,377 | B2 | 9/2004 | Ilchmann et al. |
| 6,792,584 | B1 | 9/2004 | Eneboe et al. |
| 6,798,218 | B2 | 9/2004 | Kasperkovitz |
| 6,798,299 | B1 | 9/2004 | Mar et al. |
| 6,799,198 | B1 | 9/2004 | Huboi et al. |
| 6,806,771 | B1 | 10/2004 | Hildebrant et al. |
| 6,806,782 | B2 | 10/2004 | Motoyoshi et al. |
| 6,809,275 | B1 | 10/2004 | Cheng et al. |
| 6,809,566 | B1 | 10/2004 | Xin-LeBlanc |
| 6,810,442 | B1 | 10/2004 | Lin et al. |
| 6,815,979 | B2 | 11/2004 | Ooshita |
| 6,816,544 | B1 | 11/2004 | Bailey et al. |
| 6,817,005 | B2 | 11/2004 | Mason et al. |
| 6,819,142 | B2 | 11/2004 | Viehmann et al. |
| 6,823,282 | B1 | 11/2004 | Snyder |
| 6,823,497 | B2 | 11/2004 | Schubert et al. |
| 6,825,689 | B1 | 11/2004 | Snyder |
| 6,825,869 | B2 | 11/2004 | Bang |
| 6,828,824 | B2 | 12/2004 | Betz et al. |
| 6,829,727 | B1 | 12/2004 | Pawloski |
| 6,834,384 | B2 | 12/2004 | Fiorella, II et al. |
| 6,836,169 | B2 | 12/2004 | Richmond et al. |

| | | | | | | |
|---|---|---|---|---|---|---|
| 6,839,774 B1 | 1/2005 | Ahn et al. | | 7,017,409 B2 | 3/2006 | Zielinski et al. |
| 6,842,710 B1 | 1/2005 | Gehring et al. | | 7,020,854 B2 | 3/2006 | Killian et al. |
| 6,847,203 B1 | 1/2005 | Conti et al. | | 7,023,215 B2 | 4/2006 | Steenwyk |
| 6,850,117 B2 | 2/2005 | Weber et al. | | 7,023,257 B1 | 4/2006 | Sullam |
| 6,850,554 B1 | 2/2005 | Sha | | 7,024,636 B2 | 4/2006 | Weed |
| 6,853,598 B2 | 2/2005 | Chevallier | | 7,024,654 B2 | 4/2006 | Bersch et al. |
| 6,854,067 B1 | 2/2005 | Kutz et al. | | 7,026,861 B2 | 4/2006 | Steenwyk |
| 6,859,884 B1 | 2/2005 | Sullam | | 7,030,513 B2 | 4/2006 | Caldwell |
| 6,862,240 B2 | 3/2005 | Burgan | | 7,030,656 B2 | 4/2006 | Lo et al. |
| 6,864,710 B1 | 3/2005 | Lacey et al. | | 7,030,688 B2 | 4/2006 | Dosho et al. |
| 6,865,429 B1 | 3/2005 | Schneider et al. | | 7,030,782 B2 | 4/2006 | Ely et al. |
| 6,865,504 B2 | 3/2005 | Larson et al. | | 7,034,603 B2 | 4/2006 | Brady et al. |
| 6,868,500 B1 | 3/2005 | Kutz et al. | | 7,042,301 B2 | 5/2006 | Sutardja |
| 6,871,253 B2 | 3/2005 | Greeff et al. | | 7,047,166 B2 | 5/2006 | Dancea |
| 6,871,331 B1 | 3/2005 | Bloom et al. | | 7,055,035 B2 | 5/2006 | Allison et al. |
| 6,873,203 B1 | 3/2005 | Latham, II et al. | | 7,058,921 B1 | 6/2006 | Hwang et al. |
| 6,873,210 B2 | 3/2005 | Mulder et al. | | 7,073,158 B2 | 7/2006 | McCubbrey |
| 6,876,941 B2 | 4/2005 | Nightingale | | 7,076,420 B1 | 7/2006 | Snyder et al. |
| 6,880,086 B2 | 4/2005 | Kidder et al. | | 7,079,166 B1 | 7/2006 | Hong |
| 6,888,453 B2 | 5/2005 | Lutz et al. | | 7,086,014 B1 | 8/2006 | Bartz et al. |
| 6,888,538 B2 | 5/2005 | Ely et al. | | 7,088,166 B1 | 8/2006 | Reinschmidt et al. |
| 6,892,310 B1 | 5/2005 | Kutz et al. | | 7,089,175 B1 | 8/2006 | Nemecek et al. |
| 6,892,322 B1 | 5/2005 | Snyder | | 7,091,713 B2 | 8/2006 | Erdelyi et al. |
| 6,893,724 B2 | 5/2005 | Lin et al. | | 7,092,980 B1 | 8/2006 | Mar et al. |
| 6,894,928 B2 | 5/2005 | Owen | | 7,098,414 B2 | 8/2006 | Caldwell |
| 6,897,390 B2 | 5/2005 | Caldwell et al. | | 7,099,818 B1 | 8/2006 | Nemecek |
| 6,898,703 B1 | 5/2005 | Ogami et al. | | 7,103,108 B1 | 9/2006 | Beard |
| 6,900,663 B1 | 5/2005 | Roper et al. | | 7,109,978 B2 | 9/2006 | Gillespie et al. |
| 6,901,563 B1 | 5/2005 | Ogami et al. | | 7,117,485 B2 | 10/2006 | Wilkinson et al. |
| 6,903,402 B2 | 6/2005 | Miyazawa | | 7,119,550 B2 | 10/2006 | Kitano et al. |
| 6,903,613 B1 | 6/2005 | Mitchell et al. | | 7,119,602 B2 | 10/2006 | Davis |
| 6,904,570 B2 | 6/2005 | Foote et al. | | 7,124,376 B2 | 10/2006 | Zaidi et al. |
| 6,910,126 B1 | 6/2005 | Mar et al. | | 7,127,630 B1 | 10/2006 | Snyder |
| 6,911,857 B1 | 6/2005 | Stiff | | 7,129,793 B2 | 10/2006 | Gramegna |
| 6,917,661 B1 | 7/2005 | Scott et al. | | 7,129,873 B2 | 10/2006 | Kawamura |
| 6,922,821 B1 | 7/2005 | Nemecek | | 7,132,835 B1 | 11/2006 | Arcus |
| 6,924,668 B2 | 8/2005 | Muller et al. | | 7,133,140 B2 | 11/2006 | Lukacs et al. |
| 6,934,674 B1 | 8/2005 | Douezy et al. | | 7,133,793 B2 | 11/2006 | Ely et al. |
| 6,937,075 B2 | 8/2005 | Lim et al. | | 7,138,841 B1 | 11/2006 | Li |
| 6,940,356 B2 | 9/2005 | McDonald et al. | | 7,138,868 B2 | 11/2006 | Sanchez et al. |
| 6,941,336 B1 | 9/2005 | Mar | | 7,139,530 B2 | 11/2006 | Kusbel |
| 6,941,538 B2 | 9/2005 | Hwang et al. | | 7,141,968 B2 | 11/2006 | Hibbs et al. |
| 6,944,018 B2 | 9/2005 | Caldwell | | 7,141,987 B2 | 11/2006 | Hibbs et al. |
| 6,949,811 B2 | 9/2005 | Miyazawa | | 7,149,316 B1 | 12/2006 | Kutz et al. |
| 6,949,984 B2 | 9/2005 | Siniscalchi | | 7,150,002 B1 | 12/2006 | Anderson et al. |
| 6,950,954 B1 | 9/2005 | Sullam et al. | | 7,151,528 B2 | 12/2006 | Taylor et al. |
| 6,950,990 B2 | 9/2005 | Rajarajan et al. | | 7,152,027 B2 | 12/2006 | Andrade et al. |
| 6,952,778 B1 | 10/2005 | Snyder | | 7,154,294 B2 | 12/2006 | Liu et al. |
| 6,954,511 B2 | 10/2005 | Tachimori | | 7,161,936 B1 | 1/2007 | Barrass et al. |
| 6,954,904 B2 | 10/2005 | White | | 7,162,410 B1 | 1/2007 | Nemecek et al. |
| 6,956,419 B1 | 10/2005 | Mann et al. | | 7,176,701 B2 | 2/2007 | Wachi et al. |
| 6,957,180 B1 | 10/2005 | Nemecek | | 7,178,096 B2 | 2/2007 | Rangan et al. |
| 6,957,242 B1 | 10/2005 | Snyder | | 7,180,342 B1 | 2/2007 | Shutt et al. |
| 6,963,233 B2 | 11/2005 | Puccio et al. | | 7,185,162 B1 | 2/2007 | Snyder |
| 6,963,908 B1 | 11/2005 | Lynch et al. | | 7,185,321 B1 | 2/2007 | Roe et al. |
| 6,966,039 B1 | 11/2005 | Bartz et al. | | 7,188,063 B1 | 3/2007 | Snyder |
| 6,967,511 B1 | 11/2005 | Sullam | | 7,193,901 B2 | 3/2007 | Ruby et al. |
| 6,967,960 B1 | 11/2005 | Bross et al. | | 7,200,507 B2 | 4/2007 | Chen et al. |
| 6,968,346 B2 | 11/2005 | Hekmatpour | | 7,206,733 B1 | 4/2007 | Nemecek |
| 6,969,978 B2 | 11/2005 | Dening | | 7,212,189 B2 | 5/2007 | Shaw et al |
| 6,970,844 B1 | 11/2005 | Bierenbaum | | 7,221,187 B1 | 5/2007 | Snyder et al. |
| 6,971,004 B1 | 11/2005 | Pleis et al. | | 7,227,389 B2 | 6/2007 | Gong et al. |
| 6,973,400 B2 | 12/2005 | Cahill-O'Brien et al. | | 7,236,921 B1 | 6/2007 | Nemecek et al. |
| 6,975,123 B1 | 12/2005 | Malang et al. | | 7,250,825 B2 | 7/2007 | Wilson et al. |
| 6,980,060 B2 | 12/2005 | Boerstler et al. | | 7,256,588 B2 | 8/2007 | Howard et al. |
| 6,981,090 B1 | 12/2005 | Kutz et al. | | 7,265,633 B1 | 9/2007 | Stiff |
| 6,988,192 B2 | 1/2006 | Snider | | 7,266,768 B2 | 9/2007 | Ferlitsch et al. |
| 6,996,799 B1 | 2/2006 | Cismas et al. | | 7,281,846 B2 | 10/2007 | McLeod |
| 7,005,933 B1 | 2/2006 | Shutt | | 7,282,905 B2 | 10/2007 | Chen et al. |
| 7,009,444 B1 | 3/2006 | Scott | | 7,283,151 B2 | 10/2007 | Nihei et al. |
| 7,010,773 B1 | 3/2006 | Bartz et al. | | 7,287,112 B1 | 10/2007 | Pleis et al. |
| 7,015,735 B2 | 3/2006 | Kimura et al. | | 7,288,977 B2 | 10/2007 | Stanley |
| 7,017,145 B2 | 3/2006 | Taylor | | 7,290,244 B2 | 10/2007 | Peck et al. |

| | | |
|---|---|---|
| 7,295,049 B1 * | 11/2007 | Moyal et al. ............... 327/141 |
| 7,298,124 B2 | 11/2007 | Kan et al. |
| 7,301,835 B2 | 11/2007 | Joshi et al. |
| 7,305,510 B2 | 12/2007 | Miller |
| 7,307,485 B1 | 12/2007 | Snyder et al. |
| 7,308,608 B1 | 12/2007 | Pleis et al. |
| 7,312,616 B2 | 12/2007 | Snyder |
| 7,323,879 B2 | 1/2008 | Kuo et al. |
| 7,332,976 B1 | 2/2008 | Brennan |
| 7,342,405 B2 | 3/2008 | Eldridge et al. |
| 7,358,714 B2 | 4/2008 | Watanabe et al. |
| 7,367,017 B2 | 4/2008 | Maddocks et al. |
| 7,373,437 B2 | 5/2008 | Seigneret et al. |
| 7,376,001 B2 | 5/2008 | Joshi et al. |
| 7,376,904 B2 | 5/2008 | Cifra et al. |
| 7,386,740 B2 | 6/2008 | Kutz et al. |
| 7,400,183 B1 | 7/2008 | Sivadasan et al. |
| 7,421,251 B2 | 9/2008 | Westwick et al. |
| 7,466,307 B2 | 12/2008 | Trent, Jr. et al. |
| 7,542,533 B2 | 6/2009 | Jasa et al. |
| 7,554,847 B2 | 6/2009 | Lee |
| 7,616,509 B2 | 11/2009 | Qureshi et al. |
| 2001/0002129 A1 | 5/2001 | Zimmerman et al. |
| 2001/0010083 A1 | 7/2001 | Satoh |
| 2001/0038392 A1 | 11/2001 | Humpleman et al. |
| 2001/0043081 A1 | 11/2001 | Rees |
| 2001/0044927 A1 | 11/2001 | Karniewicz |
| 2001/0045861 A1 | 11/2001 | Bloodworth et al. |
| 2001/0047509 A1 | 11/2001 | Mason et al. |
| 2002/0010716 A1 | 1/2002 | McCartney et al. |
| 2002/0016706 A1 | 2/2002 | Cooke et al. |
| 2002/0023110 A1 | 2/2002 | Fortin et al. |
| 2002/0042696 A1 | 4/2002 | Garcia et al. |
| 2002/0052729 A1 | 5/2002 | Kyung et al. |
| 2002/0059543 A1 | 5/2002 | Cheng et al. |
| 2002/0063688 A1 | 5/2002 | Shaw et al. |
| 2002/0065646 A1 | 5/2002 | Waldie et al. |
| 2002/0068989 A1 | 6/2002 | Ebisawa et al. |
| 2002/0073119 A1 | 6/2002 | Richard |
| 2002/0073380 A1 | 6/2002 | Cooke |
| 2002/0080186 A1 | 6/2002 | Frederiksen |
| 2002/0085020 A1 | 7/2002 | Carroll, Jr. |
| 2002/0099863 A1 | 7/2002 | Comeau et al. |
| 2002/0109722 A1 | 8/2002 | Rogers et al. |
| 2002/0116168 A1 | 8/2002 | Kim |
| 2002/0122060 A1 | 9/2002 | Markel |
| 2002/0129334 A1 | 9/2002 | Dane et al. |
| 2002/0133771 A1 | 9/2002 | Barnett |
| 2002/0133794 A1 | 9/2002 | Kanapathippillai et al. |
| 2002/0138516 A1 | 9/2002 | Igra |
| 2002/0121679 A1 | 10/2002 | Bazarjani et al. |
| 2002/0144099 A1 | 10/2002 | Muro, Jr. et al. |
| 2002/0145433 A1 | 10/2002 | Morrise et al. |
| 2002/0152234 A1 | 10/2002 | Estrada et al. |
| 2002/0152449 A1 | 10/2002 | Lin |
| 2002/0156885 A1 | 10/2002 | Thakkar |
| 2002/0156998 A1 | 10/2002 | Casselman |
| 2002/0161802 A1 | 10/2002 | Gabrick et al. |
| 2002/0166100 A1 | 11/2002 | Meding |
| 2002/0174134 A1 | 11/2002 | Goykhman |
| 2002/0174411 A1 | 11/2002 | Feng et al. |
| 2002/0191029 A1 | 12/2002 | Gillespie et al. |
| 2003/0011639 A1 | 1/2003 | Webb |
| 2003/0014447 A1 | 1/2003 | White |
| 2003/0025734 A1 | 2/2003 | Boose et al. |
| 2003/0041235 A1 | 2/2003 | Meyer |
| 2003/0056071 A1 | 3/2003 | Triece et al. |
| 2003/0058469 A1 | 3/2003 | Buis et al. |
| 2003/0061572 A1 | 3/2003 | McClannahan et al. |
| 2003/0062889 A1 | 4/2003 | Ely et al. |
| 2003/0080755 A1 | 5/2003 | Kobayashi |
| 2003/0097640 A1 | 5/2003 | Abrams et al. |
| 2003/0105620 A1 | 6/2003 | Bowen |
| 2003/0126947 A1 | 7/2003 | Margaria |
| 2003/0135842 A1 | 7/2003 | Frey et al. |
| 2003/0149961 A1 | 8/2003 | Kawai et al. |
| 2003/0229482 A1 | 12/2003 | Cook et al. |
| 2004/0018711 A1 | 1/2004 | Madurawe |
| 2004/0054821 A1 | 3/2004 | Warren et al. |
| 2004/0153802 A1 | 8/2004 | Kudo et al. |
| 2004/0205553 A1 | 10/2004 | Hall et al. |
| 2004/0205617 A1 | 10/2004 | Light |
| 2004/0205695 A1 | 10/2004 | Fletcher |
| 2005/0024341 A1 | 2/2005 | Gillespie et al. |
| 2005/0066152 A1 | 3/2005 | Garey |
| 2005/0143968 A9 | 6/2005 | Odom et al. |
| 2005/0240917 A1 | 10/2005 | Wu |
| 2005/0248534 A1 | 11/2005 | Kehlstadt |
| 2005/0280453 A1 | 12/2005 | Hsieh |
| 2006/0015862 A1 | 1/2006 | Odom et al. |
| 2006/0031768 A1 | 2/2006 | Shah et al. |
| 2006/0032680 A1 | 2/2006 | Elias et al. |
| 2006/0097991 A1 | 5/2006 | Hotelling et al. |
| 2006/0273804 A1 | 12/2006 | Delorme et al. |
| 2007/0139074 A1 | 6/2007 | Reblewski |
| 2007/0258458 A1 | 11/2007 | Kapoor |
| 2008/0095213 A1 | 4/2008 | Lin et al. |
| 2008/0186052 A1 | 8/2008 | Needham et al. |
| 2008/0259998 A1 | 10/2008 | Venkataraman et al. |
| 2008/0294806 A1 | 11/2008 | Swindle et al. |
| 2009/0066427 A1 | 3/2009 | Brennan |
| 2009/0322305 A1 | 12/2009 | De Cremoux |

FOREIGN PATENT DOCUMENTS

| | | |
|---|---|---|
| EP | 0308583 A1 | 3/1989 |
| EP | 0308583 A2 | 3/1989 |
| EP | 368398 A1 | 5/1990 |
| EP | 0450863 A1 | 10/1991 |
| EP | 0450863 A2 | 10/1991 |
| EP | 0499383 A1 | 8/1992 |
| EP | 0499383 A2 | 8/1992 |
| EP | 0639816 A1 | 2/1995 |
| EP | 0639816 A2 | 2/1995 |
| EP | 1170671 A1 | 1/2002 |
| EP | 1205848 A1 | 5/2002 |
| EP | 1191423 A1 | 2/2003 |
| EP | 1191423 A2 | 2/2003 |
| JP | 404083405 A1 | 3/1992 |
| JP | 405055842 A1 | 3/1993 |
| JP | 06021732 A1 | 1/1994 |
| JP | 404095408 A1 | 3/2002 |
| WO | 9532478 A1 | 11/1995 |
| WO | PCT/US06/17305 A1 | 6/1996 |
| WO | PCT/US98/34376 A1 | 8/1998 |
| WO | PCT/US99/09712 A1 | 2/1999 |

OTHER PUBLICATIONS

USPTO Non-Final Rejection for U.S. Appl. No. 10/238,966 dated Jun. 30, 2008; 12 pages.
USPTO Non-Final Rejection for U.S. Appl. No. 10/238,966 dated Dec. 26, 2007; 12 pages.
USPTO Final Rejection for U.S. Appl. No. 10/238,966 dated Sep. 27, 2007; 9 pages.
USPTO Non-Final Rejection for U.S. Appl. No. 10/238,966 dated Apr. 19, 2007; 7 pages.
USPTO Non-Final Rejection for U.S. Appl. No. 10/238,966 dated Oct. 20, 2006; 8 pages.
USPTO Non-Final Rejection for U.S. Appl. No. 10/238,966 dated Apr. 6, 2006; 8 pages.
USPTO Notice of Allowance for U.S. Appl. No. 10/033,027 dated Mar. 31, 2009; 7 pages.
USPTO Non-Final Rejection for U.S. Appl. No. 10/033,027 dated Dec. 18, 2008; 5 pages.
USPTO Final Rejection for U.S. Appl. No. 10/033,027 dated Jun. 8, 2007; 8 pages.

USPTO Non-Final Rejection for U.S. Appl. No. 10/033,027 dated Dec. 21, 2006; 31 pages.
USPTO Final Rejection for U.S. Appl. No. 10/033,027 dated Aug. 9, 2006; 6 pages.
USPTO Non-Final Rejection for U.S. Appl. No. 10/033,027 dated Apr. 26, 2006; 26 pages.
USPTO Final Rejection for U.S. Appl. No. 10/033,027 dated Oct. 31, 2005; 24 pages.
USPTO Non-Final Rejection for U.S. Appl. No. 10/033,027 dated Apr. 20, 2005; 20 pages.
USPTO Non-Final Rejection for U.S. Appl. No. 10/033,027 dated Oct. 18, 2004; 17 pages.
USPTO Non-Final Rejection for U.S. Appl. No. 10/001,478 dated Oct. 20, 2008; 18 pages.
USPTO Final Rejection for U.S. Appl. No. 10/001,478 dated Jun. 4, 2008; 18 pages.
USPTO Non-Final Rejection for U.S. Appl. No. 10/001,478 dated Jan. 30, 2008; 19 pages.
USPTO Final Rejection for U.S. Appl. No. 10/001,478 dated Sep. 17, 2007; 15 pages.
USPTO Non-Final Rejection for U.S. Appl. No. 10/001,478 dated Apr. 2, 2007; 17 pages.
USPTO Final Rejection for U.S. Appl. No. 10/001,478 dated Sep. 5, 2006; 19 pages.
USPTO Non-Final Rejection for U.S. Appl. No. 10/001,478 dated Mar. 15, 2006; 19 pages.
USPTO Final Rejection for U.S. Appl. No. 10/001,478 dated Oct. 24, 2005; 15 pages.
USPTO Non-Final Rejection for U.S. Appl. No. 10/001,478 dated May 16, 2005; 13 pages.
USPTO Notice of Allowance for U.S. Appl. No. 10/002,217 dated Jan. 28, 2009; 4 pages.
USPTO Notice of Allowance for U.S. Appl. No. 10/002,217 dated Oct. 14, 2008; 6 pages.
USPTO Notice of Allowance for U.S. Appl. No. 10/002,217 dated Jun. 6, 2008; 7 pages.
USPTO Final Rejection for U.S. Appl. No. 10/002,217 dated Feb. 6, 2008; 10 pages.
USPTO Non-Final Rejection for U.S. Appl. No. 10/002,217 dated Aug. 3, 2007; 10 pages.
USPTO Final Rejection for U.S. Appl. No. 10/002,217 dated Mar. 7, 2007; 12 pages.
USPTO Non-Final Rejection for U.S. Appl. No. 10/002,217 dated Oct. 2, 2006; 21 pages.
USPTO Non-Final Rejection for U.S. Appl. No. 10/002,217 dated Apr. 3, 2006; 12 pages.
USPTO Final Rejection for U.S. Appl. No. 10/002,217 dated Nov. 17, 2005; 17 pages.
USPTO Non-Final Rejection for U.S. Appl. No. 10/002,217 dated May 19, 2005; 15 pages.
USPTO Advisory Action for U.S. Appl. No. 10/001,477 dated Oct. 10, 2008; 3 pages.
"An Analog PPL-Based Clock and Data Recovery Circuit with High Input Jitter Tolerance;" Sun, Reprinted from IEEE Journal of Solid-State Circuits, 1989; 4 pages.
"WP 3.5: An Integrated Time Reference;" Blauschild, Digest of Technical Papers, 1994; 4 pages.
"Micropower CMOS Temperature Sensor with Digital Output;" Bakker et al., IEEE Journal of Solid-State Circuits, 1996; 3 pages.
U.S. Appl. No. 09/964,991: "A Novel Band-Gap Circuit for Providing an Accurate Reference Voltage Compensated for Process State, Process Variations and Temperature," Kutz et al.; 25 pages.
U.S. Appl. No. 09/842,966: "Precision Crystal Oscillator Circuit Used in Microcontroller," Mar; 28 pages.
USPTO Non-Final Rejection for U.S. Appl. No. 09/975,115 dated Oct. 9, 2008; 34 pages.
USPTO Final Rejection for U.S. Appl. No. 09/975,115 dated May 12, 2008; 33 pages.
USPTO Non-Final Rejection for U.S. Appl. No. 09/975,115 dated Jan. 7, 2008; 30 pages.
USPTO Non-Final Rejection for U.S. Appl. No. 09/975,115 dated Jul. 31, 2007; 28 pages.
USPTO Final Rejection for U.S. Appl. No. 09/975,115 dated Feb. 21, 2007; 25 pages.
USPTO Non-Final Rejection for U.S. Appl. No. 09/975,115 dated Oct. 31, 2006; 19 pages.
USPTO Final Rejection for U.S. Appl. No. 09/975,115 dated Jun. 23, 2006; 20 pages.
USPTO Non-Final Rejection for U.S. Appl. No. 09/975,115 dated Jan. 11, 2006; 15 pages.
USPTO Non-Final Rejection for U.S. Appl. No. 09/975,115 dated Jul. 27, 2005; 11 pages.
USPTO Non-Final Rejection for U.S. Appl. No. 09/975,115 dated Feb. 11, 2005; 86 pages.
USPTO Final Rejection for U.S. Appl. No. 09/975,338 dated Jan. 31, 2008; 21 pages.
USPTO Non-Final Rejection for U.S. Appl. No. 09/975,338 dated Aug. 14, 2007; 19 pages.
USPTO Final Rejection for U.S. Appl. No. 09/975,338 dated Feb. 27, 2007; 23 pages.
USPTO Non-Final Rejection for U.S. Appl. No. 09/975,338 dated Sep. 6, 2006; 11 pages.
USPTO Advisory Action for U.S. Appl. No. 09/975,338 dated May 15, 2006; 4 pages.
USPTO Final Rejection for U.S. Appl. No. 09/975,338 dated Jan. 18, 2006; 12 pages.
USPTO Non-Final Rejection for U.S. Appl. No. 09/975,338 dated Apr. 5, 2005; 13 pages.
USPTO Final Rejection for U.S. Appl. No. 10/008,096 dated Feb. 10, 2005; 15 pages.
USPTO Final Rejection for U.S. Appl. No. 10/008,096 dated Jun. 16, 2008; 23 pages.
USPTO Final Rejection for U.S. Appl. No. 10/008,096 dated Sep. 4, 2007; 19 pages.
USPTO Final Rejection for U.S. Appl. No. 10/008,096 dated Oct. 13, 2006; 17 pages.
USPTO Final Rejection for U.S. Appl. No. 10/008,096 dated Nov. 25, 2005; 17 pages.
USPTO Non-Final Rejection for U.S. Appl. No. 10/008,096 dated Mar. 7, 2007; 19 pages.
USPTO Non-Final Rejection for U.S. Appl. No. 10/008,096 dated Apr. 17, 2006; 18 pages.
USPTO Non-Final Rejection for U.S. Appl. No. 10/008,096 dated Jun. 14, 2004; 24 pages.
USPTO Non-Final Rejection for U.S. Appl. No. 10/008,096 dated Jun. 24, 2005; 15 pages.
USPTO Non-Final Rejection for U.S. Appl. No. 10/008,096 dated Dec. 12, 2007; 14 pages.
USPTO Notice of Allowance for U.S. Appl. No. 10/008,096 dated Dec. 22, 2008; 24 pages.
USPTO Notice of Allowance for U.S. Appl. No. 09/975,105 dated Dec. 4, 2006; 4 pages.
USPTO Final Rejection for U.S. Appl. No. 09/975,105 dated Jul. 13, 2006; 7 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
U.S. Appl. No. 09/943,062: "Apparatus and Method for Programmable Power Management in a Programmable Analog Circuit Block;" Mar; 46 pages.
U.S. Appl. No. 10/238,966: "Method for Parameterizing a User Module;" Perrin; 41 pages.
USPTO Notice of Allowance for U.S. Appl. No. 10/324,455 dated Feb. 12, 2004; 4 pages.
USPTO Non-Final Rejection for U.S. Appl. No. 10/324,455 dated Nov. 6, 2003; 4 pages.
USPTO Non-Final Rejection for U.S. Appl. No. 10/324,455 dated Aug. 21, 2003; 4 pages.
USPTO Notice of Allowance for U.S. Appl. No. 09/998,859 dated Mar. 14, 2005; 6 pages.
USPTO Non-Final Rejection for U.S. Appl. No. 09/998,859 dated Nov. 4, 2004; 6 pages.
USPTO Final Rejection for U.S. Appl. No. 09/998,859 dated Nov. 19, 2003; 5 pages.

USPTO Non-Final Rejection for U.S. Appl. No. 09/998,859 dated May 28, 2003; 6 pages.
USPTO Non-Final Rejection for U.S. Appl. No. 09/998,859 dated May 15, 2003; 6 pages.
USPTO Notice of Allowance for U.S. Appl. No. 09/998,834 dated May 19, 2005; 7 pages.
Uspto Non-Final Rejection for U.S. Appl. No. 09/998,834 dated Sep. 20, 2004; 11 pages.
USPTO Notice of Allowance for U.S. Appl. No. 10/113,065 dated Apr. 6, 2006; 8 pages.
USPTO Final Rejection for U.S. Appl. No. 10/113,065 dated Oct. 26, 2005; 17 pages.
USPTO Non-Final Rejection for U.S. Appl. No. 10/113,065 dated May 20, 2005; 14 pages.
U.S. Appl. No. 09/207,912: "Circuit(s), Architecture and Method(s) for Operating and/or Tuning a Ring Oscillator;" Mar; 23 pages.
USPTO Notice of Allowance for U.S. Appl. No. 10/001,477 dated May 8, 2009; 6 pages.
From U.S. Appl. No. 10/033,027: Goodenough, F. "Analog Counterparts of FPGAS Ease System Design" Electronic Design, Penton Publishing, Cleveland, OH, US vol. 42, No. 21, Oct. 14, 1994; 10 pages.
From U.S. Appl. No. 10/033,027: Harbaum, T. et al. "Design of a Flexible Coprocessor Unit" Proceedings of the Euromicro Conference, XX XX, Sep. 1999; 10 pages.
From U.S. Appl. No. 10/033,027: "Programmable Microcontroller (PSoC) Architecture (Mixed Analog/Digital)"; Aug. 7, 2001; U.S. Appl. No. 09/924,734 Snyder et al.; 28 pages.
From U.S. Appl. No. 10/033,027: "Digital Configurable Macro Architecture"; Jul. 18, 2001; U.S. Appl. No. 09/909,045; Snyder; 37 pages.
From U.S. Appl. No. 10/033,027: "Configuring Digital Functions in a Digital Configurable Macro Architecture"; Jul. 18, 2001; U.S. Appl. No. 09/909,109; Snyder; 38 pages.
From U.S. Appl. No. 10/033,027: "A Programmable Analog System Architecture (As Amended)"; Jul. 18, 2001; U.S. Appl. No. 09/909,047; Mar; 60 pages.
From U.S. Appl. No. 10/033,027: "Programmable Methodology and Architecture for a Programmable Analog System (As Amended)"; Aug. 14, 2001; U.S. Appl. No. 09/930,021; Mar et al.; 87 pages.
From U.S. Appl. No. 10/033,027: "Method for Synchronizing and Resetting Clock Signals Supplied to Multiple Programmable Analog Blocks (As Amended)"; Oct. 1, 2001; U.S. Appl. No. 09/969;311; Sullam; 57 pages.
From U.S. Appl. No. 10/033,027: "Method and Apparatus for Programming a Flash Memory"; Jun. 5, 2001; U.S. Appl. No. 09/875,599; Snyder; 23 pages.
From U.S. Appl. No. 10/033,027: "In-System Chip Emulator Architecture"; Oct. 10, 2001; U.S. Appl. No. 09/975,115; Snyder et al.; 38 pages.
From U.S. Appl. No. 10/033,027: "A Configurable Input/Output Interface for a Microcontroller"; Sep. 14, 2001; U.S. Appl. No. 09/953,423; Snyder; 28 pages.
From U.S. Appl. No. 10/033,027: "Multiple Use of Microcontroller Pad"; Jun. 26, 2001; U.S. Appl. No. 09/893,050; Kutz et al.; 21 pages.
From U.S. Appl. No. 10/033,027: "Programming Architecture for a Programmable Analog System"; Aug. 14, 2001; U.S. Appl. No. 09/929,891; Mar et al.; 82 pages.
From U.S. Appl. No. 10/033,027 "Architecture for Synchronizing and Resetting Clock Signals Supplied to Multiple Analog Programmable Blocks"; Oct. 1, 2001; U.S. Appl. No. 09/969,313; Sullam; 50 pages.
USPTO Non-Final Rejection for U.S. Appl. No. 09/994,601 dated Nov. 14, 2006; 15 pages.
USPTO Final Rejection for U.S. Appl. No. 09/994,601 dated Mar. 8, 2006; 11 pages.
USPTO Non-Final Rejection for U.S. Appl. No. 09/994,601 dated Sep. 21, 2005; 12 pages.
USPTO Final Rejection for U.S. Appl. No. 09/994,601 dated Mar. 24, 2005; 10 pages.
Hintz et al.; "Microcontrollers", 1992, McGraw-Hill; 11 pages.
Ganapathy, Gopi, and Narayan, Ram, and Jorden, Glen, and Fernandez, Denzil, and Wang, Ming, and Nishimura, Jim; "Hardware Emulation for Functional Verification of K5", Jun. 1996, 33rd Design Automation Conference Proceedings, Jun. 3-7, 1996; 4 pages.
The U.S. Appl. No. 60/243,708 "Advanced Programmable Microcontroller Device"; Oct. 26, 2000; 277 pages.
"Webster's Third New International Dictionary", 1996, G. & C. Merriam Company; 3 pages (including pp. 1328-1329).
USPTO Advisory Action for U.S. Appl. No. 09/998,848 dated Sep. 7, 2005; 3 pages.
U.S. Appl. No. 09/957,084: "A Crystal-Less Oscillator with Trimmable Analog Current Control for Increased Stability;" Mar; 28 pages.
U.S. Appl. No. 09/969,313: "Architecture for Synchronizing and Resetting Clock Signals Supplied to Multiple Analog Programmable System on a Chip Block;" Sullam; 50 pages.
U.S. Appl. No. 09/972,319: "Method for Applying Instructions to Microprocessor in Test Mode;" Snyder; 31 pages.
U.S. Appl. No. 09/972,003: "Test Architecture for Microcontroller Providing for a Serial Communication Interface;" Snyder; 32 pages.
U.S. Appl. No. 09/972,133: "Method for Entering Circuit Test Mode;" Snyder; 30 pages.
U.S. Appl. No. 09/973,535: "Architecture for Decimation Algorithm;" Snyder; 26 pages.
U.S. Appl. No. 09/977,111: A Frequency Doubler Circuit with Trimmable Current Control; Shutt; 35 pages.
U.S. Appl. No. 10/272,231: "Digital Configurable Macro Architecture;" Snyder; 36 pages.
U.S. Appl. No. 11/125,554: "A Method for a Efficient Supply to a Microcontroller;" Kutz; 1 page.
U.S. Appl. No. 09/855,868: "Protecting Access to Microcontroller Memory Blocks;" Snyder; 28 pages.
U.S. Appl. No. 09/887,923: "Novel Method and System for Interacting between a Processor and a Power on Reset to Dynamically Control Power States in a Microcontroller;" Kutz; 44 pages.
U.S. Appl. No. 10/000,383: "System and Method of Providing a Programmable Clock Architecture for an Advanced Microcontroller;" Sullam; 34 pages.
U.S. Appl. No. 10/001,477: "Breakpoint Control in an In-Circuit Emulation System;" Roe; 43 pages.
U.S. Appl. No. 10/004,197: "In-Circuit Emulator with Gatekeeper Based Halt Control;" Nemecek; 47 pages.
U.S. Appl. No. 10/004,039: "In-Circuit Emulator with Gatekeeper for Watchdog Timer;" Nemecek; 46 pages.
U.S. Appl. No. 10/002,217: "Conditional Branching in an In-Circuit Emulation System;" Nemecek; 43 pages.
U.S. Appl. No. 10/001,568: "Combined In-Circuit Emulator and Programmer;" Nemecek; 47 pages.
U.S. Appl. No. 10/001,478: "In-Circuit Emulator and POD Synchronized Boot;" Nemecek; 44 pages.
U.S. Appl. No. 09/887,955: "Novel Power on Reset Circuit for Microcontroller;" Kutz; 42 pages.
U.S. Appl. No. 09/826,397: "Method and Circuit for Allowing a Microprocessor to Change its Operating Frequency on-the-fly;" Sullam; 24 pages.
U.S. Appl. No. 09/893,048: "A Microcontroller having an On-Chip High Gain Amplifier;" Kutz; 22 pages.
U.S. Appl. No. 09/912,768: "A Microcontroller having a Dual Mode Relax Oscillator that is Trimmable;" Shutt; 33 pages.
U.S. Appl. No. 09/922,419: "A Power Supply Pump Circuit for a Microcontroller;" Kutz; 38 pages.
U.S. Appl. No. 09/922,579: "A Method for a Efficient Supply to a Microcontroller:" Kutz; 37 pages.
U.S. Appl. No. 09/923,461: "Non-Interfering Multiply-Mac (Multiply Accumulate) Circuit;" Snyder; 25 pages.
U.S. Appl. No. 09/935,454: "Method and Apparatus for Local and Global Power Management in a Programmable Analog Circuit;" Mar; 51 pages.
U.S. Appl. No. 10/011,214: "Method and Circuit for Synchronizing a Write Operation between an On-Chip Microprocessor and an On-Chip Programmable Analog Device Operating at Different Frequencies;" Sullam; 49 pages.
Bursky, "FPGA Combines Multiple Interfaces and Logic," Electronic Design, vol. 48 No. 20, pp. 74-78 (Oct. 2, 2000); 5 pages.

Anonymous, "Warp Nine Engineering—The IEEE 1284 Experts-F/Port Product Sheet," undated web page found at http://www.fapo.com/fport.htm; printed on Apr. 12, 2005; 2 pages.

Anonymous, "F/Port:Fast Parallel Port for the PC" Installation Manual Release 7.1, circa 1997, available for download from http://www.fapo.com/fport.htm; 25 pages.

Nam et al.; "Fast Development of Source-Level Debugging System Using Hardware Emulation"; IEEE 2000; 4 pages.

Huang et al.; "Iceberg: An Embedded In-Cicuit Emulator Synthesizer For Microcontrollers"; ACM 1999; 6 pages.

Khan et al.; "FPGA Architectures for Asic Hardware Emulators"; IEEE 1993; 5 pages.

Oh et al.; Emulator Environment Based on an FPGA Prototyping Board; IEEE 21-23; Jun. 2000; 6 pages.

Hong et al.; "An FPGA-Based Hardware Emulator for Fast Fault Emulation"; IEEE 1997; 4 pages.

Ching et al.; "An In-Curcuit-Emulator for TMS320C25"; IEEE 1994; 6 pages.

Pasternak; "In-Circuit-Emulation in ASIC Architecture Cor Designs"; IEEE 1989; 4 pages.

Melear; "Using Background Modes for Testing, Debugging and Emulation of Microcontrollers"; IEEE 1997; 8 pages.

Walters, Stephen; "Computer-Aided Prototyping for ASIC-Based Systems", 1991, IEEE Design & Test of Computers; vol. 8, Issue 2; 8 pages.

Anonymous; "JEEN JTAG Embedded Ice Ethernet Interface"; Aug. 1999; Embedded Performance, Inc.; 3 pages.

Sedory; "A Guide to Debug"; 2004; retrieved on May 20, 2005; 7 pages.

"Microsoft Files Summary Judgement Motions"; Feb. 1999; Microsoft PressPass; retrieved on May 20, 2005 from http://www.microsoft.com/presspass/press/1999/feb99/Feb99/Calderapr.asp; 3 pages.

Xerox; "Mesa Debugger Documentation"; Apr. 1979; Xerox Systems Development Department; Version 5.0; 33 pages.

Stallman et al.; "Debugging with the GNU Source-Level Debugger"; Jan. 1994; retrieved on May 2, 2005 from http://www.cs.utah.edu; 4 pages.

Wikipedia.org; "Von Neumann architecture"; retrieved from http://en.wikipedia.org/wiki/Von_Neumann_architecture on Jan. 22, 2007; 4 pages.

Stan Augarten; "The Chip Collection—Introduction—Smithsonian Institute"; "State of the Art"; "The First 256-Bit Static RAM"; retrieved on Nov. 14, 2005 from http://smithsonianchips.si.edu/augarten/p24.htm; 2 pages.

"POD—Piece of Data, Plain Old Documentation, Plain Old Dos. . ."; retrieved on Nov. 14, 2005 from http://www.auditmypc.com/acronym/POD.asp; 2 pages.

USPTO Non-Final Rejection for U.S. Appl. No. 09/989,767 dated Oct. 6, 2004; 15 pages.

USPTO Final Rejection for U.S. Appl. No. 09/989,771 dated Feb. 27, 2007; 8 pages.

USPTO Final Rejection for U.S. Appl. No. 09/989,771 dated Mar. 28, 2006; 9 pages.

USPTO Final Rejection for U.S. Appl. No. 09/989,771 dated Apr. 6, 2005; 7 pages.

USPTO Final Rejection for U.S. Appl. No. 09/989,771 dated Dec. 10, 2008; 12 pages.

USPTO Final Rejection for U.S. Appl. No. 09/989,771 dated Dec. 27, 2007; 15 pages.

USPTO Non-Final Rejection for U.S. Appl. No. 09/989,771 dated May 28, 2008; 14 pages.

USPTO Non-Final Rejection for U.S. Appl. No. 09/989,771 dated Jul. 16, 2007; 14 pages.

USPTO Non-Final Rejection for U.S. Appl. No. 09/989,771 dated Aug. 23, 2006; 7 pages.

USPTO Non-Final Rejection for U.S. Appl. No. 09/989,771 dated Sep. 12, 2005; 7 pages.

USPTO Non-Final Rejection for U.S. Appl. No. 09/989,771 dated Sep. 22, 2004; 7 pages.

USPTO Final Rejection for U.S. Appl. No. 09/989,765 dated Apr. 3, 2007; 12 pages.

USPTO Final Rejection for U.S. Appl. No. 09/989,765 dated Apr. 4, 2008; 16 pages.

USPTO Final Rejection for U.S. Appl. No. 09/989,765 dated Apr. 17, 2006; 12 pages.

USPTO Non-Final Rejection for U.S. Appl. No. 09/989,765 dated Sep. 19, 2007; 14 pages.

USPTO Non-Final Rejection for U.S. Appl. No. 09/989,765 dated Sep. 26, 2008; 17 pages.

USPTO Non-Final Rejection for U.S. Appl. No. 09/989,765 dated Oct. 2, 2006; 13 pages.

USPTO Non-Final Rejection for U.S. Appl. No. 09/989,765 dated Oct. 5, 2005; 9 pages.

USPTO Final Rejection for U.S. Appl. No. 09/989,782 dated Jul. 9, 2008; 10 pages.

USPTO Final Rejection for U.S. Appl. No. 09/989,782 dated Jul. 24, 2007; 9 pages.

USPTO Final Rejection for U.S. Appl. No. 09/989,782 dated Sep. 21, 2006; 10 pages.

USPTO Final Rejection for U.S. Appl. No. 09/989,782 dated Nov. 3, 2005; 11 pages.

USPTO Non-Final Rejection for U.S. Appl. No. 09/989,782 dated Jan. 29, 2007; 9 pages.

USPTO Non-Final Rejection for U.S. Appl. No. 09/989,782 dated Mar. 28, 2006; 8 pages.

USPTO Non-Final Rejection for U.S. Appl. No. 09/989,782 dated Apr. 29, 2005; 11 pages.

USPTO Non-Final Rejection for U.S. Appl. No. 09/989,782 dated Oct. 6, 2004; 11 pages.

USPTO Non-Final Rejection for U.S. Appl. No. 09/989,782 dated Nov. 26, 2008; 10 pages.

USPTO Non-Final Rejection for U.S. Appl. No. 09/989,782 dated Dec. 14, 2007; 8 pages.

USPTO Final Rejection for U.S. Appl. No. 09/989,765 dated Mar. 31, 2009; 18 pages.

USPTO Final Rejection for U.S. Appl. No. 09/989,778 dated Mar. 16, 2009; 26 pages.

"Pod-Wikipedia, the free encyclopedia"; retrieved on Nov. 14, 2005 from http://en.wikipedia.org/wiki/Pod; 3 pages.

"pod-defintion by dict.die.net"; retrieved on Nov. 14, 2005 from http://dict.die.net/pod; 2 pages.

"In-Curcuit Emulators—descriptions of the major ICEs around"; retrieved on Nov. 14, 2005 from http://www.algonet.se/~staffann/developer/emulator.htm; 6 pages.

"Capturing Test/Emulation and Enabling Real-Time Debugging Using FPGA for In-Circuit Emulation;" Oct. 10, 2001; U.S. Appl. No. 09/975,104; Snyder; 35 pages.

USPTO Non-Final Rejection for U.S. Appl. No. 09/989,767 dated Jul. 24, 2008; 21 pages.

Anonymous; "Using Debug"; 1999; Prentice-Hall Publishing; 20 pages.

Harrison et al.; "Xilinx FPGA Design in a Group Environment Using VHDS and Synthesis Tools"; Colloquium on Digital System Design Using Synthesis Techniques; Feb. 15, 1996; 4 pages.

Microsoft Press Computer User's Dictionary; 1998; 3 pages (including p. 18).

Sreeram Duvvuru and Siamak Arya, "Evaluation of a Branch Target Address Cache," 1995; IEEE; 8 pages.

Andrew S. Tanenbaum with contributions from James R. Goodman, "Structured Computer Organization," 1999, Prentice Hall, Fourth Edition; 32 pages.

"Method for Breaking Execution of a Test Code in DUT and Emulator Chip Essentially Simultaneously and Handling Complex Breakpoint Events;" Oct. 10, 2001; U.S. Appl. No. 09/975,338; Nemecek et al.; 34 pages.

"Emulator Chip-Board Architecture for Interface;" Oct. 10, 2001; U.S. Appl. No. 09/975,030; Snyder et al.; 37 pages.

Wikipedia - Main Page, retrieved on Mar. 8, 2006 from http://en.wikipedia.org/wiki/Main_Page and http://en.wikipedia.org/wiki/Wikipedia:Introduction; 5 pages.

Wikipedia - Processor register, retrieved on Mar. 7, 2006 from http://en.wikipedia.org/wiki/Processor_register; 4 pages.

Jonathan B. Rosenburg, "How Debuggers Work" John Wiley & Sons, Inc. 1996; 259 pages.

Dahl, et al.; "Emulation of the Sparcle Microprocessor with the MIT Virtual Wires Emulation System"; 1994; IEEE; 9 pages.
Bauer et al.; "A Reconfigurable Logic Machine for Fast Event-Driven Simulation"; 1998; Design Automation Conference Proceedings; 8 pages.
"Host to FPGA Interface in an In-Circuit Emulation System;" Oct. 10, 2001; U.S. Appl. No. 09/975,105; Nemecek; 44 pages.
USPTO Advisory Action for U.S. Appl. No. 09/994,601 dated May 23, 2006; 3 pages.
USPTO Non-Final Rejection for U.S. Appl. No. 09/994,601 dated Jul. 29, 2004; 10 pages.
USPTO Ex Parte Qualyle Action for U.S. Appl. No. 09/992,076 dated Jun. 18, 2007; 6 pages.
USPTO Non-Final Rejection for U.S. Appl. No. 09/989,767 dated Jul. 2, 2007; 22 pages.
USPTO Notice of Allowance for U.S. Appl. No. 09/992,076 dated Mar. 26, 2008; 23 pages.
USPTO Notice of Allowance for U.S. Appl. No. 09/992,076 dated Jul. 29, 2008; 6 pages.
UPSTO Advisory Action for U.S. Appl. No. 09/989,778 dated May 15, 2006; 4 pages.
USPTO Final Rejection for U.S. Appl. No. 09/989,778 dated Jan. 8, 2009; 25 pages.
USPTO Final Rejection for U.S. Appl. No. 09/989,778 dated Feb. 5, 2007; 17 pages.
USPTO Final Rejection for U.S. Appl. No. 09/989,778 dated Feb. 15, 2006; 9 pages.
USPTO Final Rejection for U.S. Appl. No. 09/989,778 dated Dec. 20, 2007; 14 pages.
USPTO Non-Final Rejection for U.S. Appl. No. 09/989,778 dated Mar. 29, 2005; 14 pages.
USPTO Non-Final Rejection for U.S. Appl. No. 09/989,778 dated Jul. 14, 2008; 24 pages.
USPTO Non-Final Rejection for U.S. Appl. No. 09/989,778 dated Jul. 19, 2007; 18 pages.
USPTO Non-Final Rejection for U.S. Appl. No. 09/989,778 dated Sep. 1, 2005; 10 pages.
USPTO Non-Final Rejection for U.S. Appl. No. 09/989,778 dated Sep. 18, 2006; 11 pages.
USPTO Final Rejection for U.S. Appl. No. 09/989,848 dated Jun. 14, 2005; 17 pages.
USPTO Final Rejection for U.S. Appl. No. 09/998,848 dated Jul. 25, 2006; 16 pages.
USPTO Final Rejection for U.S. Appl. No. 09/998,848 dated Aug. 10, 2007; 14 pages.
USPTO Final Rejection for U.S. Appl. No. 09/998,848 dated Nov. 24, 2008; 15 pages.
USPTO Non-Final Rejection for U.S. Appl. No. 09/998,848 dated Jan. 26, 2006; 17 pages.
USPTO Non-Final Rejection for U.S. Appl. No. 09/998,848 dated Jan. 29, 2007; 13 pages.
USPTO Non-Final Rejection for U.S. Appl. No. 09/998,848 dated Feb. 22, 2008; 15 pages.
USPTO Non-Final Rejection for U.S. Appl. No. 09/998,848 dated Dec. 21, 2004; 14 pages.
USPTO Final Rejection for U.S. Appl. No. 09/989,767 dated Jan. 11, 2007; 12 pages.
USPTO Final Rejection for U.S. Appl. No. 09/989,767 dated Jan. 15, 2009; 21 pages.
USPTO Final Rejection for U.S. Appl. No. 09/989,767 dated Mar. 6, 2006; 15 pages.
USPTO Final Rejection for U.S. Appl. No. 09/989,767 dated Apr. 6, 2005; 13 pages.
USPTO Final Rejection for U.S. Appl. No. 09/989,767 dated Dec. 27, 2007; 21 pages.
USPTO Non-Final Rejection for U.S. Appl. No. 09/989,767 dated Jul. 17, 2006; 12 pages.
USPTO Notice of Allowance for U.S. Appl. No. 09/992,076 dated Nov. 13, 2008; 15 pages.
USPTO Final Rejection for U.S. Appl. No. 09/994,601 dated May 18, 2007; 17 pages.
USPTO Notice of Allowance for U.S. Appl. No. 09/992,076 dated Nov. 29, 2007; 8 pages.
USPTO Final Rejection for U.S. Appl. No. 09/992,076 dated Jan. 30, 2007; 32 pages.
USPTO Non-Final Rejection for U.S. Appl. No. 09/992,076 dated Aug. 10, 2006; 19 pages.
USPTO Final Rejection for U.S. Appl. No. 09/992,076 dated Mar. 17, 2006; 16 pages.
USPTO Non-Final Rejection for U.S. Appl. No. 09/992,076 dated Nov. 21, 2005; 29 pages.
USPTO Non-Final Rejection for U.S. Appl. No. 09/992,076 dated Jun. 1, 2005; 20 pages.
USPTO Notice of Allowance for U.S. Appl. No. 09/994,600 dated Nov. 12, 2008; 35 pages.
USPTO Notice of Allowance for U.S. Appl. No. 09/994,600 dated May 14, 2008; 22 pages.
USPTO Final Rejection for U.S. Appl. No. 09/994,600 dated Oct. 17, 2007; 13 pages.
USPTO Non-Final Rejection for U.S. Appl. No. 09/994,600 dated May 15, 2007; 14 pages.
USPTO Final Rejection for U.S. Appl. No. 09/994,600 dated Dec. 8, 2006; 14 pages.
USPTO Non-Final Rejection for U.S. Appl. No. 09/994,600 dated Jul. 17, 2006; 14 pages.
USPTO Final Rejection for U.S. Appl. No. 09/994,600 dated Feb. 13, 2006; 13 pages.
USPTO Non-Final Rejection for U.S. Appl. No. 09/994,600 dated Aug. 23, 2005; 13 pages.
USPTO Final Rejection for U.S. Appl. No. 09/994,600 dated May 4, 2005; 16 pages.
USPTO Non-Final Rejection for U.S. Appl. No. 09/994,600 dated Oct. 21, 2004; 37 pages.
USPTO Notice of Allowance for U.S. Appl. No. 10/001,477 dated Nov. 10, 2008; 7 pages.
USPTO Final Rejection for U.S. Appl. No. 10/001,477 dated Jun. 30, 2008; 19 pages.
USPTO Non-Final Rejection for U.S. Appl. No. 10/001,477 dated Dec. 6, 2007; 17 pages.
USPTO Final Rejection for U.S. Appl. No. 10/001,477 dated Jul. 23, 2007; 19 pages.
USPTO Non-Final Rejection for U.S. Appl. No. 10/001,477 dated Jan. 22, 2007; 17 pages.
USPTO Final Rejection for U.S. Appl. No. 10/001,477 dated Aug. 24, 2006; 15 pages.
USPTO Non-Final Rejection for U.S. Appl. No. 10/001,477 dated Mar. 2, 2006; 17 pages.
USPTO Final Rejection for U.S. Appl. No. 10/001,477 dated Oct. 24, 2005; 18 pages.
USPTO Non-Final Rejection for U.S. Appl. No. 10/001,477 dated May 11, 2005; 31 pages.
Ito, Sergio Akira and Carro, Luigi; "A Comparison of Microcontrollers Targeted to FPGA-Based Embedded Applications", Sep. 2000, Proceedings of 13th Symposium on Integrated Circuits and Systems Design, Sep. 18-24, 2000; 6 pages.
Julio Faure et al.; "A Novel Mixed Signal Programmable Device With On-Chip Microprocessor", 1997, IEEE 1997 Custom Integrated Circuits Conference; 4 pages.
Monte Mar, Bert Sullam, Eric Blom; "An architecture for a configurable Mixed-signal device", 2003, IEEE Journal of Solid-State Circuits, vol. 3; 4 pages.
Robinson, Gordon D; "Why 1149.1 (JTAG) Really Works", May 1994, Conference Proceedings Electro/94 International, May 10-12, 1994, Combined Volumes; 6 pages.
USPTO Non-Final Rejection for U.S. Appl. No. 09/994,601 dated Oct. 4, 2007; 20 pages.
"PSoC designer: Integrated development environment, getting started 25-minute tutorial, version 1.0", Cypress Microsystems., Cypress Microsystems, Inc. CMS10006A, Jul. 3, 2001; 25 pages.
"PSoC technology complete changes 8-bit MCU system design", Cypress Microsystems, Inc. retrieved from <http>://www.archive.org/web/20010219005250/http://cypressmicro.com- /t...>, Feb. 19, 2001; 21 pages.

Specks et al., "A Mixed Digital-Analog 16B Microcontroller with 0.5MB Flash Memory, On-Chip Power Supply, Physical Nework Interface, and 40V I/O for Automotive Single-Chip Mechatronics," IEEE, Feb. 9, 2000; 1 page.

Hsieh et al., "Modeling Micro-Controller Peripherals for High-Level Co-Simulation and Synthesis," IEEE, 1997; 4 pages.

USPTO Notice of Allowance for U.S. Appl. No. 09/989,777 dated Nov. 4, 2008; 3 pages.

USPTO Notice of Allowance for U.S. Appl. No. 09/989,777 dated Sep. 15, 2008; 28 pages.

USPTO Notice of Allowance for U.S. Appl. No. 09/989,777 dated Jul. 7, 2008; 23 pages.

USPTO Final Rejection for U.S. Appl. No. 09/989,777 dated Jan. 30, 2008; 14 pages.

USPTO Non-Final Rejection for U.S. Appl. No. 09/989,777 dated Sep. 11, 2007; 18 pages.

USPTO Final Rejection for U.S. Appl. No. 09/989,777 dated Mar. 13, 2007; 24 pages.

USPTO Non-Final Rejection for U.S. Appl. No. 09/989,777 dated Sep. 13, 2006; 18 pages.

USPTO Non-Final Rejection for U.S. Appl. No. 09/989,777 dated Apr. 11, 2006; 21 pages.

Uspto Final Rejection for U.S. Appl. No. 09/989,777 dated Dec. 21, 2005; 29 pages.

USPTO Non-Final Rejection for U.S. Appl. No. 09/989,777 dated Jul. 5, 2005; 36 pages.

USPTO Notice of Allowance for U.S. Appl. No. 09/994,601 dated Dec. 22, 2008; 15 pages.

USPTO Final Rejection for U.S. Appl. No. 09/994,601 dated Apr. 17, 2008; 24 pages.

U.S. Appl. No. 10/033,027: "Microcontrollable Programmable System on a Chip;" Snyder; 117 pages.

U.S. Appl. No. 10/803,030: "Programmable Microcontrollable Architecture (Mixed Analog/Digital);" Snyder; 13 pages.

USPTO Notice of Allowance for U.S. Appl. No. 09/930,021 dated Nov. 26, 2004; 4 pages.

USPTO Final Rejection for U.S. Appl. No. 09/930,021 dated Aug. 31, 2004; 8 pages.

USPTO Non-Final Rejection for U.S. Appl. No. 09/930,021 dated Apr. 26, 2004; 6 pages.

USPTO Miscellaneous Action with SSP for U.S. Appl. No. 09/930,021 dated Oct. 1, 2001; 1 page.

USPTO Notice of Allowance for U.S. Appl. No. 09/953,423 dated Jul. 12, 2004; 6 pages.

USPTO Non-Final Rejection for U.S. Appl. No. 09/953,423 dated Feb. 6, 2004; 5 pages.

USPTO Notice of Allowance for U.S. Appl. No. 091957,084 dated May 18, 2004; 5 pages.

USPTO Final Rejection for U.S. Appl. No. 09/957,084 dated Jan. 29, 2004; 8 pages.

USPTO Non-Final Rejection for U.S. Appl. No. 09/957,084 dated Aug. 27, 2003; 8 pages.

USPTO Final Rejection for U.S. Appl. No. 09/957,084 dated Apr. 23, 2003; 8 pages.

USPTO Non-Final Rejection for U.S. Appl. No. 09/957,084 dated Aug. 23, 2002; 6 pages.

USPTO Notice of Allowance for U.S. Appl. No. 09/969,313 dated Oct. 4, 2005; 6 pages.

USPTO Non-Final Rejection for U.S. Appl. No. 09/969,313 dated May 6, 2005; 9 pages.

USPTO Requirement for Restriction/Election for U.S. Appl. No. 09/969,313 dated Mar. 18, 2005; 6 pages.

USPTO Notice of Allowance for U.S. Appl. No. 09/969,311 dated Mar. 1, 2005; 4 pages.

USPTO Non-Final Rejection for U.S. Appl. No. 09/969,311 dated Sep. 21, 2004; 4 pages.

USPTO Advisory Action for U.S. Appl. No. 09/969,311 dated Jul. 21, 2003; 2 pages.

USPTO Final Rejection for U.S. Appl. No. 09/969,311 dated Apr. 7, 2003; 7 pages.

USPTO Non-Final Rejection for U.S. Appl. No. 09/969,311 dated Nov. 6, 2002; 8 pages.

USPTO Notice of Allowance for U.S. Appl. No. 09/972,319 dated Dec. 30, 2004; 4 pages.

USPTO Non-Final Rejection for U.S. Appl. No. 09/972,319 dated Sep. 16, 2004; 9 pages.

USPTO Notice of Allowance for U.S. Appl. No. 09/972,003 dated Jul. 14, 2004; 4 pages.

USPTO Requirement for Restriction/Election for U.S. Appl. No. 09/972,003 dated May 6, 2004; 4 pages.

USPTO Non-Final Rejection for U.S. Appl. No. 09/972,003 dated Feb. 2, 2004; 10 pages.

USPTO Non-Final Rejection for U.S. Appl. No. 09/972,003 dated Aug. 19, 2003; 11 pages.

USPTO Notice of Allowance for U.S. Appl. No. 09/972,133 dated Jun. 9, 2006; 6 pages.

USPTO Final Rejection for U.S. Appl. No. 09/972,133 dated Mar. 30, 2006; 8 pages.

USPTO Non-Final Rejection for U.S. Appl. No. 09/972,133 dated Nov. 25, 2005; 9 pages.

USPTO Advisory Action for U.S. Appl. No. 09/972,133 dated Aug. 31, 2005; 3 pages.

USPTO Final Rejection for U.S. Appl. No. 09/972,133 dated Jun. 29, 2005; 10 pages.

USPTO Non-Final Rejection for U.S. Appl. No. 09/972,133 dated Mar. 8, 2005; 9 pages.

USPTO Notice of Allowance for U.S. Appl. No. 09/975,104 dated Oct. 19, 2006; 6 pages.

USPTO Non-Final Rejection for U.S. Appl. No. 09/975,104 dated Jun. 16, 2006; 8 pages.

USPTO Final Rejection for U.S. Appl. No. 09/975,104 dated Feb. 15, 2006; 7 pages.

USPTO Non-Final Rejection for U.S. Appl. No. 09/975,104 dated Aug. 16, 2005; 6 pages.

USPTO Non-Final Rejection for U.S. Appl. No. 09/975,104 dated Mar. 21, 2005; 7 pages.

USPTO Notice of Allowance for U.S. Appl. No. 09/975,030 dated Feb. 6, 2006; 7 pages.

USPTO Non-Final Rejection for U.S. Appl. No. 09/975,030 dated Oct. 20, 2005; 7 pages.

USPTO Non-Final Rejection for U.S. Appl. No. 09/975,030 dated Mar. 29, 2005; 13 pages.

USPTO Notice of Allowance for U.S. Appl. No. 09/977,111 dated Sep. 28, 2006; 6 pages.

USPTO Notice of Allowance for U.S. Appl. No. 10/272,231 dated Mar. 8, 2004; 6 pages.

USPTO Final Rejection for U.S. Appl. No. 10/272,231 dated Nov. 5, 2003; 5 pages.

USPTO Non-Final Rejection for U.S. Appl. No. 10/272,231 dated Jul. 14, 2003; 6 pages.

USPTO Notice of Allowance for U.S. Appl. No. 11/125,554 dated Feb. 7, 2008; 4 pages.

USPTO Notice of Allowance for U.S. Appl. No. 11/125,554 dated Apr. 24, 2007; 7 pages.

USPTO Non-Final Rejection for U.S. Appl. No. 11/125,554 dated Dec. 11, 2006; 9 pages.

USPTO Notice of Allowance for U.S. Appl. No. 09/855,868 dated Apr. 25, 2005; 6 pages.

USPTO Non-Final Rejection for U.S. Appl. No. 09/855,868 dated Aug. 26, 2004; 7 pages.

USPTO Notice of Allowance for U.S. Appl. No. 09/887,923 dated Sep. 27, 2004; 5 pages.

USPTO Non-Final Rejection for U.S. Appl. No. 09/887,923 dated May 25, 2004; 7 pages.

USPTO Notice of Allowance for U.S. Appl. No. 09/875,599 dated Oct. 17, 2006; 4 pages.

USPTO Non-Final Rejection for U.S. Appl. No. 09/875,599 dated May 31, 2006; 18 pages.

USPTO Final Rejection for U.S. Appl. No. 09/875,599 dated Feb. 15, 2006; 18 pages.

USPTO Final Rejection for U.S. Appl. No. 09/875,599 dated Nov. 21, 2005; 16 pages.

USPTO Advisory Action for U.S. Appl. No. 09/875,599 dated Jun. 8, 2005; 3 pages.

USPTO Final Rejection for U.S. Appl. No. 09/875,599 dated Mar. 29, 2005; 20 pages.
USPTO Non-Final Rejection for U.S. Appl. No. 09/875,599 dated Dec. 3, 2004; 16 pages.
USPTO Final Rejection for U.S. Appl. No. 09/875,599 dated Aug. 25, 2004; 17 pages.
USPTO Final Rejection for U.S. Appl. No. 09/875,599 dated Apr. 26, 2004; 15 pages.
USPTO Non-Final Rejection for U.S. Appl. No. 09/875,599 dated Oct. 27, 2003; 13 pages.
USPTO Notice of Allowance for U.S. Appl. No. 10/004,197 dated Feb. 9, 2007; 7 pages.
USPTO Notice of Allowance for U.S. Appl. No. 10/004,197 dated Oct. 6, 2006; 7 pages.
USPTO Non-Final Rejection for U.S. Appl. No. 10/004,197 dated Apr. 3, 2006; 13 pages.
USPTO Final Rejection for U.S. Appl. No. 10/004,197 dated Nov. 23, 2005; 17 pages.
USPTO Non-Final Rejection for U.S. Appl. No. 10/004,197 dated Jun. 6, 2005; 21 pages.
USPTO Notice of Allowance for U.S. Appl. No. 10/004,039 dated Aug. 15, 2006; 7 pages.
USPTO Non-Final Rejection for U.S. Appl. No. 10/004,039 dated Apr. 11, 2006; 14 pages.
USPTO Final Rejection for U.S. Appl. No. 10/004,039 dated Nov. 22, 2005; 19 pages.
USPTO Non-Final Rejection for U.S. Appl. No. 10/004,039 dated Jun. 6, 2005; 17 pages.
USPTO Notice of Allowance for U.S. Appl. No. 10/001,568 dated Mar. 17, 2006; 9 pages.
USPTO Final Rejection for U.S. Appl. No. 10/001,568 dated Oct. 26, 2005; 16 pages.
USPTO Non-Final Rejection for U.S. Appl. No. 10/001,568 dated May 19, 2005; 16 pages.
USPTO Notice of Allowance for U.S. Appl. No. 09/887,955 dated Oct. 12, 2004; 5 pages.
USPTO Non-Final Rejection for U.S. Appl. No. 09/887,955 dated May 26, 2004; 5 pages.
USPTO Notice of Allowance for U.S. Appl. No. 09/826,397 dated Oct. 7, 2004; 8 pages.
USPTO Non-Final Rejection for U.S. Appl. No. 09/826,397 dated Apr. 21, 2004; 6 pages.
USPTO Notice of Allowance for U.S. Appl. No. 09/893,048 dated Jul. 25, 2006; 4 pages.
USPTO Non-Final Rejection for U.S. Appl. No. 09/893,048 dated Jan. 12, 2006; 6 pages.
USPTO Non-Final Rejection for U.S. Appl. No. 09/893,048 dated Jul. 27, 2005; 6 pages.
USPTO Non-Final Rejection for U.S. Appl. No. 09/893,048 dated Oct. 6, 2004; 5 pages.
USPTO Notice of Allowance for U.S. Appl. No. 09/893,050 dated Jul. 5, 2005; 6 pages.
USPTO Non-Final Rejection for U.S. Appl. No. 09/893,050 dated Jan. 5, 2005; 13 pages.
USPTO Final Rejection for U.S. Appl. No. 09/893,050 dated Aug. 30, 2004; 13 pages.
USPTO Non-Final Rejection for U.S. Appl. No. 09/893,050 dated Jan. 15, 2004; 9 pages.
USPTO Notice of Allowance for U.S. Appl. No. 09/909,047 dated May 11, 2005; 25 pages.
USPTO Notice of Allowance for U.S. Appl. No. 09/909,047 dated Feb. 15, 2005; 6 pages.
USPTO Non-Final Rejection for U.S. Appl. No. 09/909,047 dated Jul. 6, 2004; 9 pages.
USPTO Notice of Allowance for U.S. Appl. No. 09/912,768 dated Sep. 13, 2005; 5 pages.
USPTO Non-Final Rejection for U.S. Appl. No. 09/912,768 dated Apr. 11, 2005; 14 pages.
USPTO Final Rejection for U.S. Appl. No. 09/912,768 dated Nov. 17, 2004; 13 pages.
USPTO Non-Final Rejection for U.S. Appl. No. 09/912,768 dated Jun. 22, 2004; 11 pages.
USPTO Notice of Allowance for U.S. Appl. No. 09/922,579 dated Dec. 28, 2004; 6 pages.
USPTO Non-Final Rejection for U.S. Appl. No. 09/922,579 dated Aug. 18, 2004; 6 pages.
USPTO Notice of Allowance for U.S. Appl. No. 09/923,461 dated May 12, 2005; 6 pages.
USPTO Non-Final Rejection for U.S. Appl. No. 09/923,461 dated Jul. 16, 2004; 6 pages.
USPTO Notice of Allowance for U.S. Appl. No. 09/929,891 dated Dec. 23, 2005; 4 pages.
USPTO Notice of Allowance for U.S. Appl. No. 09/929,891 dated Jun. 15, 2005; 6 pages.
USPTO Non-Final Rejection for U.S. Appl. No. 09/929,891 dated Sep. 13, 2004; 6 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
USPTO Notice of Allowance for U.S. Appl. No. 10/011,214 dated Apr. 11, 2005; 4 pages.
USPTO Final Rejection for U.S. Appl. No. 10/011,214 dated Jan. 21, 2005; 8 pages.
USPTO Non-Final Rejection for U.S. Appl. No. 10/011,214 dated Aug. 13, 2004; 10 pages.
Hong et al., "Hierarchial System Test by an IEEE 1149.5 MTM-Bus Slave-Module Interface Core," IEEE, 2000; 14 pages.
Haberl et al., "Self Testable Boards with Standard IEEE 1149.5 Module Test and Maintenance (MTM) Bus Interface," IEEE, 1994; 6 pages.
Varma et al., "A Structured Test Re-Use Methodology for Core-Based System Chips," IEEE, 1998; 9 pages.
Andrews, "Roadmap for Extending IEEE 1149.1 for Hierarchical Control of Locally-Stored, Standardized command Set, Test Programs," IEEE, 1994; 7 pages.
Adham et al., "Preliminary Outline of the IEEE P1500 Scalable Architecture for Testing Embedded Cores," IEEE; 6 pages.
Ghosh et al., "A Low Overhead Design for Testability and Test Generation Technique for Core-based Systems," IEEE, 1997; 10 pages.
Zorian, "Test Requirements for Embedded Core-based Systems and IEEE P1500," IEEE, 1997; 9 pages.
Zorian et al., "Testing Embedded-Core Based System Chips," IEEE, 1998; 14 pages.
Papachristou et al., "Microprocessor Based Testing for Core-Based on a Chip," IEEE, 1999; 6 pages.
Maroufi et al., "Solving the I/O Bandwidth Problem in System on a Chip Testing," IEEE, 2000; 6 pages.
Marsh, "Smart Tools Illuminate Deeply Embedded Systems," EDN, 2000; 7 pages.
York et al., "On-chip Support Needed for SOC Debug," Electronic Engineering Times, 1999; 2 pages.
Atmel Corporation: AT90SC Summary: "Secure Microcontrollers for Smart Cards," 1999; 7 pages.
Hwang et al., "Integrated circuit for automatically varying resistance in computer system, has pair of transistors connected in parallel with respective resistors such that resistors are bypassed when corresponding transistors are enabled," Derwent Information LTD; 2002; 2 pages.
Morrison, "IBM Eyes Merchant Packaging Services," Jul. 13, 1998; Electronic News <http://www.findarticles.com>; 4 pages.
Charles, Jr. et al., "Wirebonding: Reinventing the Process for MCMs," Apr. 1998; IEEE 7th International Conference on Multichip Modules and High Density Packaging; 3 pages.
Tran et al., "Fine Pitch and Wirebonding and Reliability of Aluminum Capped Copper Bond Pads," May 2000, IEEE Electronic Components and Technology Conference; 8 pages.
Song at al., "A 50% Power Reduction Scheme for CMOS Relaxation Oscillator," IEEE, 1999; 4 pages.
"Electronic Circuit Protector-Circuit Breaker," IBM Technical Disclosure Bulletin; vol. 36, Issue 8, Aug. 1, 1993; 1 page.
USPTO Final Rejection for U.S. Appl. No. 10/001,478 dated Apr. 20, 2009; 16 pages.

USPTO Notice of Allowance for U.S. Appl. No. 09/994,600 dated Apr. 3, 2009; 5 pages.
USPTO Notice of Allowance for U.S. Appl. No. 09/989,777 dated Mar. 9, 2009; 7 pages.
USPTO Notice of Allowance for U.S. Appl. No. 09/992,076 dated Feb. 27, 2009; 6 pages.
USPTO Non-Final Rejection for U.S. Appl. No. 09/989,771 dated Apr. 30, 2009; 11 pages.
USPTO Notice of Allowance for U.S. Appl. No. 09/989,762 dated Mar. 25, 2009; 7 pages.
USPTO Notice of Allowance for U.S. Appl. No. 09/989,762 dated Oct. 24, 2008; 7 pages.
U.S. Appl. No. 09/989,815: "A Data Driven Method and System for Monitoring Hardware Resource Usage for Programming an Electric Device;" Bartz et al.; 36 pages.
USPTO Notice of Allowance for U.S. Appl. No. 09/989,762 dated Jun. 2, 2008; 6 pages.
USPTO Notice of Allowance for U.S. Appl. No. 09/989,762 dated Jan. 2, 2008; 6 pages.
USPTO Non-Final Rejection for U.S. Appl. No. 09/989,762 dated Jul. 23, 2007; 15 pages.
USPTO Final Rejection for U.S. Appl. No. 09/989,762 dated Jan. 26, 2007; 13 pages.
USPTO Non-Final Rejection for U.S. Appl. No. 09/989,762 dated Aug. 10, 2006; 18 pages.
USPTO Final Rejection for U.S. Appl. No. 09/989,762 dated Mar. 14, 2006; 19 pages.
USPTO Non-Final Rejection for U.S. Appl. No. 09/989,762 dated Jul. 27, 2005; 15 pages.
U.S. Appl. No. 09/275,336: "Programmable Oscillator Scheme;" Mar et al.; 25 pages.
U.S. Appl. No. 09/721,316: "Programmable Oscillator Scheme;" Mar et al.; 26 pages.
U.S. Appl. No. 10/324,455: "Programmable Oscillator Scheme;" Mar et al.; 23 pages.
U.S. Appl. No. 09/998,859: "A System and a Method for Checking Lock Step Consistency between in Circuit Emulation and a Microcontroller while Debugging Process is in Progress:" Nemecek; 33 pages.
U.S. Appl. No. 09/998,834: "A System and a Method for Communication between and Ice and a Production Microcontroller while in a Halt State;" Nemecek; 33 pages.
U.S. Appl. No. 10/113,065: "System and Method for Automatically Matching Components in a Debugging System;" Nemecek et al.; 32 pages.
U.S. Appl. No. 09/989,574: "Method and System for using a Graphics user Interface for Programming an Electronic Device;" Bartz et al.; 43 pages.
U.S. Appl. No. 09/989,816: "Datasheet Browsing and Creation with Data-Driven Datasheet Tabs within a Microcontroller Design Tool;" Bartz et al.; 55 pages.
"New Object Domain R3 Beta Now Available (Build 134)!" Mar. 13, 2001; <http://web.archive.org/web/200100331202605/www.objectdomain.com/domain30/index.html>; 2 pages.
"OMG XML Metadata Interchange (XMI) Specifications" 2000; 17 pages.
Electronic Tools Company; E-Studio User Manuel; 2000; retrieved from http://web.archive.org for site http://e-tools.com on Mar. 23, 2005; 77 pages.
Cover Pages Technology Reports; XML and Electronic Design Automation (EDA); Aug. 2000; retrieved from http://xml.coverpages.org on Mar. 23, 2005; 5 pages.
Microsoft Computer Dictionary "ActiveX" 2002; Microsoft Press; 5th Edition; 3 pages.
Wikipedia "XML" retrieved on Jan. 29, 2007 from http://en.wikipedia.org/wiki/XML; 16 pages.
"VHDL Samples" retrieved on Jan. 29, 2007 from http://www.csee.umbc.edu/help/VHDL/samples/samples.shtml; 10 pages.
Anonymous, "Lotus Notes FAQ—How do you generate unique document numbers?" Sep. 19, 1999; retrieved from www.keysolutions.com on Jul. 9, 2008; 1 page.
Ashok Bindra, "Programmable SoC Delivers A New Level of System Flexibility"; Electronic Design; Nov. 6, 2000; 11 pages.

Cypress MicroSystem, Inc. "Cypress Customer Forums" retrieved from <http://www.cypress.com/forums/messageview>; Nov. 30, 2004; 1 page.
Cypress MicroSystem, Inc. "PsoC Designer: Integrated Development Environment User Guide"; Rev. 1.18; Sep. 8, 2003; 193 pages.
Hamblen, "Rapid Prototyping Using Field-Programmable Logic Devices" Jun. 2000, IEEE; 9 pages.
USPTO Final Rejection for U.S. Appl. No. 09/943,062 dated Apr. 30, 2004; 9 pages.
Snyder et al., "Xilinx's A-to-Z Systems Platform" Cahners Microprocessor, The Insider's Guide to Microprocessor Hardware, Feb. 6, 2001; 6 pages.
"PSoC Technology Completely Changes 8-bit MCU System Design" Cypress MicroSystem, Inc. Feb. 19, 2001; 21 pages.
USPTO Non-Final Rejection for U.S. Appl. No. 09/943,062 dated Dec. 8, 2003; 9 pages.
USPTO Advisory Action for U.S. Appl. No. 09/943,062 dated Sep. 25, 2003; 3 pages.
USPTO Final Rejection for U.S. Appl. No. 09/943,062 dated Jun. 27, 2003; 8 pages.
USPTO Non-Final Rejection for U.S. Appl. No. 09/943,062 dated Jan. 27, 2003; 7 pages.
USPTO Non-Final Rejection for U.S. Appl. No. 09/943,062 dated Sep. 11, 2002; 9 pages.
"PSoC Designer: Integrated Development Enviroment" User Guide; Revision 1.11; Last Revised Jul. 17, 2001; 109 pages.
Cypress Microsystems, "Cypress Microsystems Unveils Programmable System-on-a-Chip for Embedded Internet, Communications and Consumer Systems;" 2000, <http://www.cypressmicro.com/corporate/CY_Announces_nov_13_2000.html>; 3 pages.
Huang et al., ICEBERG, An Embedded In-Circuit Emulator Synthesizer for Microcontrollers, Proceedings of the 36th Design Automation Conference 1999; 6 pages.
Yoo et al., "Fast Hardware-Software Co-verification by Optimistic Execution of Real Processor," Proceedings of Design, Automation and Test in Europe Conference and Exhibition 2000; 6 pages.
USPTO Advisory Action for U.S. Appl. No. 09/943,062 dated Mar. 27, 2008; 3 pages.
USPTO Final Rejection for U.S. Appl. No. 09/943,062 dated Jan. 18, 2008; 8 pages.
USPTO Non-Final Rejection for U.S. Appl. No. 09/943,062 dated Jun. 22, 2007; 12 pages.
USPTO Miscellaneous Action for U.S. Appl. No. 09/943,062 dated Jan. 30, 2006; 2 pages.
USPTO Notice of Allowance for U.S. Appl. No. 10/113,064 dated Sep. 21, 2006; 7 pages.
USPTO Non-Final Rejection for U.S. Appl. No. 10/113,064 dated Apr. 6, 2006; 19 pages.
USPTO Final Rejection for U.S. Appl. No. 10/113,064 dated Oct. 18, 2005; 22 pages.
USPTO Non-Final Rejection for U.S. Appl. No. 10/113,064 dated Apr. 25, 2005; 15 pages.
U.S. Appl. No. 10/113,064: "Method and System for Debugging through Supervisory Operating Codes and Self Modifying Codes," Roe et al.; 36 pages.
U.S. Appl. No. 10/002,726: "Method and Apparatus for Generating Microcontroller Configuration Information," Ogami et al., filed on Oct. 24, 2001; 54 pages.
USPTO Notice of Allowance for U.S. Appl. No. 10/002,726 dated Feb. 6, 2007; 7 pages.
USPTO Non-Final Rejection for U.S. Appl. No. 10/002,726 dated Aug. 28, 2006; 10 pages.
USPTO Final Rejection for U.S. Appl. No. 10/002,726 dated Mar. 27, 2006; 8 pages.
USPTO Final Rejection for U.S. Appl. No. 10/002,726 dated Nov. 30, 2005; 10 pages.
USPTO Non-Final Rejection for U.S. Appl. No. 10/002,726 dated Jun. 10, 2005; 10 pages.
USPTO Non-Final Rejection for U.S. Appl. No. 10/002,726 dated Dec. 13, 2004; 7 pages.
U.S. Appl. No. 11/818,005: "Techniques for Generating Microcontroller Configuration Information," Ogami et al., filed on Jun. 12, 2007; 61 pages.

USPTO Requirement for Restriction/Election for U.S. Appl. No. 11/818,005 dated Jul. 14, 2009; 5 pages.
U.S. Appl. No. 11/322,044, filed Dec. 28, 2005, Stiff, Jonathon.
U.S. Appl. No. 11/850,260: "Circuit and Method for Improving the Accuracy of a Crystal-less Oscillator Having Dual-Frequency Modes;" Wright et al.; 33 pages.
USPTO Non-Final Rejection for U.S. Appl. No. 11/850,260 dated Mar. 6, 2009; 7 pages.
USPTO Non-Final Rejection for U.S. Appl. No. 11/644,100 dated Mar. 9, 2009; 11 pages.
USPTO Advisory Action for U.S. Appl. No. 11/644,100 dated Feb. 9, 2009; 3 pages.
USPTO Final Rejection for U.S. Appl. No. 11/644,100 dated Nov. 18, 2008; 12 pages.
USPTO Non-Final Rejection for U.S. Appl. No. 11/644,100 dated Apr. 14, 2008; 10 pages.
USPTO Notice of Allowance for U.S. Appl. No. 11/415,588 dated Mar. 11, 2008; 6 pages.
USPTO Advisory Action for U.S. Appl. No. 11/415,588 dated Jan. 14, 2008; 3 pages.
USPTO Final Rejection for U.S. Appl. No. 11/415,588 dated Oct. 19, 2007; 8 pages.
USPTO Non-Final Rejection for U.S. Appl. No. 11/415,588 dated Jun. 13, 2007; 8 pages.
USPTO Notice of Allowance for U.S. Appl. No. 12/218,404 dated Mar. 19, 2009; 7 pages.
USPTO Non-Final Rejection for U.S. Appl. No. 12/218,404 dated Sep. 30, 2008; 8 pages.
U.S. Appl. No. 11/644,100: "Differential-to-single ended signal converter circuit and method," Stiff; 33 pages.
U.S. Appl. No. 11/415,588: "Voltage Controlled Oscillator Delay Cell and Method," Sivadasan; 24 pages.
U.S. Appl. No. 12/218,404: "Voltage Controlled Oscillator Delay Cell and Method," Sivadasan; 23 pages.
USPTO Notice of Allowance for U.S. Appl. No. 11/132,894 dated Apr. 26, 2007; 4 pages.
USPTO Non-Final Rejection for U.S. Appl. No. 11/132,894 dated Dec. 19, 2006; 12 pages.
U.S. Appl. No. 11/132,894: "Open Loop Bandwidth Test Architecture and Method for Phase Locked Loop (PLL)," Stiff; 38 pages.
USPTO Non-Final Rejection for U.S. Appl. No. 11/322,044 dated May 4, 2009; 18 pages.
USPTO Non-Final Rejection for U.S. Appl. No. 11/322,044 dated Nov. 25, 2008; 15 pages.
USPTO Non-Final Rejection for U.S. Appl. No. 11/322,044 dated Apr. 11, 2008; 11 pages.
USPTO Advisory Action for U.S. Appl. No. 11/322,044 dated Nov. 30, 2007; 2 pages.
USPTO Final Rejection for U.S. Appl. No. 11/322,044 dated Sep. 21, 2007; 14 pages.
USPTO Non-Final Rejection for U.S. Appl. No. 11/322,044 dated Apr. 24, 2007; 13 pages.
U.S. Appl. No. 11/322,044: "Split charge pump PLL architecture," Stiff; 19 pages.
USPTO Notice of Allowance for U.S. Appl. No. 10/305,589 dated Feb. 4, 2005; 5 pages.
USPTO Final Rejection for U.S. Appl. No. 10/305,589 dated Oct. 21, 2004; 7 pages.
USPTO Non-Final Rejection for U.S. Appl. No. 10/305,589 dated Oct. 7, 2003; 6 pages.
U.S. Appl. No. 10/305,589: "Current Controlled Delay Circuit," Stiff; 18 pages.
U.S. Appl. No. 09/849,164: "Reduced Static Phase Error CMOS PLL Charge Pump," Stiff; 30 pages.
Maneatis, "Low-Jitter Process-Independent DLL and PLL Based on Self-Biased Techniques," IEEE Journal of Solid-State Circuits, vol. 31, No. 11, Nov. 1996; 10 pages.
Larsson, "A 2-1600-MHz CMOS Clock Recovery PLL with Low-V dd Capability," IEEE Journal of Solid-State Circuits, vol. 34, No. 12, Dec. 1999; 10 pages.
USPTO Notice of Allowance for U.S. Appl. No. 10/327,217 dated Aug. 12, 2004; 6 pages.

USPTO Non-Final Rejection for U.S. Appl. No. 10/327,217 dated Apr. 30, 2004; 5 pages.
USPTO Miscellaneous Action for U.S. Appl. No. 10/327,217 dated Feb. 10, 2004; 1 page.
U.S. Appl. No. 10/327,217: "Single Ended Clock Signal Generator Having a Differential Output," Richmond et al.; 27 pages.
USPTO Notice of Allowance for U.S. Appl. No. 10/871,582 dated Mar. 30, 2006; 6 pages.
USPTO Final Rejection for U.S. Appl. No. 10/871,582 dated Feb. 1, 2006; 5 pages.
USPTO Non-Final Rejection for U.S. Appl. No. 10/871,582 dated Sep. 7, 2005; 7 pages.
U.S. Appl. No. 10/871,582: "LVDS input Circuit with Extended Common Mode Range," Reinschmidt et al.; 25 pages.
USPTO Non-Final Rejection for U.S. Appl. No. 09/404,891 dated Mar. 4, 2005; 6 pages.
USPTO Final Rejection for U.S. Appl. No. 09/404,891 dated Dec. 8, 2004; 7 pages.
USPTO Non-Final Rejection for U.S. Appl. No. 09/404,891 dated Jun. 25, 2004; 6 pages.
USPTO Non-Final Rejection for U.S. Appl. No. 09/404,891 dated Jan. 5, 2004; 5 pages.
USPTO Non-Final Rejection for U.S. Appl. No. 09/404,891 dated Jul. 10, 2003; 6 pages.
USPTO Non-Final Rejection for U.S. Appl. No. 09/404,891 dated Mar. 5, 2003; 6 pages.
USPTO Non-Final Rejection for U.S. Appl. No. 09/404,891 dated Oct. 11, 2002; 5 pages.
U.S. Appl. No. 09/404,891: "Method, Architecture and Circuitry for Controlling Pulse Width in a Phase and/or Frequency Detector," Scott et al.; 17 pages.
USPTO Notice of Allowance for U.S. Appl. No. 10/226,911 dated Aug. 20, 2004; 4 pages.
USPTO Non-Final Rejection for U.S. Appl. No. 10/226,911 dated Mar. 19, 2004; 6 pages.
U.S. Appl. No. 10/226,911: "Calibration of Integrated Circuit Time Constants," Gehring et al.; 32 pages.
USPTO Notice of Allowance for U.S. Appl. No. 09/943,149 dated Jan. 12, 2004; 7 pages.
USPTO Non-Final Rejection for U.S. Appl. No. 09/943,149 dated Aug. 28, 2003; 9 pages.
USPTO Final Rejection for U.S. Appl. No. 09/943,149 dated May 7, 2003; 10 pages.
USPTO Non-Final Rejection for U.S. Appl. No. 09/943,149 dated Nov. 20, 2002; 7 pages.
U.S. Appl. No. 09/943,149: "Method for Phase Locking in a Phase Lock Loop," Moyal et al.; 21 pages.
Durham at al., "Integrated Continuous-Time Balanced Filters for 16-bit DSP Interfaces," IEEE, 1993; 6 pages.
Durham at al., "Circuit Architectures for High Linearity Monolithic Continuous-Time Filtering," IEEE, 1992; 7 pages.
Durham et al., "High-Linearity Conitnuous-Time Filter in 5-V VLSI CMOS," IEEE, 1992; 8 pages.
U.S. Appl. No. 09/047,595: "Roving Range Control to Limit Receive PLL Frequency of Operation," Scott; 35 pages.
U.S. Appl. No. 09/216,460: "Circuit and Method for Controlling an Output of a Ring Oscillator," Abugharbieh et al.; 21 pages.
U.S. Appl. No. 09/471,914: "Reference-Free Clock Generator and Data Recovery PLL," Dalmia et al.; 32 pages.
U.S. Appl. No. 09/471,576 : "Reference-Free Clock Generation and Data Recovery PLL," Dalmia; 30 pages.
U.S. Appl. No. 10/083,442:"Method/Architecture for a Low Gain PLL with Wide Frequency Range," Meyers et al.; 28 pages.
U.S. Appl. No. 09/470,665: "Digital Phase/Frequency Detector, and Clock Generator and Data Recovery PLL Containing the Same," Dalmia; 26 pages.
U.S. Appl. No. 09/893,161: "Architecture of a PLL with Dynamic Frequency Control on a PLD," Moore; 32 pages.
U.S. Appl. No. 09/608,753: "PLL Lockout Watchdog," Wilson et al.; 24 pages.
U.S. Appl. No. 09/398,956: "Frequency Acquisition Rate Control in Phase Lock Loop Circuits," Moyal et al.; 35 pages.

U.S. Appl. No. 09/747,262: "Linearized Digital Phase-Locked Loop," Williams et al.; 9 pages.
U.S. Appl. No. 09/981,448: "Oscillator Tuning Method," Hauck; 28 pages.
U.S. Appl. No. 09/538,989: "Memory Based Phase Locked Loop," Krishnan; 27 pages.
U.S. Appl. No. 09/048,905: "Programmable Clock Generator," Mann et al.; 42 pages.
U.S. Appl. No. 08/865,342: "Programmable Clock Generator," Mann et al.; 41 pages.
USPTO Notice of Allowance for U.S. Appl. No. 10/293,392 dated Mar. 10, 2004; 6 pages.
USPTO Non-Final Rejection for U.S. Appl. No. 10/293,392 dated Oct. 16, 2003; 6 pages.
U.S. Appl. No. 10/293,392: "Low Voltage Receiver Circuit and Method for Shifting the Differential Input Signals of the Receiver Depending on a Common Mode Voltage of the Input Signals," Maher et al.; 20 pages.
USPTO Notice of Allowance for U.S. Appl. No. 10/288,003 dated Jan. 14, 2005; 6 pages.
USPTO Final Rejection for U.S. Appl. No. 10/288,003 dated Oct. 6, 2004; 6 pages.
USPTO Non-Final Rejection for U.S. Appl. No. 10/288,003 dated Apr. 7, 2004; 9 pages.
U.S. Appl. No. 10/288,003: "Low Voltage Differential Signal Driver Circuit and Method," Roper et al.; 30 pages.
USPTO Notice of Allowance for U.S. Appl. No. 09/989,777 dated Jun. 9, 2009; 7 pages.
USPTO Advisory Action for U.S. Appl. No. 11/200,619 dated May 11, 2009; 3 pages.
USPTO Final Rejection for U.S. Appl. No. 11/200,619 dated Mar. 3, 2009; 14 pages.
USPTO Non-Final Rejection for U.S. Appl. No. 11/200,619 dated Aug. 27, 2008; 13 pages.
U.S. Appl. No. 11/200,619: "Providing hardware independence to automate code generation of processing device firmware," Snyder et al.; 41 pages.
USPTO Notice of Allowance for U.S. Appl. No. 11/201,922 dated Apr. 9, 2009; 4 pages.
USPTO Non-Final Rejection for U.S. Appl. No. 11/201,922 dated Oct. 21, 2008; 12 pages.
USPTO Final Rejection for U.S. Appl. No. 11/201,922 dated Apr. 30, 2008; 10 pages.
USPTO Non-Final Rejection for U.S. Appl. No. 11/201,922 dated Oct. 15, 2007; 10 pages.
U.S. Appl. No. 11/201,922: "Design model for a hardware device-independent method of defining embedded firmware for programmable systems," McDonald et al.; 31 pages.
USPTO Non-Final Rejection for U.S. Appl. No. 11/201,627 dated Dec. 12, 2008; 17 pages.
USPTO Final Rejection for U.S. Appl. No. 11/201,627 dated Apr. 29, 2008; 21 pages.
USPTO Non-Final Rejection for U.S. Appl. No. 11/201,627 dated Nov. 16, 2007; 16 pages.
U.S. Appl. No. 11/201,627: "Method and an apparatus to design a processing system using a graphical user interface," Ogami et al.; 37 pages.
USPTO Notice of Allowance for U.S. Appl. No. 09/989,808 dated Feb. 13, 2006; 4 pages.
USPTO Non-Final Rejection for U.S. Appl. No. 09/989,808 dated Oct. 19, 2005; 8 pages.
USPTO Non-Final Rejection for U.S. Appl. No. 09/989,808 dated Apr. 14, 2005; 8 pages.
U.S. Appl. No. 09/989,808: "Automatic generation of application program interfaces, source code, interrupts, and data sheets for microcontroller programming," Bartz et al.; 67 pages.
USPTO Notice of Allowance for U.S. Appl. No. 10/109,979 dated Mar. 14, 2006; 6 pages.
USPTO Non-Final Rejection for U.S. Appl. No. 10/109,979 dated Jun. 30, 2005; 6 pages.
U.S. Appl. No. 10/109,979: "Graphical user interface with logic unifying functions," Anderson at al.; 100 pages.

U.S. Appl. No. 09/979,781: "System and method for decoupling and iterating resources associated with a module," Ogami et al.; 40 pages.
U.S. Appl. No. 09/989,775: "User defined names for registers in memory banks derived from configurations," Ogami et al.; 29 pages.
USPTO Notice of Allowance for U.S. Appl. No. 09/989,819 dated Jan. 11, 2005; 7 pages.
USPTO Non-Final Rejection for U.S. Appl. No. 09/989,819 dated Jul. 13, 2004; 4 pages.
USPTO Miscellaneous Action for U.S. Appl. No. 09/989,819 dated Dec. 14, 2001; 1 page.
U.S. Appl. No. 09/989,819: "System and method for creating a boot file utilizing a boot template," Ogami et al.; 43 pages.
USPTO Notice of Allowance for U.S. Appl. No. 09/989,761 dated Jan. 14, 2005; 6 pages.
USPTO Final Rejection for U.S. Appl. No. 09/989,761 dated Aug. 26, 2004; 7 pages.
USPTO Non-Final Rejection for U.S. Appl. No. 09/989,761 dated Mar. 10, 2004; 6 pages.
USPTO Final Rejection for U.S. Appl. No. 09/989,761 dated Oct. 3, 2003; 7 pages.
USPTO Non-Final Rejection for U.S. Appl. No. 09/989,761 dated Apr. 18, 2003; 5 pages.
U.S. Appl. No. 09/989,761: "Storing of global parameter defaults and using them over two or more design projects," Ogami et al.; 37 pages.
Wang, et al. "Synthesizing Operating System Based Device Drivers in Embedded Systems," 2003, ACM; 8 pages.
Lutovac et al. "Symbolic Computation of Digital Filter Transfer Function Using MATLAB," Proceedings of 23rd International Conference on Microelectronics (MIEL 2002), vol. 2 NIS, Yugoslavia; 4 pages.
Nouta et al. "Design and FPGA-Implementation of Wave Digital Bandpass Filters with Arbitrary Amplitude Transfer Characteristics," Proceedings of IEEE International Symposium on Industrial Electronics; 1998, vol. 2; 5 pages.
Xilinx, Virtex-II Pro Platform FPGA Developer's Kit, "How Data2BRAM Fits in with Hardware and Software Flows," Chapter 2: Using Data2BRAM; Jan. 2003 Release; 2 pages.
PCT Preliminary Report on Patentability (Chapter 1 of the Patent Cooperation Treaty), PCT/US2005/028793, filed Aug. 12, 2005, mailed Dec. 21, 2007; 2 pages.
PCT Written Opinion of the International Searching Authority for PCT/US2005/028793, filed Aug. 12, 2005, mailed Nov. 19, 2007; 7 pages.
PCT International Search Report of the International Searching Authority for PCT/US05/28793, filed Aug. 12, 2005, mailed Nov. 19, 2007; 5 pages.
International Search Report and Written Opinion of the International Searching Authority for PCDUS05/28898, filed Aug. 12, 2005, mailed Mar. 6, 2007; 6 pages.
Burogs et al., "Power Converter Analysis and Design using Matlab: A Transfer Function Approach," Proceedings of IEEE International Symposium on Industrial Electronics 1998, vol. 2; 6 pages.
Efstathiou, "Analog Electronics: Basic Circuits of Operational Amplifiers," <http://web.archive.org/web/20021231045232> Dec. 31, 2002, version, retrieved from the Internet Archives; 10 pages.
PCT International Search Report for PCT/US05/28791, filed Aug. 12, 2005, mailed Mar. 31, 2008; 4 pages.
PCT International Written Opinion for PCT/US05/28791, filed Aug. 12, 2005, mailed Mar. 31, 2008; 8 pages.
Kory Hopkins, "Definition;" Jan. 16, 1997; <http://vvww.cs.sfu.ca/cs/people/GradStudent.html>; 1 page.
Ebeling et al., "Validating VLSI Circuit Layout by Wirelist Comparison;" Sep. 1983; in proceedings of the IEEE International Conference on Computer Aided Design (ICCAD-83); 2 pages.
"The Gemini Netlist Comparison Project;" <htp://www.cs.washington.edu/research/projects/lis/www/gemini/gemini.html> larry@cs.washington.edu; 2 pages.
Ohirich et al., "Sub-Gemini: Identifying Subcircuits using a Fast Subgraph Isomorphism Algorithm;" Jun. 1993; in proceedings of the 30th IEEE/ACM Design Automation Conference; 7 pages.
Ebling, "Gemini II: A Second Generation Layout Validation Program;" 1988; in proceedings of the IEEE International Conference on Computer Aided Design (ICCAD-88); 4 pages.

U.S. Appl. No. 12/132,527: "System and Method for Performing Next Placements and Pruning of Disallowed Placements for Programming an Integrated Circuit;" Ogami et al.; 44 pages.

U.S. Appl. No. 12/356,468: "System and Method for Dynamically Generating a Configuration Datasheet," Anderson et al.; filed on Jan. 20, 2009: 27 pages.

International Search Report from the International Search Authority for International Application No. PCT/US08/60680 dated Aug. 15, 2008; 4 pages.

USPTO Notice of Allowance for U.S. Appl. No. 09/475,879 dated Oct. 22, 2004; 7 pages.

USPTO Advisory Action for U.S. Appl. No. 09/475,879 dated Mar. 4, 2002; 3 pages.

USPTO Advisory Action for U.S. Appl. No. 09/475,879 dated Dec. 31, 2001; 3 pages.

USPTO Final Rejection for U.S. Appl. No. 09/475,879 dated Oct. 11, 2001; 10 pages.

USPTO Non-Final Rejection for U.S. Appl. No. 09/475,879 dated Mar. 8, 2001; 6 pages.

U.S. Appl. No. 09/475,879: "Programmable Logic Device," Lacey at al.; filed on Dec. 30, 1999; 50 pages.

U.S. Appl. No. 09/475,808; "Configurable Memory for Programmable Logic Circuits," Lacey at al.; 24 pages.

USPTO Non-Final Rejection for U.S. Appl. No. 09/475,808 dated Jun. 6, 2001; 8 pages.

USPTO Notice of Allowance for U.S. Appl. No. 09/475,808 dated Nov. 6, 2001; 8 pages.

U.S. Appl. No. 10/137,497: "Reconfigurable Testing System and Method," Pleis et al.; filed on May 1, 2002; 40 pages.

USPTO Non-Final Rejection for U.S. Appl. No. 10/137,497 dated Nov. 5, 2004; 17 pages.

USPTO Final Rejection for U.S. Appl. No. 10/137,497 dated May 5, 2005; 13 pages.

USPTO Non-Final Rejection for U.S. Appl. No. 10/137,497 dated Sep. 22, 2005; 21 pages.

USPTO Final Rejection for U.S. Appl. No. 10/137,497 dated Mar. 13, 2006; 15 pages.

USPTO Non-Final Rejection for U.S. Appl. No. 10/137,497 dated Aug. 2, 2006; 21 pages.

USPTO Notice of Allowance for U.S. Appl. No. 10/137,497 dated Jan. 24, 2007; 12 pages.

USPTO Notice of Allowance for U.S. Appl. No. 10/137,497 dated Jul. 20, 2007; 4 pages.

U.S. Appl. No. 10/653,050: "Method and System for Programming a Memory Device," Snyder at al.; filed on Aug. 29, 2003; 69 pages.

USPTO Non-Final Rejection for U.S. Appl. No. 10/653,050 dated Apr. 6, 2004; 7 pages.

USPTO Notice of Allowance for U.S. Appl. No. 10/653,050 dated Jul. 29, 2004; 3 pages.

U.S. Appl. No. 10/172,670: "Method and System for Programming a Memory Device," Snyder et al.; filed on Jun. 13, 2002; 66 pages.

U.S. Appl. No. 11/986,338: Reconfigurable Testing System and Method, Pleis et al., filed on Nov. 20, 2007; 41 pages.

USPTO Notice of Allowance for U.S. Appl. No. 11/965,291 dated May 5, 2009; 7 pages.

USPTO Non-Final Rejection for U.S. Appl. No. 11/965,291 dated Dec. 17, 2008; 8 pages.

U.S. Appl. No. 11/965,291 : "Universal Digital Block Interconnection and Channel Routing," Snyder et al., filed on Dec. 27, 2007; 31 pages.

USPTO Notice of Allowance for U.S. Appl. No. 11/986,338 dated May 7, 2009; 1 page.

U.S. Appl. No. 11/273,708: "Capacitance Sensor Using Relaxation Oscillators," Snyder of al.; 33 pages.

USPTO Non-Final Rejection for U.S. Appl. No. 11/273,708 dated Mar. 19, 2007; 16 pages.

USPTO Final Rejection for U.S. Appl. No. 11/273,708 dated Jul. 5, 2007; 8 pages.

USPTO Notice of Allowance for U.S. Appl. No. 11/273,708 dated Aug. 9, 2007; 4 pages.

U.S. Appl. No. 11/337,272: "Successive Approximate Capacitance Measurement Circuit;" Snyder; 29 pages.

USPTO Requirement for Restriction/Election for U.S. Appl. No. 11/337,272 dated Sep. 11, 2006; 5 pages.

USPTO Non-Final Rejection for U.S. Appl. No. 11/337,272 dated Oct. 24, 2006; 9 pages.

USPTO Final Rejection for U.S. Appl. No. 11/337,272 dated Feb. 2, 2007; 11 pages.

USPTO Advisory Action for U.S. Appl. No. 11/337,272 dated Apr. 3, 2007; 3 pages.

USPTO Non-Final Rejection for U.S. Appl. No. 11/337,272 dated May 17, 2007; 11 pages.

USPTO Notice of Allowance for U.S. Appl. No. 11/337,272 dated Aug. 15, 2007; 9 pages.

U.S. Appl. No. 11/983,291: "Successive Approximate Capacitance Measurement Circuit," Snyder; 26 pages.

USPTO Non-Final Rejection for U.S. Appl. No. 11/983,291 dated Mar. 9, 2009; 9 pages.

U.S. Appl. No. 11/698,660: "Configurable Bus," Kutz et al.; 35 pages.

USPTO Non-Final Rejection for U.S. Appl. No. 11/698,660 dated Dec. 2, 2008; 12 pages.

USPTO Final Rejection for U.S. Appl. No. 11/698,660 dated May 28, 2009; 12 pages.

U.S. Appl. No. 11/709,866: "Input/Output Multiplexer Bus," Dennis Sequine; 33 pages.

USPTO Non-Final Rejection for U.S. Appl. No. 11/709,866 dated Nov. 7, 2008; 14 pages.

USPTO Notice of Allowance for U.S. Appl. No. 11/709,866 dated Apr. 7, 2009; 8 pages.

Sedra et al., "Microelectronic Circuits," 3rd Edition, Oxford University Press; 20 pages.

Van Ess David; "Simulating a 555 Timer with PSoC," Cypress Semiconductor Corporation, Application Note AN2286, May 19, 2005; 10 pages.

Cypress Semiconductor Corporation, "FAN Controller CG6457AM and CG6462AM," PSoC Mixed Signal Array Preliminary Data Sheet; May 24, 2005; 25 pages.

Cypress Semiconductor Corporation, "PSoC Mixed-Signal Controllers," Production Description; <http://www.cypress.com/portal/server>; retrieved on Sep. 27, 2005; 2 pages.

Cypress Semiconductor Corporation, "CY8C21x43 Data Sheet," CSR User Module, CSR V.1.0; Oct. 6, 2005; 36 pages.

Chapweske, Adam; "The PS/2 Mouse Interface," PS/2 Mouse Interfacing, 2001; 11 pages.

Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.

Seguine, Ryan; "Layout Guidelines for PSoC CapSense," Cypress Semiconductor Corporation, Application Note AN2292; Jul. 22, 2005; 13 pages.

Lee, Mark; "EMC Design Considerations for PSoC CapSense Applications," Cypress Semiconductor Corporation, Application Note AN2318; Sep. 16, 2005; 6 pages.

Cypress Semiconductor Corporation, "Release Notes srn017," Jan. 24, 2007; 3 pages.

Cypress Semiconductor Corporation, "PSoC CY8C20x34 Technical Reference Manual (TRM)," PSoC CY8C20x34 TRM, Version 1.0, 2006; 220 pages.

U.S. Appl. No. 11/166,622: "Touch wake for electronic devices," Beard et al.; 22 pages.

International Written Opinion of the International Searching Authority for International Application No. PCT/US2006/09572 dated Jan. 10, 2008; 5 pages.

International Search Report for International Application No. PCT/US2006/09572 dated Jan. 10, 2008; 2 pages.

USPTO Notice of Allowance for U.S. Appl. No. 10/024,093 dated Sep. 10, 2002; 7 pages.

U.S. Appl. No. 10/024,093: "Configurable Memory for Programmable Logic Circuits," Lacey et al.; 25 pages.

U.S. Appl. No. 11/088,028: "Method and Circuit for Rapid Alignment of Signals," Moyal et al., filed on Nov. 13, 2007; 34 pages.

USPT Notice of Allowance for U.S. Appl. No. 11/088,028 dated Jul. 2, 2007; 6 pages.

USPT Notice of Allowance for U.S. Appl. No. 11/088,028 dated Jan. 26, 2007; 6 pages.
USPT Non-Final Rejection for U.S. Appl. No. 11/088,028 dated Jun. 16, 2006; 8 pages.
USPTO Non-Final Rejection for U.S. Appl. No. 11/865,672 dated Jul. 17, 2009; 6 pages.
USPTO Non-Final Rejection for U.S. Appl. No. 11/859,547 dated Oct. 1, 2009; 9 pages.
USPTO Non-Final Rejection for U.S. Appl. No. 11/967,243 dated Sep. 17, 2009; 9 pages.
USPTO Non-Final Rejection for U.S. Appl. No. 11/967,240 dated Jun. 10, 2009; 7 pages.
USPTO Non-Final Rejection for U.S. Appl. No. 11/857,947 dated Mar. 30, 2009; 18 pages.
USPTO Non-Final Rejection for U.S. Appl. No. 12/104,672 dated Aug. 26, 2009; 11 pages.
USPTO Non-Final Rejection for U.S. Appl. No. 12/060,128 dated Apr. 29, 2009; 11 pages.
International Search Report of the International Searching Authority for International Application No. PCT/US08/60695 dated Jul. 22, 2009; 3 pages.
Written Opinion of the International Searching Authority for International Application No. PCT/US08/60695 dated Jul. 22, 2009; 6 pages.
Azim et al., "A Custom DSP Chip to Implement a Robot Motion Controller Proceedings of the IEEE Custom Integrated Circuits Conference," May 1988, pp. 8.7.1-8.7.5; 6 pages.
Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.
International Search Report of the International Searching Authority for International Application No. PCT/US08/60696 dated Sep. 22, 2008; 2 pages.
International Search Report of the International Searching Authority for International Application No. PCT/US08/60698 dated Sep. 5, 2008; 2 pages.
Shahbahrami et al., "Matrix Register File and Extended Subwords: Two Techniques for Embedded Media Processors," ACM, May 2005; 9 pages.
Jung et at., "A Register File with Transposed Access Mode," 2000, IEEE; 2 pages.
International Search Report of the International Searching Authority for International Application No. PCT/US08/60681 dated Sep. 12, 2008; 2 pages.
Written Opinion of the International Searching Authority for International U.S. Appl. No. PCT/US08/60681 dated Sep. 12, 2008; 4 pages.
USPTO Notice of Allowance for U.S. Appl. No. 11/965,677 dated Sep. 10, 2009; 6 pages.
USPTO Non-Final Rejection for U.S. Appl. No. 11/965,677 dated Mar. 10, 2009; 10 pages.
Written Opinion of the International Searching Authority for International Application No. PCT/US08/60696 dated Sep. 22, 2008; 4 pages.
USPTO Notice of Allowance for U.S. Appl. No. 10/238,966 dated Aug. 5, 2009; 5 pages.
USPTO Notice of Allowance for U.S. Appl. No. 10/033,027 dated Sep. 2, 2009; 4 pages.
USPTO Non-Final Rejection for U.S. Appl. No. 10/001,478 dated Aug. 4, 2009; 17 pages.
USPTO Advisory Action for U.S. Appl. No. 10/001,478 dated Jun. 30, 2009; 3 pages.
USPTO Notice of Allowance for U.S. Appl. No. 10/002,217 dated Sep. 17, 2009; 6 pages.
USPTO Notice of Allowance for U.S. Appl. No. 10/002,217 dated Jun. 8, 2009; 8 pages.
USPTO Notice of Allowance for U.S. Appl. No. 10/001,477 dated Dec. 4, 2009; 7 pages.
USPTO Notice of Allowance for U.S. Appl. No. 10/001,477 dated Aug. 26, 2009; 6 pages.
USPTO Ex Parte Quayle Action for U.S. Appl. No. 09/975,115 dated Aug. 20, 2009; 7 pages.
USPTO Non-Final Rejection for U.S. Appl. No. 09/994,601 dated Jul. 9, 2009; 11 pages.
USPTO Non-Final Rejection for U.S. Appl. No. 11/818,005 dated Nov. 23, 2009; 8 pages.
USPTO Advisory Action for U.S. Appl. No. 09/989,778 dated Jun. 17, 2009; 3 pages.
USPTO Notice of Allowance for U.S. Appl. No. 09/994,600 dated Aug. 25, 2009; 4 pages.
USPTO Notice of Allowance for U.S. Appl. No. 09/989,762 dated Oct. 30, 2009; 6 pages.
USPTO Notice of Allowance for U.S. Appl. No. 09/989,762 dated Jul. 16, 2009; 6 pages.
USPTO Non-Final Rejection for U.S. Appl. No. 09/998,848 dated May 12, 2009; 16 pages.
USPTO Non-Final Rejection for U.S. Appl. No. 09/989,767 dated May 12, 2009; 21 pages.
USPTO Final Rejection for U.S. Appl. No. 09/989,771 dated Nov. 25, 2009; 12 pages.
USPTO Notice of Allowance for U.S. Appl. No. 09/989,765 dated Sep. 3, 2009; 7 pages.
USPTO Non-Final Rejection for U.S. Appl. No. 09/989,782 dated Oct. 27, 2009; 9 pages.
USPTO Final Rejection for U.S. Appl. No. 09/989,782 dated May 15, 2009; 10 pages.
USPTO Notice of Allowance for U.S. Appl. No. 11/986,338 dated Oct. 19, 2009; 4 pages.
USPTO Notice of Allowance for U.S. Appl. No. 09/989,777 dated Aug. 6, 2009; 8 pages.
USPTO Notice of Allowance for U.S. Appl. No. 10/008,096 dated Oct. 21, 2009; 6 pages.
USPTO Notice of Allowance for U.S. Appl. No. 10/008,096 dated Jun. 5, 2009; 12 pages.
USPTO Notice of Allowance for U.S. Appl. No. 11/985,340 dated Nov. 9, 2009; 7 pages.
USPTO Advisory Action for U.S. Appl. No. 11/201,627 dated Sep. 21, 2009; 3 pages.
USPTO Final Rejection for U.S. Appl. No. 11/201,627 dated Jul. 7, 2009; 19 pages.
USPTO Miscellaneous Action for U.S. Appl. No. 11/201,922 dated Oct. 1, 2009; 2 pages.
USPTO Non-Final Rejection for U.S. Appl. No. 11/200,619 dated Jun. 17, 2009; 12 pages.
USPTO Non-Final Rejection for U.S. Appl. No. 11/166,622 dated Sep. 29, 2009; 11 pages.
USPTO Advisory Action for U.S. Appl. No. 11/166,622 dated May 27, 2009; 3 pages.
USPTO Final Rejection for U.S. Appl. No. 11/166,622 dated Mar. 10, 2009; 11 pages.
USPTO Notice of Allowance for U.S. Appl. No. 12/218,404 dated Nov. 3, 2009; 8 pages.
USPTO Notice of Allowance for U.S. Appl. No. 12/218,404 dated Jul. 10, 2009; 7 pages.
USPTO Notice of Allowance for U.S. Appl. No. 11/709,866 dated Aug. 4, 2009; 7 pages.
USPTO Non-Final Rejection for U.S. Appl. No. 11/698,660 dated Oct. 7, 2009; 12 pages.
USPTO Advisory Action for U.S. Appl. No. 11/698,660 dated Jul. 31, 2009; 3 pages.
USPTO Notice of Allowance for U.S. Appl. No. 11/983,291 dated Oct. 22, 2009; 7 pages.
USPTO Final Rejection for U.S. Appl. No. 11/983,291 dated Aug. 12, 2009; 10 pages.
USPTO Final Rejection for U.S. Appl. No. 11/322,044 dated Oct. 19, 2009; 10 pages.
USPTO Final Rejection for U.S. Appl. No. 11/644,100 dated Aug. 19, 2009; 12 pages.
USPTO Advisory Action for U.S. Appl. No. 11/850,260 dated Nov. 2, 2009; 3 pages.
USPTO Final Rejection for U.S. Appl. No. 11/850,260 dated Aug. 21, 2009; 9 pages.
USPTO Final Rejection for U.S. Appl. No. 09/989,767 dated Dec. 7, 2009; 22 pages.

USPTO Final Rejection for U.S. Appl. No. 11/698,660 dated Feb. 16, 2010; 14 pages.
USPTO Notice of Allowance for U.S. Appl. No. 09/989,765 dated Dec. 22, 2009; 8 pages.
USPTO Notice of Allowance for U.S. Appl. No. 09/994,600 dated Jan. 4, 2010; 4 pages.
USPTO Notice of Allowance for U.S. Appl. No. 10/002,217 dated Jan. 11, 2010; 7 pages.
USPTO Notice of Allowance for U.S. Appl. No. 09/989,777 dated Jan. 15, 2010; 8 pages.
USPTO Notice of Allowance for U.S. Appl. No. 11/965,291 dated Jan. 13, 2010; 4 pages.
USPTO Notice of Allowance for U.S. Appl. No. 09/975,115 dated Jan. 29, 2010; 9 pages.
USPTO Notice of Allowance for U.S. Appl. No. 10/238,966 dated Feb. 1, 2010; 4 pages.
USPTO Final Rejection for U.S. Appl. No. 09/994,601 dated Jan. 5, 2010; 13 pages.
USPTO Non-Final Rejection for U.S. Appl. No. 09/998,848 dated Dec. 10, 2009; 16 pages.
USPTO Notice of Allowance for U.S. Appl. No. 10/008,096 dated Feb. 1, 2010; 6 pages.
USPTO Non-Final Rejection for U.S. Appl. No. 11/201,627 dated Dec. 24, 2009; 22 pages.
USPTO Final Rejection for U.S. Appl. No. 11/200,619 dated Jan. 4, 2010; 18 pages.
USPTO Non-Final Rejection for U.S. Appl. No. 11/644,100 dated Dec. 16, 2009; 13 pages.
USPTO Non-Final Rejection for U.S. Appl. No. 11/850,260 dated Jan. 14, 2010; 8 pages.
USPTO Notice of Allowance for U.S. Appl. No. 10/033,027 dated Feb. 18, 2010; 4 pages.
USPTO Notice of Allowance for U.S. Appl. No. 09/989,762 dated Feb. 22, 2010; 7 pages.
USPTO Notice of Allowance for U.S. Appl. No. 11/986,338 dated Feb. 16, 2010; 4 pages.
USPTO Non-Final Rejection for U.S. Appl. No. 12/136,557 dated Mar. 15, 2010; 10 pages.
USPTO Notice of Allowance for U.S. Appl. No. 11/965,677 dated Feb. 12, 2010; 4 pages.
USPTO Notice of Allowance for U.S. Appl. No. 12/218,404 dated Feb. 16, 2010; 7 pages.
USPTO Notice of Allowance for U.S. Appl. No. 11/709,866 dated Feb. 16, 2010: 7 pages.
USPTO Notice of Allowance for U.S. Appl. No. 10/001,477 dated Mar. 23, 2010; 6 pages.
USPTO Notice of Allowance for U.S. Appl. No. 09/989,765 dated Mar. 31, 2010; 8 pages.
USPTO Notice of Allowance for U.S. Appl. No. 12/104,672 dated Jan. 11, 2010; 7 pages.
USPTO Non-Final Rejection for U.S. Appl. No. 11/799,439 dated Nov. 2, 2007; 7 pages.
USPTO Non-Final Rejection for U.S. Appl. No. 11/799,439 dated May 29, 2008; 8 pages.
USPTO Final Rejection for U.S. Appl. No. 11/799,439 dated Dec. 18, 2008; 6 pages.
USPTO Notice of Allowance for U.S. Appl. No. 11/799,439 dated Jun. 25, 2009; 6 pages.
USPTO Notice of Allowance for U.S. Appl. No. 11/799,439 dated Feb. 5, 2010; 4 pages.
USPTO Non-Final Rejection for U.S. Appl. No. 10/113,581 dated Feb. 24, 2006; 11 pages.
USPTO Final Rejection for U.S. Appl. No. 10/113,581 dated Aug. 10, 2006; 13 pages.
USPTO Non-Final Rejection for U.S. Appl. No. 10/113,581 dated Jan. 10, 2007; 14 pages.
USPTO Final Rejection for U.S. Appl. No. 10/113,581 dated Jul. 13, 2007; 15 pages.
USPTO Non-Final Rejection for U.S. Appl. No. 10/113,581 dated Nov. 27, 2007; 15 pages.
USPTO Final Rejection for U.S. Appl. No. 10/113,581 dated Jun. 11, 2008; 14 pages.
USPTO Non-Final Rejection for U.S. Appl. No. 10/113,581 dated Nov. 26, 2008; 20 pages.
USPTO Final Rejection for U.S. Appl. No. 10/113,581 dated May 11, 2009; 21 pages.
USPTO Non-Final Rejection for U.S. Appl. No. 10/113,581 dated Sep. 1, 2009; 18 pages.
USPTO Notice of Allowance for U.S. Appl. No. 10/113,581 dated Mar. 5, 2010; 9 pages.
USPTO Non-Final Rejection for U.S. Appl. No. 10/113,581 dated Aug. 12, 2005; 12 pages.
USPTO Non-Final Rejection for U.S. Appl. No. 12/132,527 dated Apr. 29, 2010; 7 pages.
USPTO Final Rejection for U.S. Appl. No. 11/818,005 dated May 24, 2010; 8 pages.
USPTO Notice of Allowance for U.S. Appl. No. 09/943,062 dated Jun. 29, 2010; 4 pages.
USPTO Non-Final Rejection for U.S. Appl. No. 11/201,922 dated Jun. 11, 2010; 12 pages.
USPTO Non-Final Rejection for U.S. Appl. No. 12/070,547 dated Jun. 3, 2009; 6 pages.
USPTO Final Rejection for U.S. Appl. No. 12/070,547 dated Oct. 30, 2009; 5 pages.
USPTO Notice of Allowance for U.S. Appl. No. 12/070,547 dated Feb. 24, 2010; 4 pages.
USPTO Non-Final Rejection for U.S. Appl. No. 11/347,189 dated Jun. 8, 2007; 6 pages.
USPTO Notice of Allowance for U.S. Appl. No. 11/347,189 dated Sep. 27, 2007; 4 pages.
USPTO Notice of Allowance for U.S. Appl. No. 10/256,829 dated May 10, 2010; 4 pages.
USPTO Non-Final Rejection for U.S. Appl. No. 10/256,829 dated Oct. 26, 2009; 8 pages.
USPTO Final Rejection for U.S. Appl. No. 10/256,829 dated Jun. 23, 2009; 8 pages.
USPTO Non-Final Rejection for U.S. Appl. No. 10/256,829 dated Jan. 7, 2009; 7 pages.
USPTO Non-Final Rejection for U.S. Appl. No. 10/256,829 dated Jun. 26, 2008; 11 pages.
USPTO Notice of Allowance for U.S. Appl. No. 10/256,829 dated Oct. 29, 2007; 6 pages.
USPTO Final Rejection for U.S. Appl. No. 10/256,829 dated Jun. 1, 2007; 16 pages.
USPTO Non-Final Rejection for U.S. Appl. No. 10/256,829 dated Nov. 2, 2006; 13 pages.
USPTO Non-Final Rejection for U.S. Appl. No. 10/256,829 dated May 3, 2006; 16 pages.
USPTO Final Rejection for U.S. Appl. No. 10/256,829 dated Jan. 27, 2006; 24 pages.
USPTO Non-Final Rejection for U.S. Appl. No. 10/256,829 dated Jul. 28, 2005; 14 pages.
USPTO Notice of Allowance for U.S. Appl. No. 09/989,817 dated May 9, 2005; 6 pages.
USPTO Non-Final Rejection for U.S. Appl. No. 09/989,817 dated Jan. 12, 2005; 5 pages.
USPTO Non-Final Rejection for U.S. Appl. No. 09/989,817 dated Jun. 8, 2004; 7 pages.
USPTO Notice of Allowance for U.S. Appl. No. 10/327,207 dated Jun. 11, 2007; 4 pages.
USPTO Notice of Allowance for U.S. Appl. No. 10/327,207 dated Dec. 26, 2006; 5 pages.
USPTO Non-Final Rejection for U.S. Appl. No. 10/327,207 dated Jul. 21, 2006; 12 pages.
USPTO Final Rejection for U.S. Appl. No. 10/327,207 dated Mar. 2, 2006; 13 pages.
USPTO Non-Final Rejection for U.S. Appl. No. 10/327,207 dated Sep. 20, 2005; 11 pages.
USPTO Miscellaneous Action for U.S. Appl. No. 10/327,207 dated May 13, 2003; 1 page.
USPTO Notice of Allowance for U.S. Appl. No. 09/989,570 dated May 19, 2005; 4 pages.
USPTO Non-Final Rejection for U.S. Appl. No. 09/989,570 dated Jan. 26, 2005; 9 pages.

USPTO Notice of Allowance for U.S. Appl. No. 09/989,570 dated Sep. 10, 2004; 8 pages.
USPTO Non-Final Rejection for U.S. Appl. No. 09/989,570 dated Mar. 25, 2004; 8 pages.
USPTO Non-Final Rejection for U.S. Appl. No. 09/989,570 dated Oct. 7, 2003; 6 pages.
USPTO Advisory Action for U.S. Appl. No. 09/989,570 dated Aug. 14, 2003; 3 pages.
USPTO Final Rejection for U.S. Appl. No. 09/989,570 dated May 30, 2003; 9 pages.
USPTO Non-Final Rejection for U.S. Appl. No. 09/989,570 dated Jan. 2, 2003; 7 pages.
USPTO Notice of Allowance for U.S. Appl. No. 09/989,571 dated Sep. 13, 2005; 6 pages.
USPTO Non-Final Rejection for U.S. Appl. No. 09/989,571 dated May 23, 2005; 8 pages.
USPTO Final Rejection for U.S. Appl. No. 09/989,571 dated Jan. 26, 2005; 11 pages.
USPTO Non-Final Rejection for U.S. Appl. No. 09/989,571 dated Jul. 12, 2004; 9 pages.
M. Moons Mano, "Computer System Architecture," 1982, Prentice-Hall, 2nd Edition, pp. 261-264 and 435-440; 14 pages.
Dirk Killat, "A One-Chip Solution for Electronic Ballasts in Fluorescent Lamps," Power Electronics, <http://powerelectronics.com/mag/power_onechip_solution_electronic/>, dated Mar. 1, 2004, accessed Sep. 13, 2005; 4 pages.
Fred Eady, "PSoC 101," Circuit Cellar, Aug. 2004, accessed Sep. 13, 2005, <http://www.circuitcellar.com/library/print/0804/eady169/2.htm>; 4 pages.
U.S. Appl. No. 12/058,586: "System and Method for Monitoring a Target Device," Ogami et al., filed on Mar. 28, 2008; 41 pages.
U.S. Appl. No. 12/058,534: "System and Method for Controlling a Target Device," Ogami et al., filed on Mar. 28, 2008; 40 pages.
U.S. Appl. No. 12/004,833: "System and Method for Dynamically Reconfiguring a Programmable System on a Chip," Ogami et al., filed on Dec. 21, 2007; 40 pages.
U.S. Appl. No. 12/058,569: "Configuration of Programmable IC Design Elements," Best et al., filed on Mar. 28, 2008; 19 pages.
U.S. Appl. No. 12/057,149: "Power Management Architecture, Method and Configuration System," Kenneth Ogami, fild on Mar. 27, 2008; 34 pages.
U.S. Appl. No. 12/765,400: "Autonomous Control in a Programmable System," Sullam et al., filed on Apr. 22, 2010; 30 pages.
International Search Report for International Application No. PCT/US10/33626 mailed Jun. 24, 2010; 3 pages.
The Written Opinion of the International Search Report for International Application No. PCT/US10/33626 mailed Jun. 24, 2010; 5 pages.
USPTO Non-Final Rejection for U.S. Appl. No. 12/060,176 dated Mar. 30, 2010; 22 pages.
John Mangino, "Using DMA with High Performance Peripherals to Maximize System Performance," 2007, Texas Instruments, pp. 1-23; 23 pages.
Balough et al., "White Paper: Comparing IP Integration Approaches for FPGA Implementation," Feb. 2007, Version 1.1, Altera, pp. 1-7; 7 pages.
A.F. Harvey, "DMA Fundamentals on Various PC Platforms," 1991, 1994, National Instruments Corporation, pp. 1-19; 19 pages.
Vixel, "InSpeed SOC 320 Embedded Storage Switch," 2003, Vixel, pp. 1-5; 5 pages.
USPTO Miscellaneous Action for U.S. Appl. No. 10/113,581 dated Jun. 23, 2010; 6 pages.
USPTO Miscellaneous Action for U.S. Appl. No. 10/001,478 dated Feb. 23, 2010; 5 pages.
USPTO Notice of Allowance for U.S. Appl. No. 10/001,478 dated Jun. 2, 2010; 11 pages.
USPTO Notice of Allowance for U.S. Appl. No. 11/985,340 dated Jun. 9, 2010; 8 pages.
USPTO Notice of Allowance for U.S. Appl. No. 11/850,260 dated Jul. 2, 2010; 8 pages.
USPTO Notice of Allowance for U.S. Appl. No. 12/060,128 dated Oct. 19, 2009; 8 pages.
USPTO Miscellaneous Action for U.S. Appl. No. 09/975,338 dated Apr. 30, 2010; 2 pages.
USPTO Advisory Action for U.S. Appl. No. 11/818,005 dated Jul. 30, 2010; 3 pages.
USPTO Advisory Action for U.S. Appl. No. 11/201,627 dated Aug. 5, 2010; 3 pages.
USPTO Final Rejection for U.S. Appl. No. 11/201,627 dated May 24, 2010; 26 pages.
USPTO Non-Final Rejection for U.S. Appl. No. 11/166,622 dated Jun. 22, 2010; 11 pages.
USPTO Final Rejection for U.S. Appl. No. 11/166,622 dated Mar. 18, 2010; 12 pages.
USPTO Non-Final Rejection for U.S. Appl. No. 11/698,660 dated May 21, 2010; 15 pages.
USPTO Advisory Action for U.S. Appl. No. 11/644,100 dated Jul. 21, 2010; 3 pages.
USPTO Final Rejection for U.S. Appl. No. 11/644,100 dated May 19, 2010; 13 pages.
USPTO Final Rejection for U.S. Appl. No. 11/865,672 dated Dec. 30, 2009; 6 pages.
USPTO Final Rejection for U.S. Appl. No. 11/857,947 dated Oct. 14, 2009; 22 pages.
USPTO Non-Final Rejection for U.S. Appl. No. 11/857,947 dated Feb. 3, 2010; 23 pages.
USPTO Non-Final Rejection for U.S. Appl. No. 11/857,947 dated Jul. 21, 2010; 15 pages.
USPTO Non-Final Rejection for U.S. Appl. No. 12/058,569 dated Aug. 2, 2010; 9 pages.
USPTO Final Rejection for U.S. Appl. No. 11/968,145 dated Aug. 2, 2010; 6 pages.
USPTO Non-Final Rejection for U.S. Appl. No. 11/968,145 dated Mar. 4, 2010; 11 pages.
USPTO Non-Final Rejection for U.S. Appl. No. 12/104,678 dated Jul. 2, 2010; 8 pages.

* cited by examiner

US 7,893,724 B2

METHOD AND CIRCUIT FOR RAPID ALIGNMENT OF SIGNALS

CROSS REFERENCE TO RELATED APPLICATION

This application is a continuation of U.S. application Ser. No. 11/088,028, filed Mar. 22, 2005, which has matured into U.S. Pat. No. 7,295,049 issuing Nov. 13, 2007, the entire contents of which are hereby incorporated by reference herein.

FIELD OF THE INVENTION

This invention relates, in general, to electronic circuits, and in particular to circuits for aligning two signals.

BACKGROUND OF THE INVENTION

Phase alignment is a commonly used technique among designers. Digital phase alignment comprises aligning the edges (rising or falling) of two square wave signals with equal (or integer multiple) frequencies with an arbitrary phase offset. In this case, phase may be characterized as a fraction of signal period given in terms of percent, degrees, or radians. Typically, the phase offsets obtained in digital phase alignment comprise a range of discrete values (for example 0, 45, 90 degrees) but this range can also include other non-discrete values or amounts.

As recognized by the present inventors, there may be situations that require fast alignment of two or more signals, such as clock signals. FIG. 1 shows an example of two synchronous clock signals, CLK1 and CLK2 (from the top), with a fast clock CLK3 shown below. The CLK3 frequency may be an integer multiple greater than the sequence of the CLK1 or CLK2 signals (for example 10×).

One conventional phase alignment approach is to use a counter that measures the time delay from the rising edge of CLK1 to CLK2, using CLK3 cycles. CLK1 is advanced according to the number of CLK3 cycles accumulated. A disadvantage of this solution is that a substantial number of CLK3 cycles may need to be counted from the beginning of the phase alignment operation, making the process take up to one CLK1 cycle to complete, which may render this solution impractical.

A second conventional phase alignment approach is to use a delay lock loop (DLL) to re-align the edges of the two clocks. The disadvantage of the DLL solution is that it is much slower achieving phase alignment, requiring several CLK1 cycles to maintain loop stability.

As recognized by the present inventors, what is needed is a method and system for alignment of two or more signals in a rapid manner, such as in a time period less than 1 clock cycle of the CLK1 or CLK2 signals.

It is against this background that various embodiments of the present invention were developed.

SUMMARY

In light of the above and according to one broad aspect of one embodiment of the present invention, disclosed herein is a method for aligning a first signal with a second signal. In one example, the method may include creating two or more shifted copies of the second signal, and determining which of the shifted copies of the second signal are substantially aligned with the first signal. In this way, the first signal can be aligned with a shifted copy of the second signal in a rapid manner.

In one example, the two or more copies of the second signal may be each shifted by a different amount of time. For instance, the two or more copies of the second signal may each be shifted by one or more cycles of a clock signal, the clock signal being of higher frequency than the second signal.

In another example, the creating operation may include providing a shift register using the second signal as an input and the clock signal as the shift register clock input, the clock signal being of higher frequency than the frequency of the second signal, the shift register having two or more outputs, each output including a copy of the second signal shifted by one or more cycles of the clock signal. In one example, the determining operation may include providing a plurality of phase detectors, each phase detector receiving the first signal and receiving one of the shifted copies of the second signal, wherein the phase detector determines whether the first signal is substantially aligned with the shifted copy of the second signal.

The method may also include, after the determining operation, deactivating one or more of the phase detectors that determine that the first signal is not substantially aligned with the shifted copy of the second signal in order to reduce power consumption, and/or or deactivating one or more of the shifted copies created by the creating operation in order to reduce power consumption. The method may also include selecting as an output the shifted copy of the second signal that is substantially aligned with the first signal.

In one example, at least one of the phase detectors may include a flip-flop, and the plurality of phase detectors are arranged in parallel.

According to another broad aspect of one embodiment of the present invention, disclosed herein is a circuit for aligning two or more signals including a first and second signal. In one embodiment, the circuit may include a shift register generating two or more shifted copies of the second signal, and a plurality of phase detectors, each phase detector receiving the first signal and receiving one of the shifted copies of the second signal, each phase detector providing an output indicating whether the first signal is substantially aligned with the shifted copy of the second signal. The circuit may also include a multiplexer receiving each of the shifted copies of the second signal, the multiplexer having a plurality of select lines coupled with the output signals of the phase detectors. The circuit may also include means for deactivating one or more of the phase detectors that have determined that the first signal is not substantially aligned with the shifted copy of the second signal in order to reduce power consumption.

The shift register may have an input receiving the second signal and a clock input receiving a clock signal, the clock signal being of higher frequency than the frequency of the second signal, the shift register having two or more outputs, each output including a copy of the second signal shifted by one or more cycles of the clock signal. The two or more copies of the second signal may each be shifted by a different amount of time. For instance, the two or more copies of the second signal may each be shifted by one or more cycles of a clock signal, the clock signal being of higher frequency than the frequency of the second signal.

In one example, at least one of the phase detectors includes a flip-flop, and in another example, the phase detectors are arranged in parallel.

According to another broad aspect of one embodiment of the present invention, disclosed herein an integrated circuit which may include a circuit section for aligning two or more signals including a first and second signal. In one example, the circuit section of the integrated circuit may include a shift register generating two or more shifted copies of the second signal; a plurality of phase detectors, each phase detector receiving the first signal and receiving one of the shifted copies of the second signal, each phase detector providing an output indicating whether the first signal is substantially aligned with the shifted copy of the second signal; and a multiplexer receiving each of the shifted copies of the second signal, the multiplexer having a plurality of select lines coupled with the output signals of the phase detectors. The plurality of phase detectors may be arranged in parallel.

According to one embodiment, a method of aligning the edges of two synchronized signals to each other in a fast manner is described.

The features, utilities and advantages of the various embodiments of the invention will be apparent from the following more particular description of embodiments of the invention as illustrated in the accompanying drawings.

DETAILED DESCRIPTION

Embodiments of the present invention provide rapid alignment of two or more signals that have differing phases, delays or offsets (i.e., rising/leading edges that occur at different times, or falling/trailing edges that occur at different times). The signals being aligned may be clock signals or data signals, depending upon the implementation. For instance, embodiments of the present invention may be used to align two or more clock signals, which may be of different frequencies, and the alignments may result in an alignment of the leading edges of the signals, or if desired the alignment of the trailing edges of the signals. Through the use of embodiments of the present invention, the alignment of these two or more signals may occur very quickly, for instance within less than one cycle of either of the signals being aligned. Some embodiments may include a power saving mode.

Various embodiments of the present invention will now be described. For purposes of illustration only, embodiments of the present invention are described herein with reference to the alignment of two clock signals, CLK1 and CLK2, but it is understood that embodiments of the present invention may be used to align two or more non-clock-type signals if desired.

Figure 1:
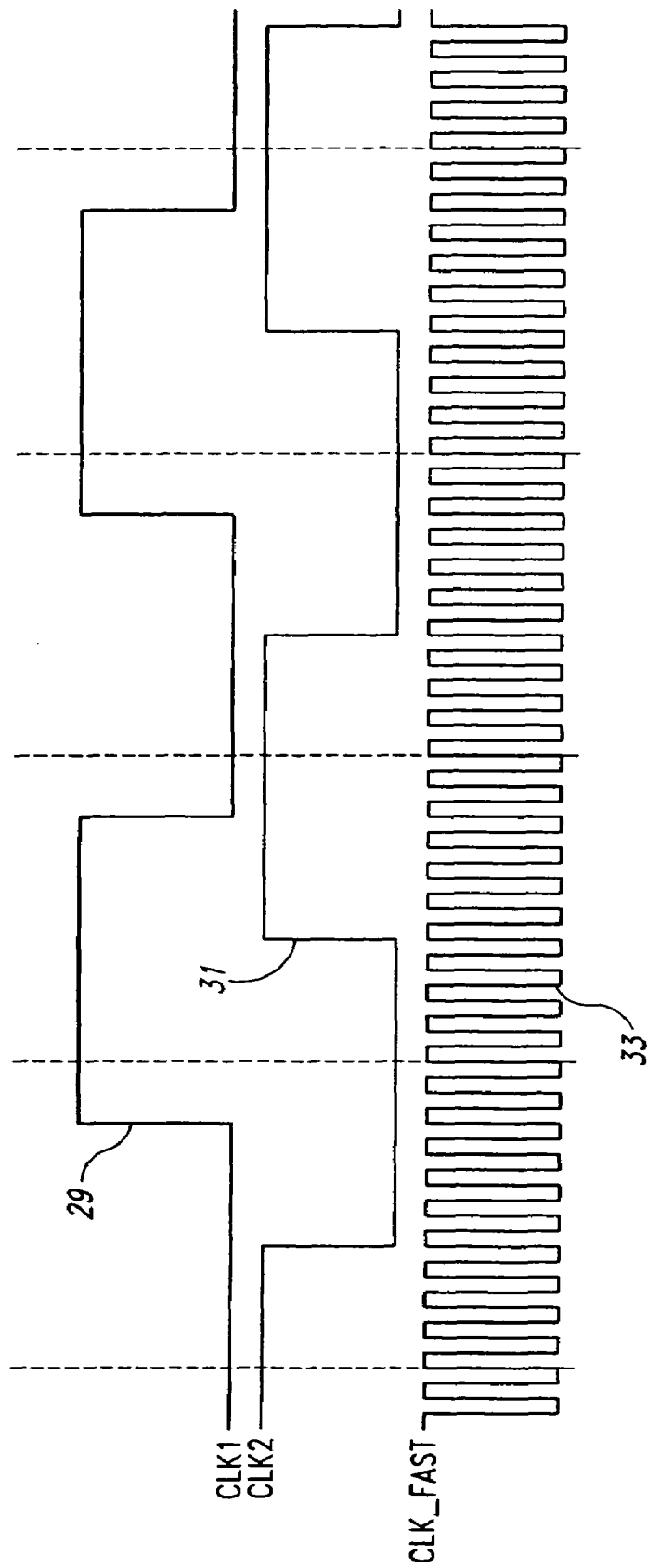
FIG. 1 illustrates an example of two waveforms CLK1 and CLK2 to be aligned with respect to one another and to be synchronized with a faster clock signal CLK3.
Figure 2:
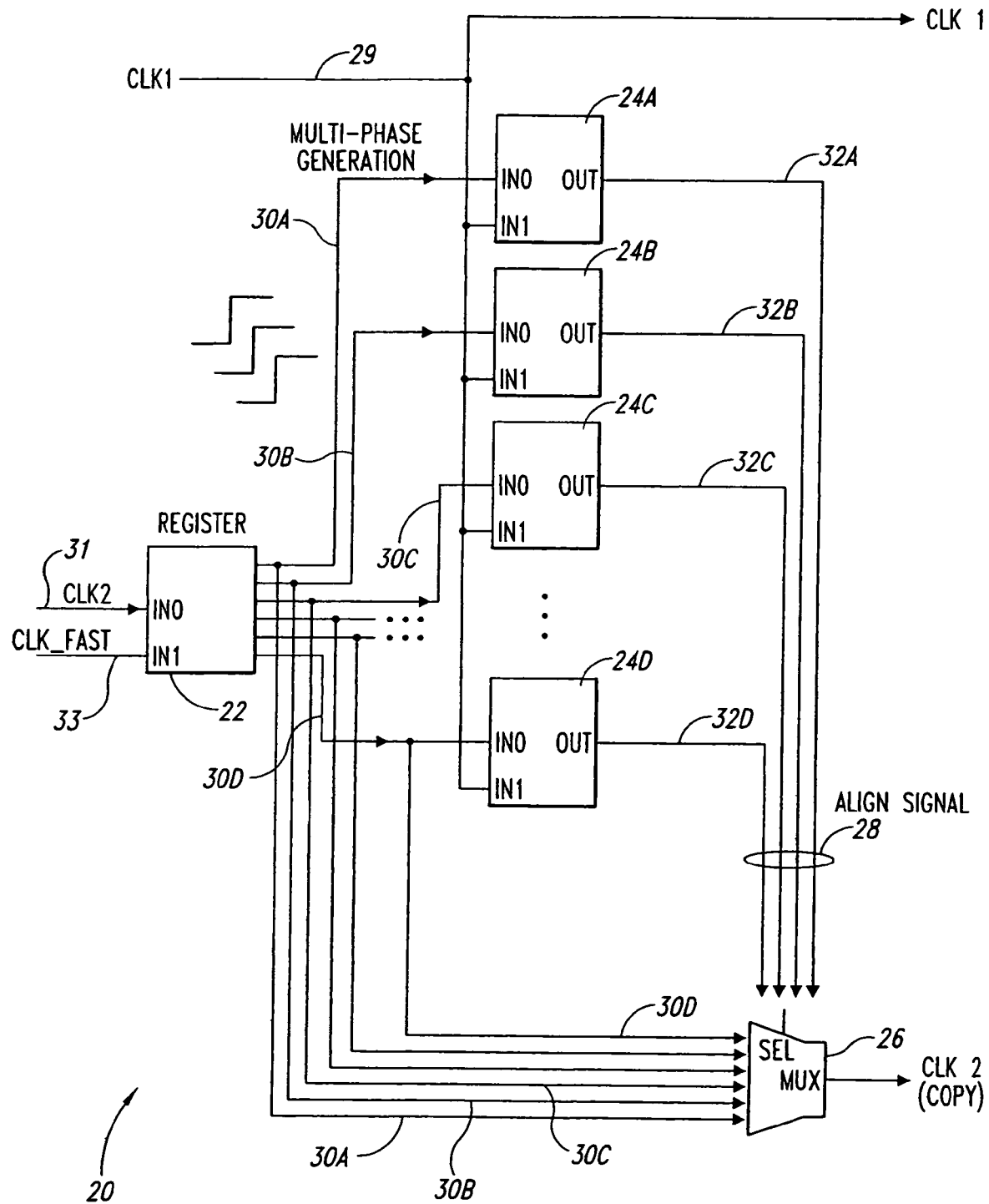
FIG. 2 illustrates an example of an alignment circuit, in accordance with one embodiment of the present invention.

FIG. 2 illustrates one example of an alignment circuit 20 for aligning two signals 29, 31 to one another, in accordance with one embodiment of the present invention. As will be described, alignment circuit 20 effectively aligns signal 29 to a delayed or shifted copy of signal 31. In FIG. 2, the two signals 29, 42 to be aligned to one another are represented by CLK1 and CLK2. A third signal, clock_fast (CLK_FAST), is shown and may, in one example, be generally of higher frequency than the two signals CLK1 and CLK2 being aligned. The signals being aligned are illustrated herein as being digital signals initially having different phases or not being aligned in time. The signals CLK1, CLK2 may have different frequencies. While the signals CLK1, CLK2 are shown and described herein as generally representing different clock signals, it is understood that these signals could be non-clock type signals that are in need of alignment.

In one example, alignment circuit 20 includes a shift register 22, a plurality of phase detectors 24A-24D, and multiplexer or other selection logic 26. In one example, shift register 22 receives one of the signals 31 for alignment (CLK2) as well as a clock signal 33 shown as clock fast (CLK_FAST). The shift register 22 provides a plurality of outputs 30A-D (in this case, shift register 22 provides four outputs) wherein each output is a copy of the CLK2 input signal delayed by multiples of the clock cycles of the CLK_FAST signal.

Figure 4:
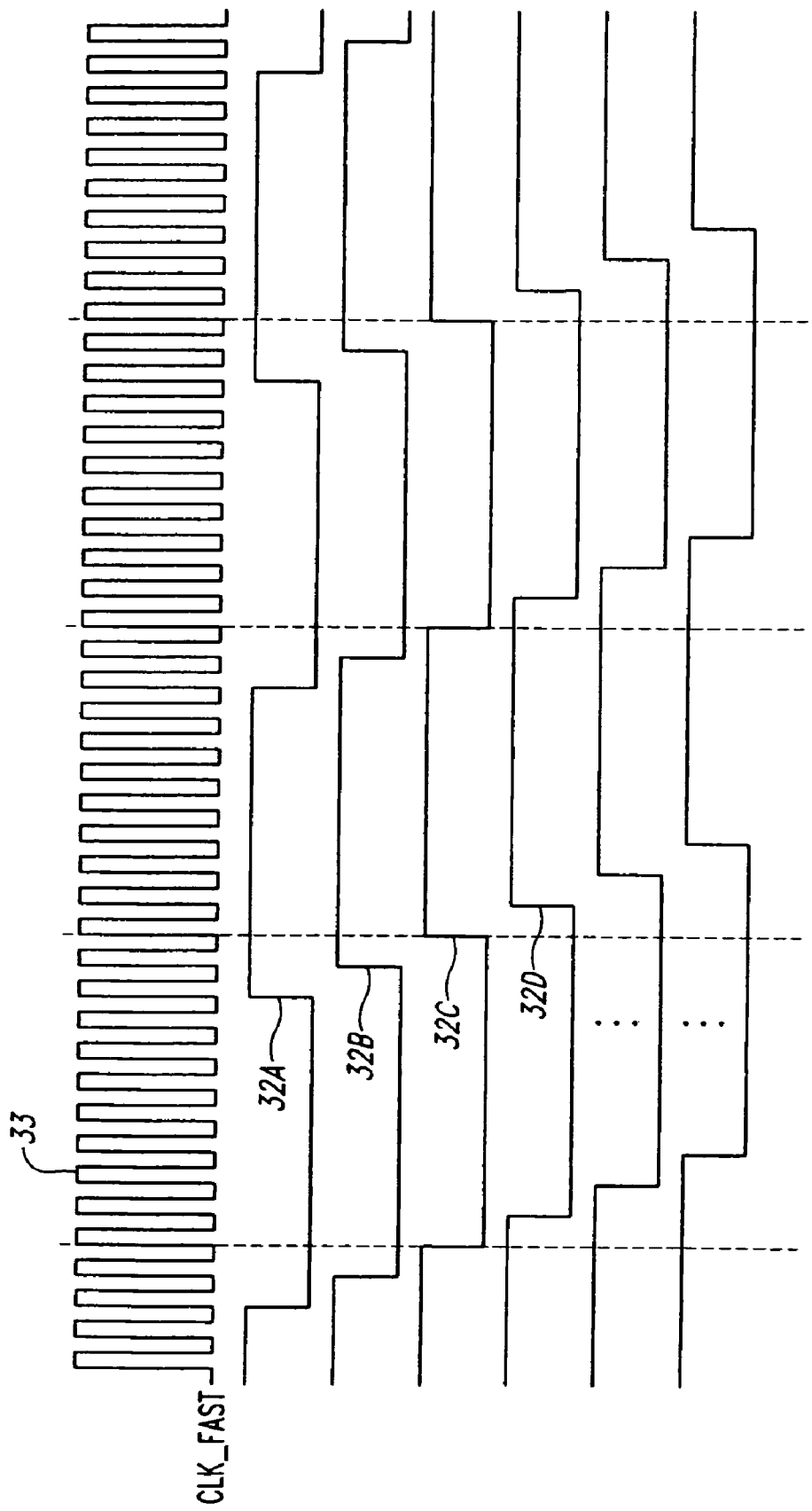
FIG. 4 illustrates an example of waveforms generated by the circuit of FIG. 2, in accordance with one embodiment of the present invention.
Figure 5:
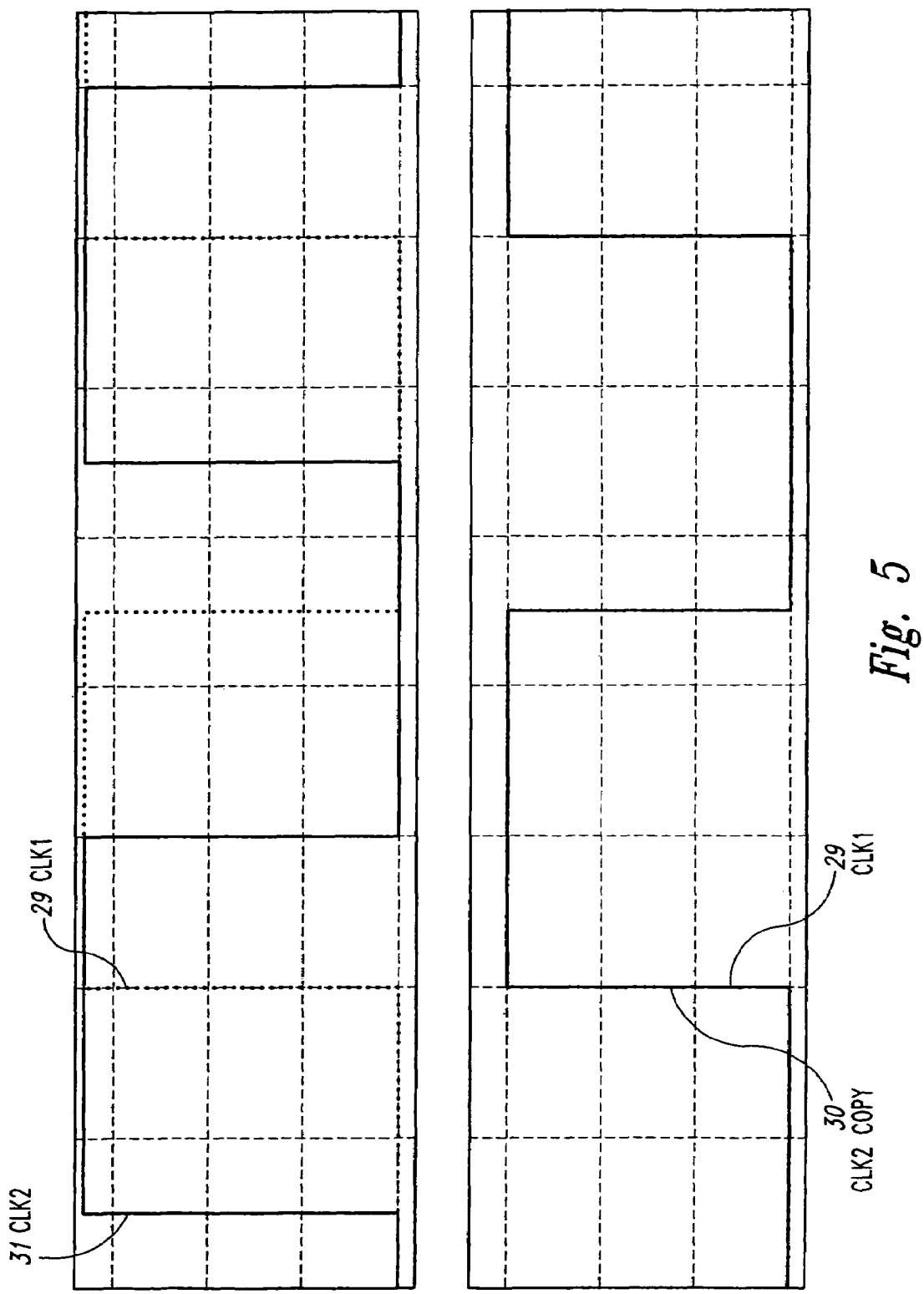
FIG. 5 illustrates an example of waveforms generated by the circuit of FIG. 2, in accordance with one embodiment of the present invention.

In the example of FIG. 2, shift register 22 provides outputs 30A, 30B, 30C, 30D. Output 30A may be a copy of the CLK2 signal delayed by one clock cycle dictated by the CLK_FAST frequency; output 30B may be a copy of the CLK2 signal delayed by two clock cycles dictated by the CLK_FAST frequency; output 30C may be a copy of the CLK2 signal delayed by three clock cycles dictated by the CLK_FAST frequency; and output 30D may be a copy of the CLK2 signal delayed by four clock cycles as dictated by the CLK_FAST frequency. Hence, shift register 22 generates multiple copies of the CLK2 signal, each copy having a different amount of phase, offset or delay. FIG. 4 illustrates an example of the outputs that may be provided by shift register 22, and it can be seen that the various outputs 30A-D have differing phases, delays or time offsets.

Figure 3:
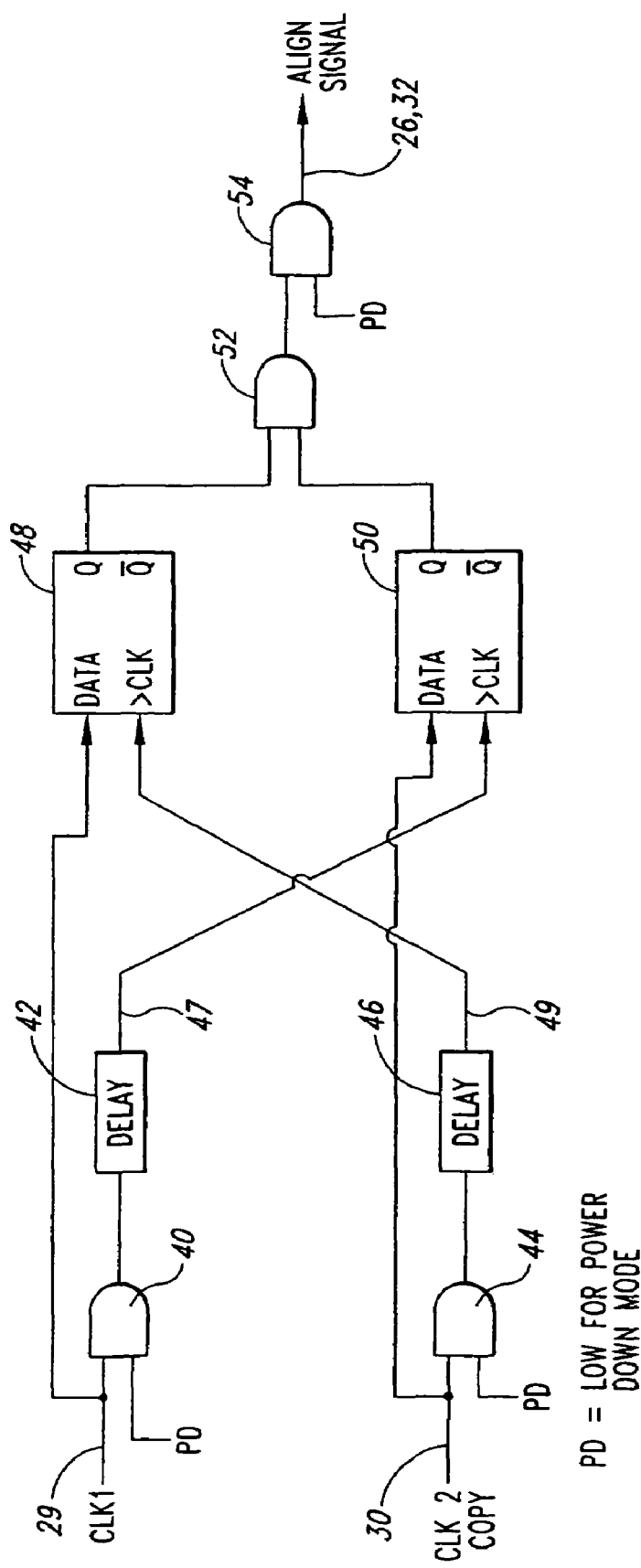
FIG. 3 illustrates an example of a phase detector, which may be used in the alignment circuit of FIG. 2, in accordance with one embodiment of the present invention.

A plurality of phase detectors 24A-24D are provided in parallel, wherein each phase detector receives the CLK1 signal as well as one of the copies 30A-D of the CLK2 signal generated by shift register 22. Phase detectors 24A-24D may include any conventional phase detector or phase comparators, or may alternatively be implemented by other logic which detects alignment between two signals, such as alignment of rising edges or falling edges of the two signals. One example of a phase detector is illustrated in FIG. 3, described below.

In one example, each of the phase detectors 24A-D determines whether the phase of the signals input to the phase detector are aligned, and if so, the output 32A-D of a particular phase detector 24A-D goes high. Because each phase detector is comparing the CLK1 signal to a copy of the CLK2 signal having differing delays or offsets, only one of the phase detectors 24A-D will detect a match at any given time, and accordingly, only one of the outputs 32A-32D will be active at any particular time. These outputs 32A-D indicate alignment as signals 28.

For instance, assuming that the CLK1, CLK2, and CLK_FAST signals, each have substantially constant (but different) frequencies, one of the phase detectors 24A-24D will detect a phase match between the CLK1 signal and one of the outputs of the shift registers 30A-30D, and accordingly this particular shift register will have its output active while the other phase detectors will have their output inactive.

A multiplexer 26 (or other conventional selection logic) may be provided having a plurality of inputs, which are coupled with the outputs 30A-30D of the shift register 22. The select lines of the multiplexer may be coupled with the outputs 32A-32D of the phase detectors 24A-24D. The configuration of multiplexer 26 can be provided such that when an output 32A-32D of a particular phase detector 24A-24D is active, the corresponding input signal 30A-30D is selected by the multiplexer 26 and output as the CLK2 signal from the multiplexer. For instance, if phase detector 24C determines that the shift register output signal 30C matches the phase of the CLK1 signal, the output signal 32C of phase detector 24C is active and selects, through multiplexer 26, that the signal 30C be passed through the multiplexer as the output, CLK2 (copy). Hence, the output of the multiplexer 26 is the particular delayed, shifted copy (i.e., either 30A, B, C, or D) of the CLK2 signal, which is in phase alignment with the CLK1 signal.

Stated differently, in FIG. 2, the shift register 22, clocked by fast clock 33, generates multiple CLK2 phases. The parallel phase detectors 24A-D determine which CLK2 phase is most closely aligned to CLK1, and the multiplexer selects the correct CLK2 phase to output. An advantage of the circuit 20 of FIG. 2 is the parallel structure, which yields immediate phase information. Shift register 22 clocks-in clock CLK2 signal 31 using the faster clock 33. Each branch of the shift-register 22 now has the signal 31 on it, but it is shifted in phase according to the fast clock 33 (shifted by one period of the CLK_FAST 33). Each of the phases of CLK2 is compared to CLK1. The comparisons may be done using several parallel phase detectors 24A-D. The phase that is aligned with CLK2 is noted when the output of a phase detector 24A-C goes high. The output of the phase detectors receiving misaligned phases stays low. The logic state of each of the phase-detectors is taken into a logic block and/or mux 26. The mux 26 selects the correct aligned-phase signal generated by the shift-register 22. The unused portion of the shift register 22 can now be turned off. This is not required to maintain phase alignment, but is practical for power savings since the fast phase alignment operation is typically only required for a short period of time.

The number of phase detectors 24A-D utilized in a particular embodiment will vary and may depend on the frequency ratio between the CLK1 signal when compared with the CLK_FAST signal, in one example. Generally, a greater number of phase detectors provides for a greater degree of precision and accuracy in the alignment of the signals.

FIG. 3 illustrates an example of a phase detector 24, in accordance with one embodiment of the present invention. In this example, a power down feature is provided so that the phase detector 24 can be placed in a very low power mode if desired. It is understood that the power down feature is optional depending upon the implementation. In this example, when the power down signal PD shown in FIG. 3 is low, the circuit 24 does not switch or change states even though the inputs CLK1, CLK2 are changing state, and therefore the phase detector 24 saves power.

In FIG. 3, AND gate 40 receives the CLK1 signal 29 and a power down signal PD, and the output of AND gate 40 is coupled with a delay block 42. AND gate 44 receives the CLK2 signal copy 30 and the power down signal, and provides an output coupled with delay 46. Delays 42, 46 may be implemented in any conventional manner, such as through the use of buffers or inverters.

Flip-flops 48, 50 are provided and in one example may be D flip-flops. Flip-flop 48 receives as data the CLK1 signal and receives as a clock signal the output 49 of delay block 46. Flip-flop 50 receives as data the CLK2 signal, and receives as a clock signal the output 47 of delay 42. The outputs of flip-flops 48, 50 are provided to AND gate 52 whose output is coupled with AND gate 54 which also receives the power down signal.

AND gate 54 provides an output which may be used as the alignment detection signal 26, 32 shown in FIG. 2. If the input signals CLK1, CLK2 copy (from the output of shift register 22) are aligned, then the output signal 32 will be high (assuming the power down signal is high); but if the input signals CLK1, CLK2 copy are not aligned, then the output signal 32 will be low. Also, if the power down signal PD is low, then the output 32 of the phase detector 24 will be low.

Figure 6:
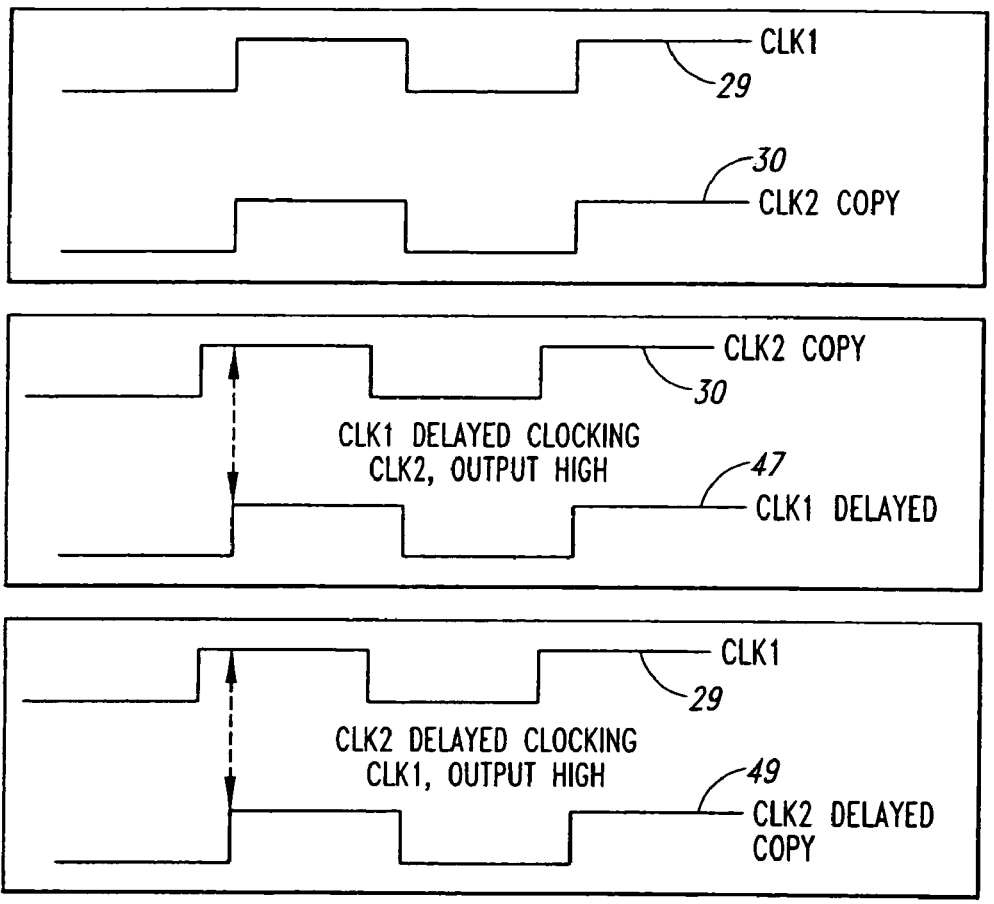
FIG. 6 illustrates example waveforms that show the operation of the circuits of FIGS. 2-3 when alignment is detected, in accordance with one embodiment of the present invention.

For the phase detector operation, assume that signals 30, 29 are aligned, as shown in FIG. 6. The delayed signal clocks the other signal. The output of AND gate 52 can be high only if the delayed clock 47, 49 hits a high. If the signals 30, 29 are not aligned as shown in FIG. 7, the rising edge of the delayed clock will land before the rising edge of the non-delayed clock resulting in a low output of AND gate 52.

In one example, when one of the phase detectors 24A-D has detected a phase match, the other phase detectors may be powered down in order to reduce power consumption. Furthermore, logic and signaling may be provided to instruct the shift register 22 to deactivate the outputs 30A-D which are not aligned with the CLK1 signal, and this may provide further reductions in power consumption.

Figure 7:
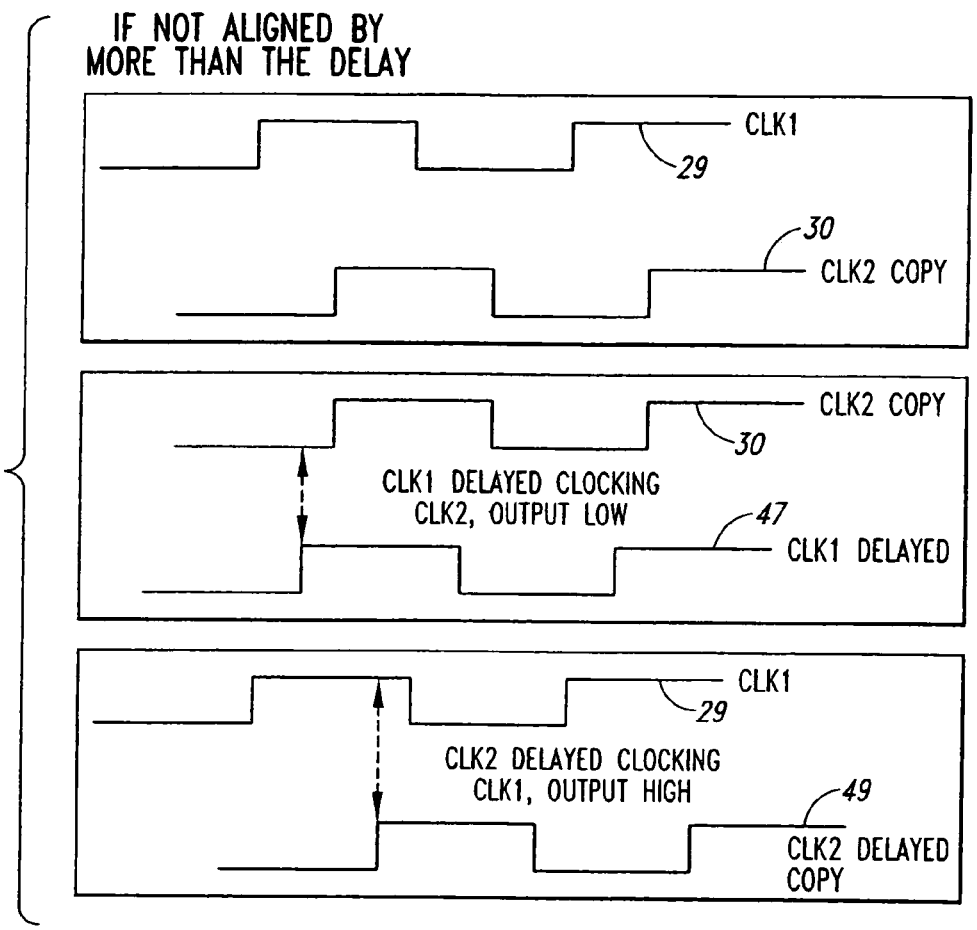
FIG. 7 illustrates example waveforms that show the operation of the circuits of FIGS. 2-3 when non-alignment is detected, in accordance with one embodiment of the present invention.

FIGS. 6 and 7 illustrate examples of operations of the phase detector 24 of FIG. 3 when the inputs CLK1 (29) and CLK2 copy (30) are aligned (FIG. 6) or are not aligned (FIG. 7). In FIG. 6, as between signals CLK2 copy (30) and CLK1 delayed (47) the output of flip-flop 48 will be high; and as between signals CLK1 (29) and CLK2 copy delayed (49), the output of flip-flop 50 is high. Because the outputs of both flip-flops 48, 50 are high, the output of AND gates 52 and 54 of FIG. 3 will also be high (assuming the power down signal is high) hence indicating signal alignment between CLK1 (29) and CLK2 copy (30).

In FIG. 7, as between signals CLK2 copy (30) and CLK1 delayed (47), the output of flip-flop 48 will be low. Accordingly, the output of AND gates 52 and 54 will also be low, which indicates that the input signals CLK1 (29) and CLK2 copy (30) are not aligned.

Figure 8:
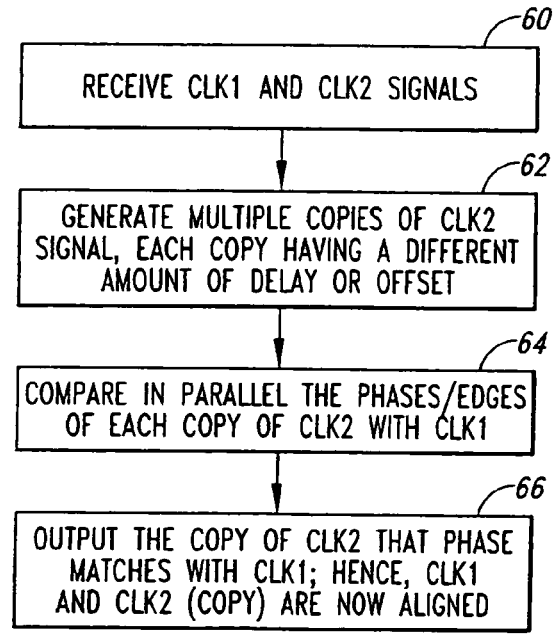
FIG. 8 illustrates an example of operations for aligning two signals, in accordance with one embodiment of the present invention.

FIG. 8 illustrates an example of operations for providing rapid alignment of two or more digital signals, in accordance with one embodiment of the present invention. In this example, the digital signals are referred to as CLK1 and CLK2, but it is understood, as explained above, that the digital signals may be other non-clock type signals. In one example, the method includes creating a delayed or shifted copy of one of the signals (e.g., CLK2) in order to be aligned with the other signal (e.g., CLK1).

Referring to FIG. 8, at operation 60, the signals (e.g., CLK1, CLK2) for alignment are received. At operation 62, multiple copies of one of the signals (e.g., CLK2) are generated, each copy having a different amount of delay or offset. Stated differently, operation 62 may shift an edge (e.g., a rising or falling edge) of a signal, such as the CLK2 signal, relative to another signal, such as the CLK1 signal, by a desired amount.

Operation 64 compares in parallel the phases/edges of each copy of the signals generated by operation 62 (e.g., CLK2 copies) with the phases/edges of other signals (e.g., CLK1). Operation 66 outputs or selects the copy of the CLK2 signal that phase matches or is aligned with the CLK1 signal. Hence, the CLK1 signal is now aligned with the particular copy of the CLK2 signal.

Hence, it can be seen that embodiments of the present invention provide for rapid alignment of two or more signals. Embodiments of the present invention may be utilized in various different circuits and applications. For instance, it may be useful to align the various clocks that are generated from a main clock of a digital phase lock loop.

Advantages of embodiments of the present invention may include that the alignment operation can be performed in a rapid, parallel manner, and further that no counter is necessarily required, and that embodiments can include low power provisions.

In an alternate embodiment, instead of a shift register 22, a multi-phase output module can be used if applicable, for example in a multi-phase voltage controller oscillator (VCO), multi-phase counter or other suitable application. In another embodiment, parallel registers can be used if there are already have several available clock phases (such as an invert which gives 180 degrees offset). In another embodiment, the logic and multiplexer 26 can be integrated into one module for a more generic representation, and the parallel phase-detectors 24A-D can be implemented as one module. In yet another embodiment, the signal that forces the shift-register 22, phase detectors 24A-D and the mux 26 to stop updating, can be generated externally if desired.

Embodiments of the present invention may be used in various semiconductors, memories, processors, controllers, integrated circuits, logic or programmable logic, clock circuits, and the like.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

It should be appreciated that reference throughout this specification to "one embodiment" or "an embodiment" or "one example" or "an example" means that a particular feature, structure or characteristic described in connection with the embodiment may be included, if desired, in at least one embodiment of the present invention. Therefore, it should be appreciated that two or more references to "an embodiment" or "one embodiment" or "an alternative embodiment" or "one example" or "an example" in various portions of this specification are not necessarily all referring to the same embodiment. Furthermore, the particular features, structures or characteristics may be combined as desired in one or more embodiments of the invention.

It should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed inventions require more features than are expressly recited in each claim. Rather, as the following claims reflect, inventive aspects lie in less than all features of a single foregoing disclosed embodiment, and each embodiment described herein may contain more than one inventive feature.

While the invention has been particularly shown and described with reference to embodiments thereof, it will be understood by those skilled in the art that various other changes in the form and details may be made without departing from the spirit and scope of the invention.

What is claimed is:

1. A circuit for aligning two or more signals including a first and a shifted copy of a second signal, the circuit comprising: a first gate coupled to a first delay block, the first gate configured for receiving the first signal and a power down signal; a second gate coupled to a second delay block, the second gate configured for receiving a shifted copy of the second signal and the power down signal; a first flip-flop configured for receiving the first signal and an output from the second delay block; a second flip-flop configured for receiving the shifted copy of the second signal and an output from the first delay block; a third gate configured for receiving an output from the first flip-flop and an output from the second flip-flop; and a fourth gate configured for receiving an output from the third gate and the power down signal and providing a circuit output signal.

2. The circuit of claim 1, wherein the circuit output signal comprises an alignment detection signal.

3. The circuit of claim 1, wherein the circuit output signal is high when the first signal and the shifted copy of the second signal are substantially aligned.

4. The circuit of claim 1, wherein the circuit output signal is low when the first signal and the shifted copy of the second signal are not substantially aligned.

5. The circuit of claim 1, wherein the circuit output signal is low when the power down signal is low.

6. The circuit of claim 1, wherein the circuit comprises a phase detector.

7. The circuit of claim 6, wherein one or more phase detectors are configured to be connected in parallel.

8. The circuit of claim 7, wherein a detection of alignment between the first signal and the shifted copy of the second signal in one phase detector is configured to cause each of the phase detectors connected in parallel to power down.

9. The circuit of claim 1, wherein the circuit is coupled to a shift register.

10. The circuit of claim 9, wherein the shift register is configured to deactivate outputs that are not aligned with the first signal.

* * * * *